United States Patent
Owada

(10) Patent No.: US 9,406,813 B2
(45) Date of Patent: Aug. 2, 2016

(54) SEMICONDUCTOR DEVICE AND METHOD OF MANUFACTURING SAME

(71) Applicant: Renesas Electronics Corporation, Tokyo (JP)

(72) Inventor: Fukuo Owada, Kanagawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/040,935

(22) Filed: Feb. 10, 2016

(65) Prior Publication Data

US 2016/0163882 A1 Jun. 9, 2016

Related U.S. Application Data

(63) Continuation of application No. 14/538,803, filed on Nov. 11, 2014, now Pat. No. 9,293,604.

(30) Foreign Application Priority Data

Nov. 14, 2013 (JP) .................................. 2013-236087

(51) Int. Cl.
*H01L 21/336* (2006.01)
*H01L 29/792* (2006.01)
*H01L 27/115* (2006.01)
*H01L 29/423* (2006.01)

(52) U.S. Cl.
CPC ........ *H01L 29/792* (2013.01); *H01L 27/11568* (2013.01); *H01L 29/4234* (2013.01)

(58) Field of Classification Search
None
See application file for complete search history.

(56) References Cited

U.S. PATENT DOCUMENTS

| 6,972,997 | B2 | 12/2005 | Ishimaru et al. |
| 7,235,441 | B2 | 6/2007 | Yasui et al. |
| 7,504,689 | B2 | 3/2009 | Hisamoto et al. |
| 8,106,444 | B2 | 1/2012 | Terai |
| 8,907,404 | B2 | 12/2014 | Shukuri |
| 2009/0050956 | A1 | 2/2009 | Ishimaru et al. |
| 2015/0187946 | A1 | 7/2015 | Park et al. |

FOREIGN PATENT DOCUMENTS

| JP | 2004-221554 A | 8/2004 |
| JP | 2007-258497 A | 10/2007 |
| JP | 2009-054707 A | 3/2009 |
| JP | 2011-040782 A | 2/2011 |
| JP | 2012-094790 A | 5/2012 |

*Primary Examiner* — Calvin Choi
(74) *Attorney, Agent, or Firm* — Shapiro, Gabor and Rosenberger, PLLC

(57) ABSTRACT

To provide a semiconductor device with nonvolatile memory, having improved performance.
A memory cell has control and memory gate electrodes on a semiconductor substrate via an insulating film and another insulating film having first, second, and third films stacked one after another in order of mention, respectively. The memory and control gate electrodes are adjacent to each other via the stacked insulating film. The second insulating film has a charge accumulation function. The first and third insulating films each have a band gap greater than that of the second insulating film. An inner angle of the second insulating film between a portion extending between the semiconductor substrate and the memory gate electrode and a portion extending between the control gate electrode and the memory gate electrode is ≥90°. An inner angle of the corner portion between the lower surface and the side surface of the memory gate electrode is <90°.

23 Claims, 52 Drawing Sheets

| OPERATION \ APPLIED VOLTAGE | Vd | Vcg | Vmg | Vs | Vb |
|---|---|---|---|---|---|
| WRITE | 0.5V | 1V | 10V | 5V | 0 |
| ERASE | 0 | 0 | 12V | 0 | 0 |
| READ | 1.5V | 1.5V | 0 | 0 | 0 |

SEMICONDUCTOR DEVICE AND METHOD OF MANUFACTURING SAME

CROSS-REFERENCE TO RELATED APPLICATIONS

The disclosure of Japanese Patent Application No. 2013-236087 filed on Nov. 14, 2013 including the specification, drawings and abstract is incorporated herein by reference in its entirety.

BACKGROUND

The present invention relates to a semiconductor device and a manufacturing method thereof. In particular, it can be suitably used for a semiconductor device having a nonvolatile memory and and a manufacturing method thereof.

As electrically writable and erasable nonvolatile semiconductor memory devices, EEPROM (electrically erasable and programmable read only memory) has been used widely. These memory devices typified by a flash memory that is used widely and currently have, below the gate electrode of an MISFET thereof, a conductive floating gate electrode or trap insulating film surrounded by an oxide film. With a charge accumulation state in the floating gate or trap insulating film as memory data, these devices read it as the threshold value of a transistor. This trap insulating film is an insulating film capable of accumulating charges therein and a silicon nitride film is one example of it. By shifting the threshold value of the MISFET through injection or release of charges into or from such a charge accumulation region, it can operate as a memory element. Examples of the flash memory include a split gate cell using a MONOS (metal oxide nitride oxide semiconductor) film. Such a memory has the following advantages. Described specifically, a silicon nitride film used as the charge accumulation region is superior to a conductive floating gate film in reliability of data retention because it accumulates charges discretely. This superiority in reliability of data retention enables a reduction in the thickness of an oxide film laid on and under the silicon nitride film and therefore, a reduction in the voltage necessary for write and erase operations.

A technology related to a split gate memory is described in Japanese Unexamined Patent Application Publications Nos. 2011-40782 (Patent Document 1), 2009-54707 (Patent Document 2), 2004-221554 (Patent Document 3), 2012-94790 (Patent Document 4), and 2007-258497 (Patent Document 5).

Patent Documents

[Patent Document 1] Japanese Unexamined Patent Application Publication No. 2011-40782
[Patent Document 2] Japanese Unexamined Patent Application Publication No. 2009-54707
[Patent Document 3] Japanese Unexamined Patent Application Publication No. 2004-221554
[Patent Document 4] Japanese Unexamined Patent Application Publication No. 2012-94790
[Patent Document 5] Japanese Unexamined Patent Application Publication No. 2007-258497

SUMMARY

Even semiconductor devices having a nonvolatile memory are expected to have improved reliability. Or, they are expected to have improved performance. Or, they are expected to have both improved reliability and improved performance.

Other problems and novel features will be apparent from the description herein and accompanying drawings.

According to one embodiment, a semiconductor device has a semiconductor substrate, a first gate electrode formed over the semiconductor substrate via a first gate insulating film, and a second gate electrode formed over the semiconductor substrate via a stacked insulating film and adjacent to the first gate electrode via the stacked insulating film. The first gate and the second gate include a memory cell of a nonvolatile memory and the stacked insulating film extends over between the semiconductor substrate and the second gate electrode and between the first gate electrode and the second gate electrode. The stacked insulating film has a first insulating film, a second insulating film over the first insulating film, and a third insulating film over the second insulating film. The second insulating film is an insulating film having a charge accumulation function. The band gap of each of the first insulating film and the third insulating film is greater than that of the second insulating film. An angle made between a portion of the second insulating film extending between the semiconductor substrate and the second gate electrode and a portion of the second insulating film extending between the first gate electrode and the second gate electrode is 90° or greater and an end portion of the lower surface of the second gate electrode on the side of the first gate electrode has an acute angle.

According to one embodiment a method of manufacturing a semiconductor device has (a) a step of providing a semiconductor substrate, (b) a step of forming a first gate electrode over the semiconductor substrate via a first gate insulating film, and (c) a step of forming a stacked insulating film having a first insulating film, a second insulating film over the first insulating film, and a third insulating film over the second insulating film over the main surface of the semiconductor substrate and the surface of the first gate electrode. The method of manufacturing a semiconductor device further has (d) a step of forming a conductive film on the stacked insulating film, and (g) etching back the conductive film to leave the conductive film over the sidewall of the first gate electrode via the stacked insulating film and form the second gate electrode. The first gate electrode and the second gate electrode include a memory cell of a nonvolatile memory and the stacked insulating film extends over between the semiconductor substrate and the second gate electrode and between the first gate electrode and the second gate electrode. The second insulating film is an insulating film having a charge accumulation function. The band gap of each of the first insulating film and the third insulating film is greater than that of the second insulating film. An angle made between a portion of the second insulating film extending between the semiconductor substrate and the second gate electrode and a portion of the second insulating film extending between the first gate electrode and the second gate electrode is 90° or greater and an end portion of the lower surface of the second gate electrode on the side of the first gate electrode has an acute angle.

According to the one embodiment, a semiconductor device having improved reliability can be provided.

Or, a semiconductor device having improved performance can be provided.

Or, a semiconductor device having both improved reliability and improved performance can be provided.

DETAILED DESCRIPTION

Figure 1:
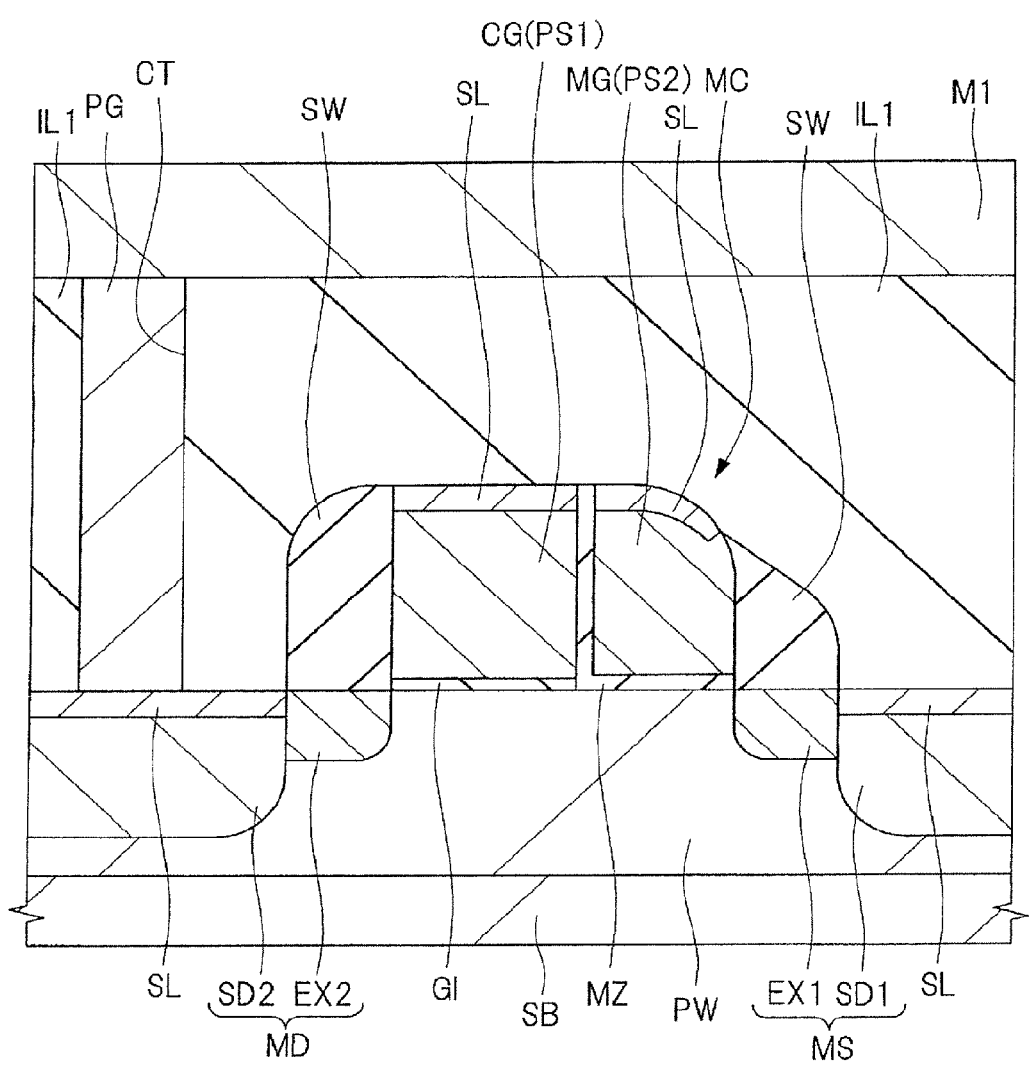
FIG. 1 is a fragmentary cross-sectional view of a semiconductor device according to one embodiment of the invention.

In the below-described embodiments, a description may be made after divided in a plurality of sections or embodiments if necessary for the sake of convenience. These sections or embodiments are not independent from each other unless otherwise particularly specified, but one of them may be a modification example, details, complementary description, or the like of a part or whole of the other one. In the below-described embodiments, when a reference is made to the number of elements (including the number, value, amount, range, or the like), the number is not limited to a specific number but may be more or less than the specific number, unless otherwise particularly specified or principally apparent that the number is limited to the specific number. Further, it is needless to say that in the below-described embodiments, the constituent component (including constituent step or the like) is not always essential unless otherwise particularly specified or principally apparent that it is essential. Similarly, in the below-described embodiments, when a reference is made to the shape, positional relationship, or the like of the constituent component, that substantially approximate or analogous to it is also embraced unless otherwise particularly specified or principally apparent that it is not. This also applies to the above-described value and range.

Embodiments will hereinafter be described in detail based on drawings. In all the drawings for describing the embodiments, members of a like function will be identified by like reference numerals and overlapping descriptions will be omitted. In the below-described embodiments, a description on the same or similar portion is not repeated in principle unless otherwise particularly necessary.

In the drawings to be used in the following embodiments, even a cross-sectional view is sometimes not hatched to facilitate understanding of it or even a plan view may be hatched to facilitate understanding of it.

First Embodiment

Structure of Semiconductor Device

The semiconductor devices according to the present embodiment and embodiments described below are each a semiconductor device having a nonvolatile memory (nonvolatile memory element, flash memory, or nonvolatile semiconductor memory device). In the present embodiment and embodiments described below, the nonvolatile memory will be described using a memory cell having an n channel MISFET (MISFET: metal insulator semiconductor field effect transistor) as a basic structure. In addition, the polarity (polarity of an applied voltage or polarity of the carrier during write, erase, and read operations) in the present embodiment or embodiments described below is for describing the operation of the memory cell having an n channel MISFET as a basic structure. When the memory cell has a p channel MISFET as a basic structure, the same operation can be achieved in principle by reversing all the polarities of the applied potential, conductivity type of the carrier, and the like.

The semiconductor device of the present embodiment will next be described referring to drawings.

Figure 2:
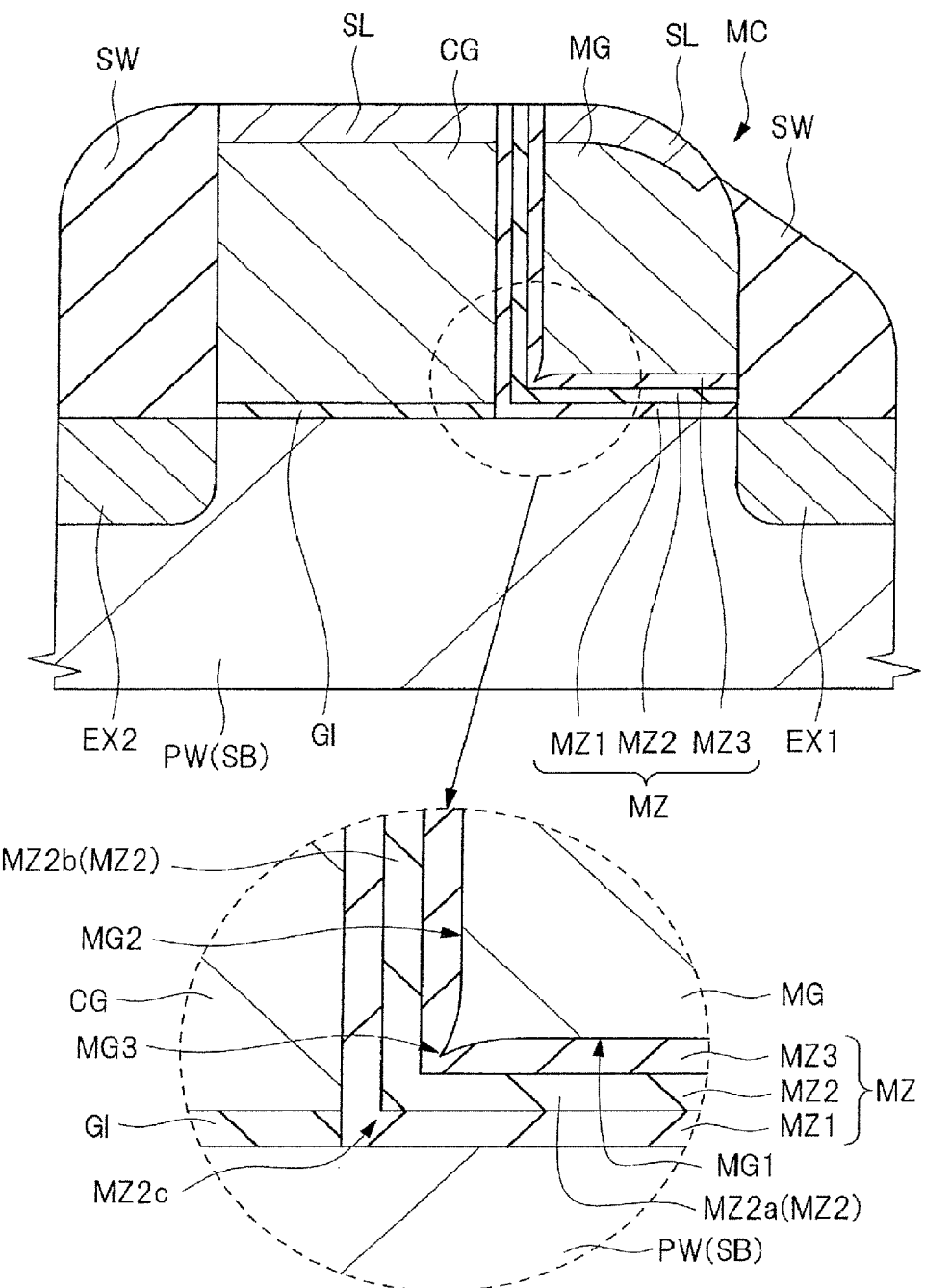
FIG. 2 is a partially enlarged cross-sectional view in which a portion of FIG. 1 has been enlarged.
Figure 3:
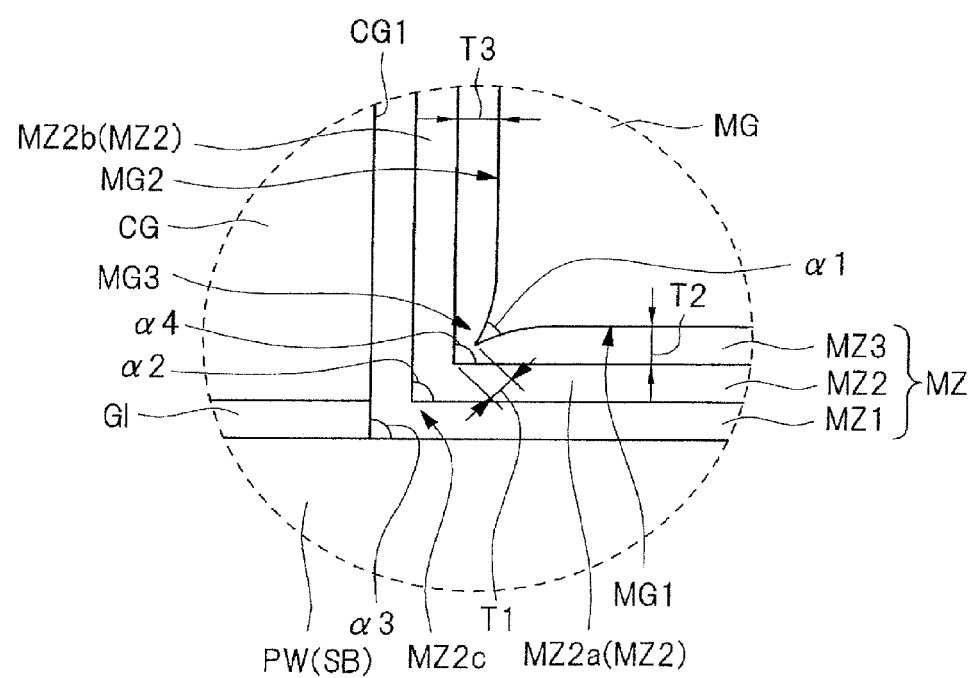
FIG. 3 is a cross-sectional view showing a portion of FIG. 2.
Figures 4, 5:
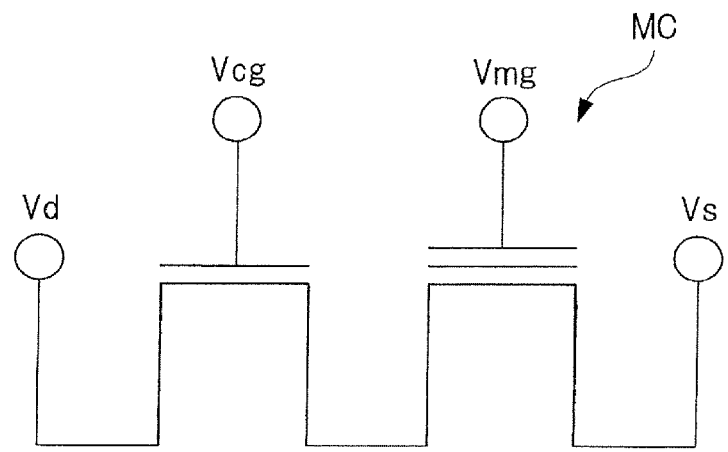
FIG. 4 is an equivalent circuit diagram of a memory cell.
FIG. 5 is a table showing one example of voltage application conditions to each site of a selected memory cell during "writing", "erasing", and "reading"

FIG. 1 is a fragmentary cross-sectional view of the semiconductor device of the present embodiment. The semiconductor device of the present embodiment is equipped with a nonvolatile memory. FIG. 1 shows a fragmentary cross-sectional view of a memory cell region of the nonvolatile memory. FIG. 2 is a partially enlarged view (fragmentary cross-sectional view) of a memory cell MC in the semiconductor device of the present embodiment and it is an enlarged view of a portion of FIG. 1. To facilitate understanding of FIG. 2, the interlayer insulating film IL1 shown in FIG. 1 is omitted therefrom and an enlarged view of a region enclosed by a dotted circle in FIG. 2 is selectively shown below FIG. 2. FIG. 3 is a cross-sectional view showing the region of FIG. 2 enclosed by a dotted circle. To facilitate understanding of FIG. 3, hatching is omitted. The cross-sectional view shown below FIG. 2 while being enclosed with a dotted circle and the cross-sectional view shown in FIG. 3 while being enclosed with a dotted circle are cross-sectional views of the same region, but they are different in hatching (FIG. 2 is hatched, while FIG. 3 is not hatched). FIG. 4 is an equivalent circuit diagram of the memory cell MC.

As shown in FIG. 1, a semiconductor substrate (semiconductor wafer), for example, having a specific resistance of from about 1 to 10 Ωcm and composed of p type single crystal silicon has element isolation regions (corresponding to element isolation regions ST which will be described later, but not illustrated in this drawing) for isolating elements from each other. An active region isolated (defined) by these element isolation regions has therein a p well PW. The p well PW in a memory cell region has a memory cell MC of a nonvolatile memory comprised of a memory transistor and a control transistor (select transistor) as shown in FIG. 1. The semiconductor substrate SB actually has a plurality of memory cells MC in array form. FIG. 1 shows the cross-section of one of the memory cells MC. The memory cell regions are each electrically isolated from each other by the element isolation regions.

As shown in FIGS. 1 to 4, the memory cell MC of the nonvolatile memory cell in the semiconductor device of the present embodiment is a split-gate type memory cell in which two MISFETs, that is, a control transistor (select transistor) having a control gate electrode (select gate electrode) CG and a memory transistor having a memory gate electrode (gate electrode for memory) MG have been coupled to each other.

Here, a MISFET (metal insulator semiconductor field effect transistor) equipped with a gate insulating film including a charge accumulation portion (charge accumulation layer) and a memory gate electrode MG is called "memory transistor" and a MISFET equipped with a gate insulating film and a control gate electrode is called "control transistor". Therefore, the memory gate electrode MG is a gate electrode of the memory transistor and the control gate electrode CG is a gate electrode of the control transistor. The control gate electrode CG and the memory gate electrode MG are gate electrodes including the (memory cell of) a nonvolatile memory.

Since the control transistor is a memory select transistor, it can be regarded also as a select transistor. The control gate electrode CG can therefore be regarded as a select gate electrode. The memory transistor is a transistor for memory.

The constitution of the memory cell MC will hereinafter be described specifically.

As shown in FIGS. 1 to 3, the memory cell MC of the nonvolatile memory has n type semiconductor regions MS and MD for source and drain formed in the p well PW of the semiconductor substrate SB, the control gate electrode CG formed on the semiconductor substrate SB (p well PW), and the memory gate electrode MG formed on the semiconductor substrate SB (p well PW) and adjacent to the control gate electrode CG. The memory cell MC of the nonvolatile memory further has an insulating film (gate insulating film) GI formed between the control gate electrode CG and the semiconductor substrate SB (p well PW) and an insulating film MZ formed between the memory gate electrode MG and the semiconductor substrate SB (p well PW) and between the memory gate electrode MG and the control gate electrode CG.

The control gate electrode CG and the memory gate electrode MG are arranged and extend along the main surface of the semiconductor substrate SB while having the insulating film MZ between their respective side surfaces (sidewalls) facing to each other. The control gate electrode CG and the memory gate electrode MG extend in a direction perpendicular to the paper plane of FIG. 1. The control gate electrode CG and the memory gate electrode MG are formed on the semiconductor substrate SB (p well PW) between the semiconductor region MD and the semiconductor region MS via the insulating film GI or the insulating film MZ. The memory gate electrode MG is on the side of the semiconductor region MS, while the control gate electrode CG is on the side of the semiconductor region MD. The control gate electrode CG and the memory gate electrode MG however lie on the semiconductor substrate SB (p well) via the insulating film GI and the insulating film MZ, respectively.

The control gate electrode CG and the memory gate electrode MG are adjacent to each other via the insulating film MZ and the memory gate electrode MG lie, in a sidewall spacer form, on the side surface (sidewall) of the control gate electrode CG via the insulating film MZ. The insulating film MZ continuously extends over a region between the memory gate electrode MG and the semiconductor substrate SB (p well PW) and a region between the memory gate electrode MG and the control gate electrode CG.

The insulating film GI formed between the control gate electrode CG and the semiconductor substrate SB (p well PW), that is, the insulating film GI below the control gate electrode CG functions as a gate insulating film of the control transistor.

The insulating film GI can be formed from, for example, a silicon oxide film or a silicon oxynitride film. The insulating film GT may be formed not only from the above-mentioned silicon oxide film or silicon oxynitride film but also from a high dielectric constant insulating film, for example, a hafnium oxide film, an aluminum oxide (alumina) film, or a tantalum oxide film, having a dielectric constant higher than that of a silicon nitride film.

The insulating film MZ extending in a region between the memory gate electrode MG and the semiconductor substrate SB (p well PW) and in a region between the memory gate electrode MG and the control gate electrode CG can be regarded as a gate insulating film (stacked gate insulating film or a gate insulating film having a stacked structure). Although the insulating film MZ (that is, the insulating film MZ below the memory gate electrode MG) between the memory gate electrode MG and the semiconductor substrate SB (p well PW) functions as a gate insulating film of the memory transistor, the insulating film MZ between the memory gate electrode MG and the control gate electrode CG functions as an insulating film for insulating (electrically isolating) between the memory gate electrode MG and the control gate electrode CG.

The insulating film MZ is a stacked insulating film and is comprised of a stacked film having an insulating film MZ1, an insulating film MZ2 on the insulating film MZ1, and an insulating film MZ3 on the insulating film MZ2. In this embodiment, the insulating film MZ1 is made of a silicon oxide film (oxide film), the insulating film MZ2 is made of a silicon nitride film (nitride film), and the insulating film MZ3 is made of a silicon oxide film (oxide film).

In the insulating film MZ comprised of the stacked film of the insulating film MZ1, the insulating film MZ2, and the insulating film MZ3, the insulating film MZ1 can be regarded as a bottom insulating film and the insulating film MZ3 can be regarded as a top insulating film. The insulating film MZ therefore has a structure in which the insulating film MZ1 as a bottom insulating film and the insulating film MZ3 as a top insulating film has therebetween the insulating film MZ2.

To facilitate understanding of FIG. 1, the stacked film comprised of the insulating film MZ1, the insulating film MZ2, and the insulating film MZ3 is shown simply as the insulating film MZ, but it is actually comprised of a stacked film of the insulating film MZ1, the insulating film MZ2, and the insulating film MZ3, as shown in FIG. 2.

The insulating film MZ2 of the insulating film MZ is an insulating film having a charge accumulation function. In other words, the insulating film MZ2 of the insulating film MZ is an insulating film for accumulating charges therein and is capable of functioning as a charge accumulation layer (charge accumulation portion). The insulating film MZ is therefore a trap insulating film formed in the insulating film MZ. The term "trap insulating film" as used herein means an insulating film capable of accumulating charges therein. Thus, as an insulating film (charge accumulation layer) having a trap level, the insulating film MZ2 is used. The insulating film MZ can therefore be regarded as an insulating film having therein a charge accumulation portion (meaning the insulating film MZ2 in the present embodiment).

The insulating film MZ3 and the insulating film MZ1 also including the insulating film MZ and located on and under the insulating film MZ2 serving as a trap insulating film can function as a charge blocking layer or a charge confining layer for confining charges in the trap insulating film. By sandwiching the insulating film MZ2 serving as a trap insulating film between the insulating films MZ1 and MZ2 functioning as a charge blocking layer (or charge confining layer), charges can be accumulated in the insulating film MZ2.

The insulating film MZ functions as a gate insulating film of the memory transistor and has a charge retention (charge accumulation) function. The insulating film MZ therefore has a stacked structure of at least three layers so as to function as a gate insulating film having a charge retention function of the memory transistor. The potential barrier height of the inner layer (the insulating film MZ2 in the present embodiment) functioning as a charge accumulation portion is lower than the potential barrier height of the outer layers (the insulating films MZ1 and MZ2 in the present embodiment) functioning as a charge blocking layer. This can be achieved by forming the insulating film MZ1 from a silicon oxide film, the insulating film MZ2 from a silicon nitride film, and the insulating film MZ3 from a silicon oxide film.

The band gap of each of the insulating film MZ3 and the insulating film MZ1 which are a top insulating film and a bottom insulating film of the insulating film MZ, respectively, should be greater than the band gap of the charge accumulation layer (the insulating film MZ2 in the present embodiment) between the insulating film MZ3 and the insulating film MZ1. This means that the band gap of each of the insulating film MZ1 and the insulating film MZ3 is greater than the band gap of the insulating film MZ2 functioning as a trap insulating film. By setting the band gap as described above, the insulating film MZ3 and the insulating film MZ1 sandwiching therebetween the insulating film MZ2 serving a charge accumulation layer can each function as a charge blocking layer (or charge confining layer). Since a silicon oxide film has a band gap greater than that of a silicon nitride film, it is possible to use a silicon nitride film as the insulating film MZ2 and a silicon oxide film as each of the insulating film MZ1 and the insulating film MZ3.

The semiconductor region MS is a semiconductor region functioning as one of a source region and a drain region and the semiconductor region MD is a semiconductor region functioning as the other one of a source region and a drain region. In the present embodiment, the semiconductor region MS is a semiconductor region functioning as a source region and the semiconductor region MD is a semiconductor region functioning as a drain region. The semiconductor regions MS and MD are each comprised of an n type impurity introduced semiconductor region (n type impurity diffusion layer) and they are each equipped with an LDD (lightly doped drain) structure. Described specifically, the semiconductor region MS for source has an $n^-$ type semiconductor region EX1 and an $n^+$ type semiconductor region SD1 having an impurity concentration higher than that of the $n^-$ type semiconductor region EX1, while the semiconductor region MD for drain has an $n^-$ type semiconductor region EX2 and an $n^+$ type semiconductor region SD2 having an impurity concentration higher than that of the $n^-$ type semiconductor region EX2. The $n^+$ type semiconductor region SD1 has a junction depth deeper and an impurity concentration higher than those of the $n^-$ type semiconductor region EX1, while the $n^+$ type semiconductor region SD2 has a junction depth deeper and an impurity concentration higher than those of the $n^-$ type semiconductor region EX2.

The memory gate electrode MG and the control gate electrode CG have, on the sidewalls (sidewalls on the side not adjacent to each other) thereof, sidewall spacers (sidewalls or sidewall insulating films) SW made of an insulating film (silicon oxide film, silicon nitride film, or a stacked film thereof), respectively. In other words, the memory gate electrode MG has, on the sidewall (side surface) on the side opposite to the side adjacent to the control gate electrode CG via the insulating film MZ, and the control gate electrode has, on the sidewall (side surface) on the side opposite to the side adjacent to the memory gate electrode MG via the insulating film MZ, a sidewall spacer SW.

The $n^-$ type semiconductor region EX1 on the source side is formed in self alignment with the sidewall of the memory gate electrode MG, while the $n^+$ type semiconductor region SD1 is formed in self alignment with the side surface (side surface on the side opposite to the side continuous to the memory gate electrode MG) of the sidewall spacer SW. The lightly doped $n^-$ type semiconductor region EX1 lies below the sidewall spacer SW on the sidewall of the memory gate electrode MG, while the heavily doped $n^+$ type semiconductor region SD1 lies on the outside of the lightly doped $n^-$ type semiconductor region EX1. The lightly doped $n^-$ type semiconductor region EX1 is therefore adjacent to the channel region of the memory transistor, while the heavily doped $n^+$ type semiconductor region SD1 is contiguous to (adjacent to) the lightly doped $n^-$ type semiconductor region EX1 and separated from the channel region of the memory transistor by a distance corresponding to the $n^-$ type semiconductor region EX1.

The $n^-$ type semiconductor region EX2 on the drain side is formed in self alignment with the sidewall of the control gate electrode CG, while the $n^+$ type semiconductor region SD2 is formed in self alignment with the side surface (side surface on the side opposite to the side contiguous to the control gate electrode CG) of the sidewall spacer SW on the sidewall of the control gate electrode CG. Therefore, the lightly doped $n^-$ type semiconductor region EX2 lies below the sidewall spacer SW on the sidewall of the control gate electrode CG and the heavily doped $n^+$ type semiconductor region SD2 lies on the outside of the lightly doped $n^-$ type semiconductor region EX2. Accordingly, the lightly doped $n^-$ type semiconductor region EX2 is adjacent to the channel region of the control transistor and the heavily doped $n^+$ type semiconductor region SD2 is adjacent to (contiguous to) the lightly doped $n^-$ type semiconductor region EX2 and is separated from the channel region of the control gate transistor by a distance corresponding to the $n^-$ type semiconductor region EX2.

The memory gate electrode MG has, below the insulating film MZ therebelow, a channel region of the memory transistor and the control gate electrode CG has, below the insulating film GI therebelow, a channel region of the control transistor. The control gate electrode CG has, in a channel formation region of the control transistor below the insulating film GI therebelow, a threshold value adjusting semiconductor region (a p type semiconductor region or an n type semiconductor region) of the control transistor if necessary. The memory gate electrode MG has, in a channel formation region of the memory transistor below the insulating film MZ therebelow, a threshold voltage adjusting semiconductor region (a p type semiconductor region or an n type semiconductor region) of the memory transistor if necessary.

The control gate electrode CG is made of a conductive film, for example, a silicon film PS1 such as an n type polysilicon film (a polycrystalline silicon film having an n type impurity introduced therein or a doped polysilicon film). More specifically, the control gate electrode CG is made of a patterned silicon film PS1.

The memory gate electrode MG is made of a conductive film, for example, a silicon film PS2 such as an n type polysilicon film (a polycrystalline silicon film having an n type impurity introduced therein or a doped polysilicon film). More specifically, it is formed by anisotropically etching a silicon film PS2 (for example, a polycrystalline silicon film having an type impurity introduced therein) formed on the semiconductor substrate SB so as to cover the control gate electrode CG and leaving the silicon film PS2 on the sidewall of the control gate electrode CG via the insulating film MZ. The memory gate electrode MG therefore lies in a sidewall spacer form on one of the sidewalls of the control gate electrode CG via the insulating film MZ.

A corner portion MG3 of the memory gate electrode MG formed between a lower surface MG1 of the memory gate electrode MG and a side surface MG2 of the memory gate electrode MG is more acute than a right angle, that is, an angle less than 90°, that is, an acute angle. In other words, an inner angle (angle) $\alpha 1$ of the corner portion MG3 of the memory gate electrode MG is less than 90° ($\alpha 1 < 90°$). This means that in a cross-sectional view (cross-sectional view of the memory gate electrode MG), the corner portion MG3 with an acute angle (angle less than 90°) is formed between the lower surface MG1 of the memory gate electrode MG and the side surface MG2 of the memory gate electrode MG. The corner portion MG3 of the memory gate electrode MG can also be regarded as an end portion (corner portion) of the lower surface MG1 of the memory gate electrode MG on the side of the control gate. The end portion (corner portion MG3) of the lower surface MG1 of the memory gate electrode MG on the side of the control gate has an angle less than 90°, that is, an acute angle.

In the above description, the lower surface MG1 of the memory gate electrode MG is a surface on the side facing to the semiconductor substrate SB and the side surface MG2 of the memory gate electrode MG is a surface on the side facing to the control gate electrode CG. The cross-sectional view (cross-sectional view of the memory gate electrode MG) corresponds to a view in a cross-section substantially perpendicular to both the lower surface MG1 and the side surface MG2 of the memory gate electrode MG. Therefore, the cross-sectional view of the memory gate electrode MG corresponds to both a view in a cross-section perpendicular to the gate width direction of the memory gate electrode MG (extending direction of the memory gate electrode MG) and a view in a cross-section perpendicular to the gate width direction of the control gate electrode CG (extending direction of the control gate electrode CG). The cross-sectional view of the memory gate electrode MG also corresponds to a view in a cross-section perpendicular to the main surface of the semiconductor substrate SB and parallel to the gate length direction of the memory gate electrode MG. The cross-section of the memory gate electrode MG shown in FIGS. 1 to 3 corresponds to a cross-sectional view of the memory gate electrode MG. The indication of the angle by using this cross-sectional view (cross-sectional view of the memory gate electrode MG) is applied to not only this inner angle $\alpha 1$ but also an angle $\alpha 2$, an angle $\alpha 3$, and an angle $\alpha 4$ which will be described later.

The thickness of the insulating film MZ3 becomes thin partially at a position contiguous (adjacent) to the corner portion MG3 of the memory gate electrode MG. A thickness T1 of the insulating film MZ3 at a position contiguous (adjacent) to the corner portion MG3 of the memory gate electrode MG is smaller than a thickness T2 of a portion of the insulating film MZ3 extending between the semiconductor substrate SB and the memory gate electrode MG (T1<T2). The thickness T1 of the insulating film MZ3 at a position contiguous (adjacent) to the corner portion MG3 of the memory gate electrode MG is smaller than a thickness T3 of a portion of the insulating film MZ3 extending between the control gate electrode CG and the memory gate electrode MG (T1<T3).

In the present embodiment, an angle $\alpha 2$ formed between a portion MZ2a of the insulating film MZ2 extending between the semiconductor substrate SB and the memory gate electrode MG and a portion MZ2b of the insulating film MZ2 extending between the control gate electrode CG and the memory gate electrode MG is 90° or more.

Figure 39:
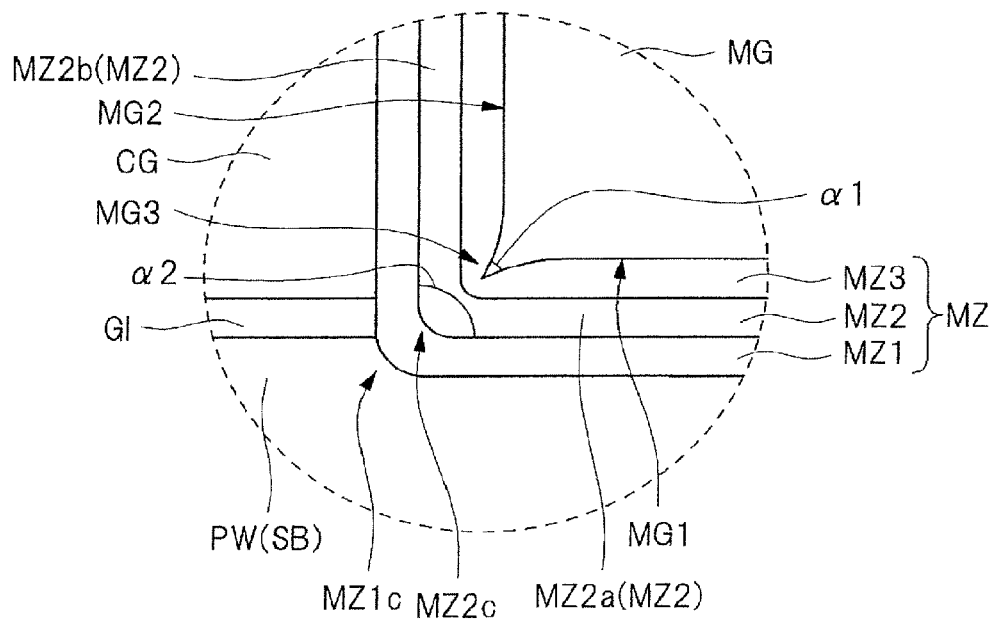
FIG. 39 is a fragmentary cross-sectional view of a semiconductor device of a second modification example.

In the semiconductor device shown in FIGS. 1 to 3 and a second modification example (FIG. 39 shown later) which will be described later, the angle $\alpha 2$ formed between the portion MZ2a of the insulating film MZ2 extending between the semiconductor substrate SB and the memory gate electrode MG and the portion MZ2b of the insulating film MZ2 extending between the control gate electrode CG and the memory gate electrode MG is 90° (right angle). In other words, the portion (MZ2b) of the insulating film MZ2 extending between the control gate electrode CG and the memory gate electrode MG is almost perpendicular to the portion (MZ2a) of the insulating film MZ2 extending between the semiconductor substrate SB and the memory gate electrode MG.

Figure 38:
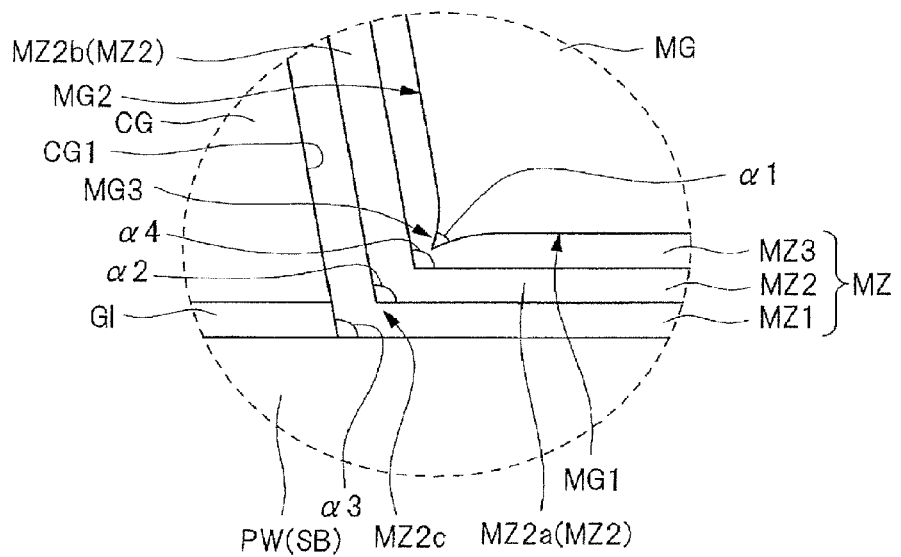
FIG. 38 is a fragmentary cross-sectional view of a semiconductor device of a first modification example.
Figure 40:
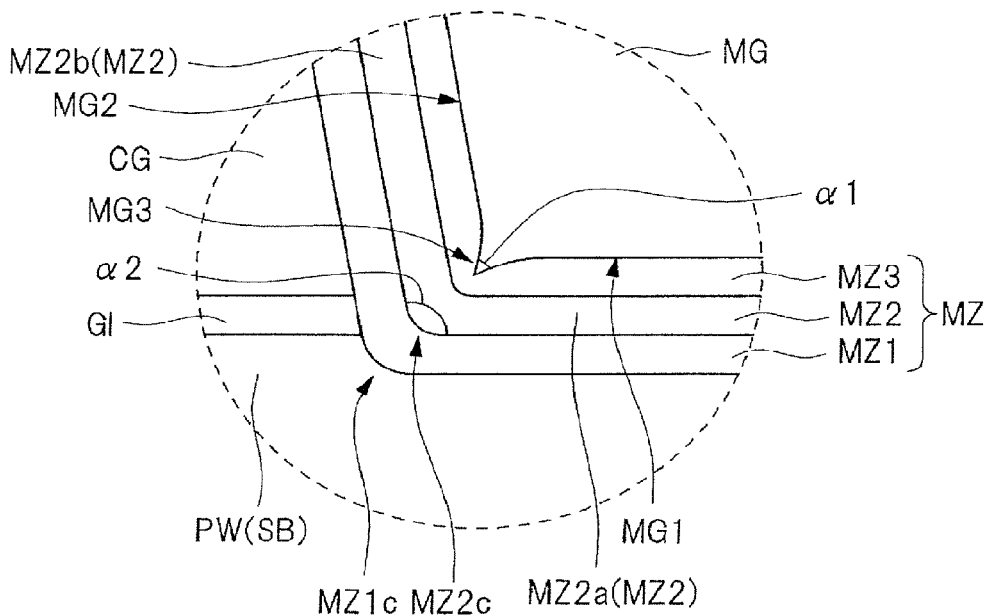
FIG. 40 is a fragmentary cross-sectional view of a semiconductor device of a third modification example.

In a first modification example (FIG. 38 shown later) and a third modification example (FIG. 40 shown later) each described later, on the other hand, the angle $\alpha 2$ formed between the portion MZ2a of the insulating film MZ2 extending between the semiconductor substrate SB and the memory gate electrode MG and the portion MZ2b of the insulating film MZ2 extending between the control gate electrode CG and the memory gate electrode MG is greater than 90°. This means that the portion (MZ2b) of the insulating film MZ2 extending between the control gate electrode CG and the memory gate electrode MG is inclined at a predetermined angle from a perpendicular line against the portion (MZ2a) of the insulating film MZ2 extending between the semiconductor substrate SB and the memory gate electrode MG (inclined to the side at which the angle $\alpha 2$ exceeds 90°).

A metal silicide layer SL formed using a silicide (self aligned silicide) technology or the like lies on (the upper surface of) the memory gate electrode MG (the silicon film PS2 including it), on (the upper surface of) the control gate electrode CG (the silicon film PS1 including it), and on (the upper surface or the surface of) the $n^+$ type semiconductor regions SD1 and SD. The metal silicide layer SL is made of, for example, a cobalt silicide layer, a nickel silicide layer, or a platinum-added nickel silicide layer. The metal silicide layer SL is effective for reducing the resistance such as diffusion resistance or contact resistance. A combination of the silicon film PS1 including the control gate electrode CG and the metal silicide layer SL thereon can be regarded as the control gate electrode CG, while a combination of the silicon film PS2 including the memory gate electrode MG and the metal silicide layer SL thereon can be regarded as the memory gate electrode MG. From the standpoint of fully preventing short-circuiting between the memory gate electrode MG and the control gate electrode CG, it is also possible not to form the metal silicide layer SL on either one or both of the memory gate electrode MG and the control gate electrode CG.

The semiconductor substrate SB has thereon an interlayer insulating film IL1 as an insulating film so as to cover therewith the control gate electrode CG, the memory gate electrode MG, and the sidewall spacers SW. The interlayer insulating film IL1 is made of a film composed only of a silicon oxide film or a stacked film obtained by stacking, over a silicon nitride film, a silicon oxide film thicker than the silicon nitride film. The interlayer insulating film IL1 has a flattened upper surface.

The interlayer insulating film IL1 has therein a contact hole (opening portion or through-hole) CT and the contact hole CT has therein a conductive plug (contact plug) PG as a conductor portion for coupling.

The plug PG is comprised of a thin barrier conductor film formed on the bottom and sidewall (side surface) of the contact hole CT and a main conductor film formed on the barrier conductor film so as to fill the contact hole CT. To simplify the drawing, the barrier conductor film and the main conductor film including the plug PG are shown as a single film in FIG. 1. The barrier conductor film including the plug PG can be formed from, for example, a titanium film, a titanium nitride film, or a stacked film thereof, while the main conductor film including the plug PG can be formed from a tungsten film.

The contact hole CT and the plug PG filled therein are formed on the n+ type semiconductor regions SD1 and SD2, the control gate electrode CG, the memory gate electrode MG, and the like. A portion of the main surface of the semiconductor substrate SB, for example, a portion of the n+ type semiconductor regions SD1 and SD2 (the metal silicide layer SL on the surface thereof), a portion of the control gate electrode CG (the metal silicide layer SL on the surface thereof), and a portion of the memory gate electrode MG (the metal silicide layer SL on the surface thereof) is exposed from the bottom portion of the contact hole CT. The plug PG is coupled to the exposed portion (exposed portion at the bottom portion of the contact hole CT). It is to be noted that FIG. 1 shows a cross-section in which a portion of the n+ type semiconductor region SD2 (metal silicide layer SL on the surface thereof) is exposed at the bottom portion of the contact hole CT and is electrically coupled to the plug PG which has filled the contact hole CT.

The interlayer insulating film IL1 with the plug PG buried therein has a wiring (wiring layer) M1 on the insulating film. The wiring M1 is, for example, a damascene wiring (buried wiring) and a wiring trench provided in an insulating film (not shown in FIG. 1 but corresponding to an insulating film IL2 described later) formed on the interlayer insulating film IL1 has the wiring layer in the wiring trench. The wiring layer M1 is electrically coupled, via the plug PG, to the source region (semiconductor region MS) of the memory transistor, the drain region (semiconductor region MD) of the control transistor, the control gate electrode CG, the memory gate electrode MG, and the like. FIG. 1 shows, as one example of the wiring M1, the wiring M1 electrically coupled to the drain region (semiconductor region MD) of the control transistor via the plug PG.

The wiring M1 has another wiring and insulating film thereabove, but they are neither shown nor described here. The wiring M1 and another wiring thereabove are not limited to a damascene wiring (buried wiring) and they can also be formed by patterning a wiring conductor film. For example, a tungsten wiring or aluminum wiring can be employed.

<Operation of Semiconductor Device>

FIG. 5 is a table showing one example of voltage application conditions to each site of a selected memory cell upon "write", "erase", and "read" operations in the present embodiment. In the table of FIG. 5, listed are voltages (Vd, Vcg, Vmg, Vs, and Vb) to be applied to respective sites of a memory cell (selected memory cell) as shown in FIGS. 1 to 4 upon "write", "erase", and "read" operations. The "voltage Vmg" means a voltage Vmg to be applied to the memory gate electrode MG. The "voltage Vs" means a voltage Vs to be applied to the semiconductor region MS (source region). The "voltage Vcg" means a voltage to be applied to the control gate electrode CG. The "voltage Vd" means a voltage Vd to be applied to the semiconductor region MD (drain region). The "base voltage Vb" means a base voltage Vb to be applied to the p well PW. FIG. 5 shows one example of preferred voltage application conditions. The voltage to be applied is not limited to them but can be changed as needed. In the present embodiment, injection of electrons into a charge accumulation portion (the insulating film MZ2 in the present embodiment) in the insulating film MZ of the memory transistor is defined as "write" and injection of electrons into a hole is defined as "erase".

As a write system, a write system using source-side hot electron injection (hot electron injection write system), so-called SSI (source side injection) system is suited for use.

In the SSI system writing, writing is performed by applying voltages, for example, as shown in the column of "write" of FIG. 5 to respective sites of a selected memory cell in which writing is performed and thereby injecting electrons into a charge accumulation layer (the insulating film MZ2 in the present embodiment) in the insulating film MZ of the selected memory cell. Upon writing, hot electrons are generated in a channel region (between source and drain) below between two gate electrodes (the memory gate electrode MG and the control gate electrode CG) and they are injected into the charge accumulation layer (the insulating film MZ2 in the present embodiment) in the insulating film MZ below the memory gate electrode MG. In this SSI system, therefore, electrons are injected into the side of the memory gate electrode CG of the insulating film MZ. The hot electrons (electrons) thus injected are trapped in the trap level of the charge accumulation layer (the insulating film MZ2 in the present embodiment) in the insulating film MZ. This results in an increase in the threshold voltage of the memory transistor, meaning that the memory transistor is brought into a "write state".

As an erase system, an erase system (tunneling erase system) in which erasing is performed based on FN (Fowler Nordheim) tunneling, so-called "FN system" is suited for use.

In the FN system erasing, erasing is performed by applying, for example, voltages (Vmg is a positive voltage, while Vd, Vcg, Vs, and Vb are zero volt) as shown in the column of "erase" in FIG. 5 to respective sites of a selected memory cell which is an object of an erase operation and in the selected memory cell, causing tunneling of holes from the memory gate electrode MG to inject them into a charge accumulation layer (the insulating film MZ2 in the present embodiment) in the insulating film MZ. Upon erasing, the holes are injected into the insulating film MZ by tunneling through the insulating film MZ3 due to FN tunneling (FN tunneling effect) from the memory gate electrode MG and trapped in the trap level of the charge accumulation layer (the insulating film MZ2 in the present embodiment) in the insulating film MZ. This results in a reduction in the threshold voltage of the memory transistor (meaning that the memory transistor is brought into an erase state).

Upon read operation, voltages, for example, as shown in the column of "read" in the table of FIG. 5 are applied to the respective sites of a selected memory cell which is an object of a read operation. A write state can be discriminated from an erase state by setting the voltage Vmg to be applied to the memory gate electrode MG upon reading at a value between a threshold voltage of the memory transistor under a write state and a threshold voltage of the memory transistor under an erase state.

As an erase system, an erase system (hot hole injection erase system) in which erasing is performed by BTBT (bandto-band tunneling) hot hole injection, a so-called BTBT system can also be employed. In this erasing using the BTBT system, erasing is performed by injecting holes, which have been generated by BTBT (band-to-band tunneling), from the semiconductor substrate (SB) into the charge accumulation layer (the insulating film MZ2 in the present embodiment) in the insulating film MZ.

In the present embodiment, however, using not the BTBT system (BTBT erase system) but the FN system (tunneling erase system) as the erase system is preferred. The consumption current (power consumption) upon erasing is less in the FN system (tunneling erase system) than in the BTBT system (BTBT erase system). In the present embodiment, a consumption current (power consumption) upon erasing can be reduced by using the FN system (tunneling erase system) as the erase system, that is, by injecting holes from the memory gate electrode MG to the insulating film MZ2 (via tunneling) to carry out the erase operation of a selected memory cell.

<Manufacturing Steps of Semiconductor Device>

A method of manufacturing the semiconductor device of the present embodiment will next be described.

Figure 6:
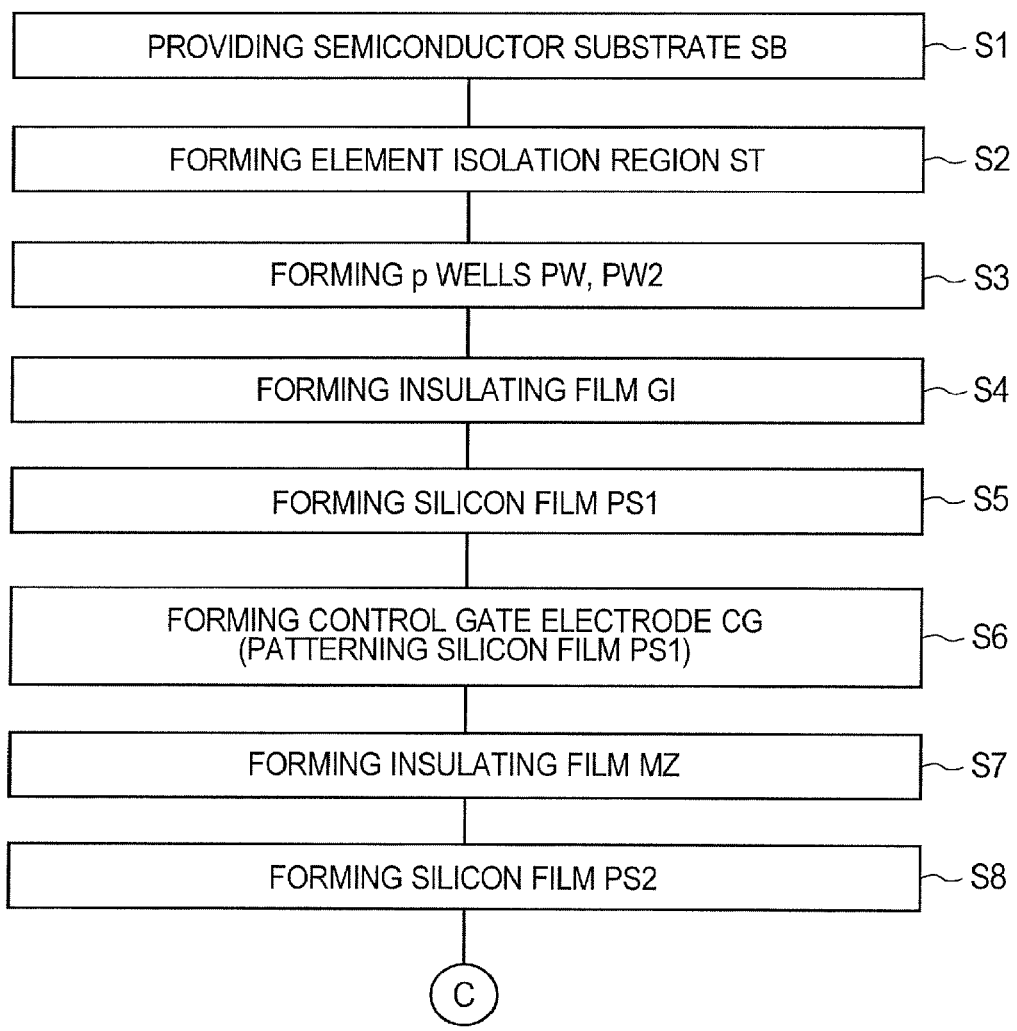
FIG. 6 is a process flow chart showing some of manufacturing steps of the semiconductor device according to the one embodiment of the invention.
Figure 7:
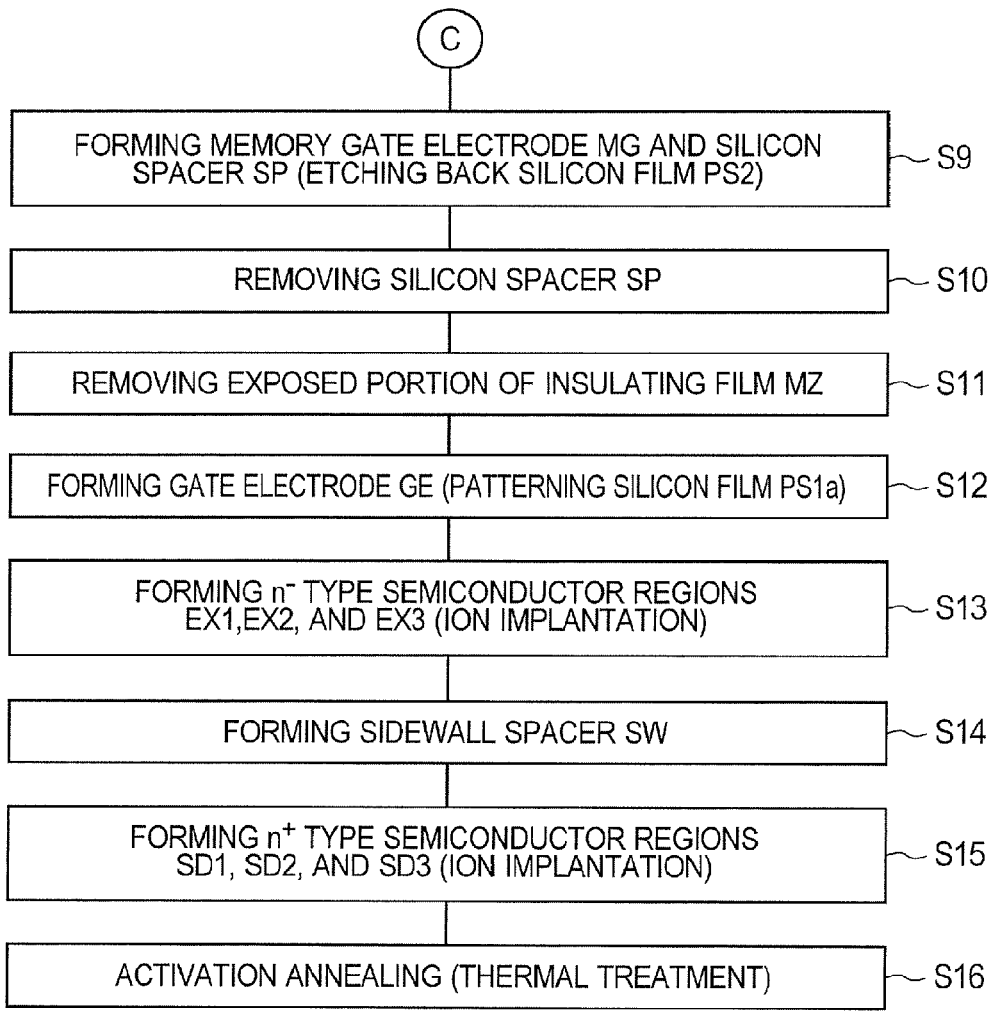
FIG. 7 is a process flow chart showing some of manufacturing steps of the semiconductor device according to the one embodiment of the invention.
Figure 8:
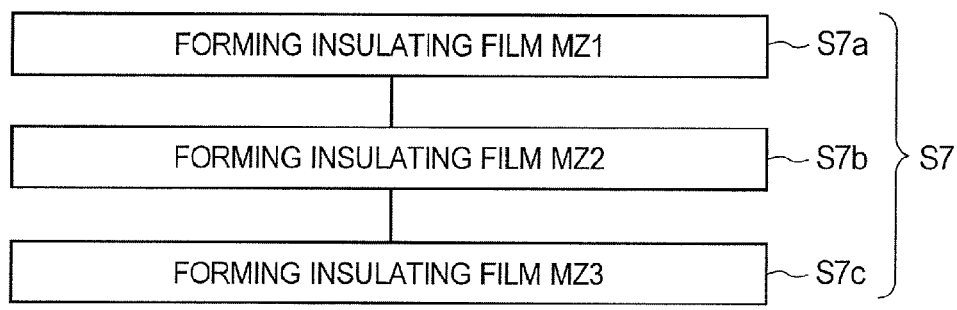
FIG. 8 is a process flow chart showing some of manufacturing steps of the semiconductor device according to the one embodiment of the invention.

FIGS. 6 to 8 are process flow charts for showing some of manufacturing steps of the semiconductor device of the present embodiment. The process flow shown in FIG. 6 is followed by the process flow shown in FIG. 7. FIG. 8 shows a detailed process flow of Step S7 (an insulating film MZ formation step) of FIG. 6. FIGS. 9 to 32 are fragmentary cross-sectional views of the semiconductor device of the present embodiment during manufacturing steps. Of these, FIGS. 9 to 13, FIG. 18, FIG. 20, FIG. 22, FIG. 23, and FIGS. 25 to 32 are fragmentary cross-sectional view of a memory cell region 1A and a peripheral circuit region 1B. They show how to form a memory cell MC in the memory cell region 1A and an MISFET in the peripheral circuit region 1B. FIGS. 14 to 17, FIG. 19, and FIGS. 21 to 24 are enlarged view of a portion of the memory cell region 1A. FIGS. 14 to 17 show details of the step (the insulating film MZ formation step of Step S7) shown in FIG. 13.

In the present embodiment, the memory cell region 1A is a region in which a memory cell of a nonvolatile memory is to be formed on the semiconductor substrate SB (main surface thereof). The peripheral circuit region 1B is a region in which a peripheral circuit is to be formed on the semiconductor substrate SB (main surface thereof). The memory cell region 1A and the peripheral circuit region 1B are located on the same semiconductor substrate SB. Described specifically, the memory cell region 1A and the peripheral circuit region 1B are planar regions different from each other but located on the main surface of the same semiconductor substrate SB. The memory cell region 1A and the peripheral circuit region 1B are not necessarily adjacent to each other, but in order to facilitate understanding of it, the peripheral circuit region 1B is arranged adjacent to the memory cell region 1A in the cross-sectional views of FIGS. 9 to 13, FIG. 18, FIG. 20, FIG. 22, FIG. 23, and FIG. 25 to FIG. 32.

The term "peripheral circuit" as used herein means a circuit other than a nonvolatile memory, for example, a processor such as CPU, a control circuit, a sense amplifier, a column decoder, a row decoder, or an input/output circuit. The MISFET formed in the peripheral circuit region 1B is a MISFET for peripheral circuit.

In the present embodiment, formation of an n channel MISFET (control transistor and memory transistor) in the memory cell region 1A will be described, but a p channel MISFET (control transistor and memory transistor) can be formed in the memory cell region 1A by reversing the conductivity type. Similarly, in the present embodiment, formation of an n channel MISFET in the peripheral circuit region 1B will be described, but a p channel MISFET can be formed in the peripheral circuit region 1B by reversing the conductivity type or a CMISFET (complementary MISFET) or the like can be formed in the peripheral circuit region 1B.

Figure 9:
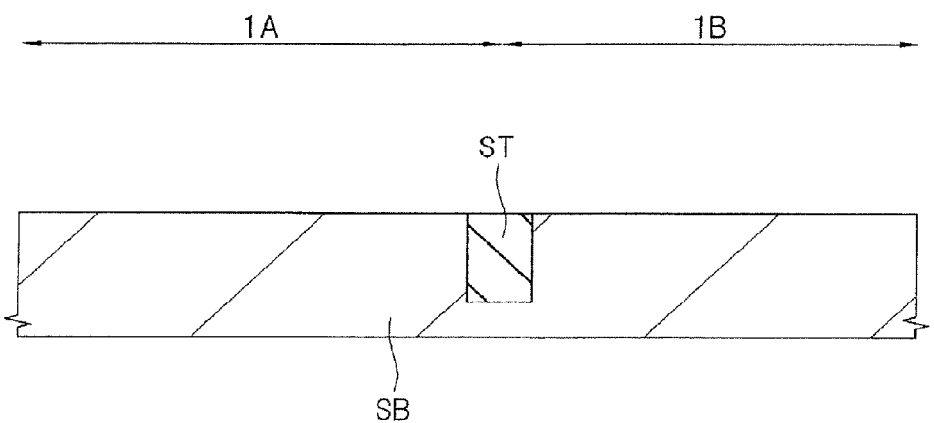
FIG. 9 is a fragmentary cross-sectional view of the semiconductor device according to the one embodiment of the invention during a manufacturing step.

As shown in FIG. 9, a semiconductor substrate (semiconductor wafer) SB, for example, having a specific resistance of from about 1 to 10 $\Omega$cm and made of p type single crystal silicon is prepared (provided) (Step S1 in FIG. 6). Then, an element isolation region (element-element isolation insulating region) ST for defining (demarcating) an active region is formed in the main surface of the semiconductor substrate SB (Step S2 in FIG. 6).

The element isolation region ST is made of an insulator such as silicon oxide and can be formed, for example, by an STI (shallow trench isolation) process or a LOCOS (local oxidization of silicon) process. For example, after formation of an element isolation trench in the main surface of the semiconductor substrate SB, this element isolation trench is filled with an insulating film made of, for example, silicon oxide to form the element isolation region ST. More specifically, after formation of an element isolation trench in the main surface of the semiconductor substrate SB, an insulating film (for example, a silicon oxide film) for forming an element isolation region is formed on the semiconductor substrate SB so as to fill the element isolation trench. Then, the insulating film (insulating film for the formation of an element isolation region) outside the element isolation trench is removed to form the element isolation region ST made of an insulating film embedded in the element isolation trench.

Figure 10:
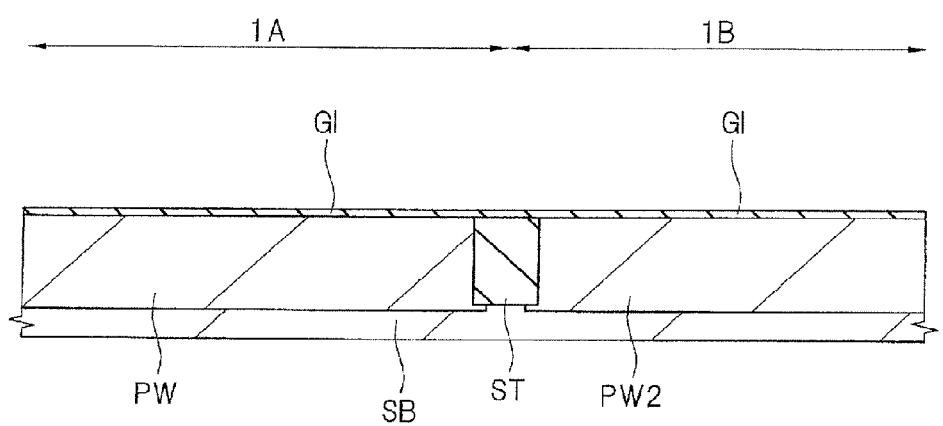
FIG. 10 is a fragmentary cross-sectional view of the semiconductor device during a manufacturing step following that of FIG. 9.

Next, as shown in FIG. 10, a p well PW and a p well PW2 are formed in the memory cell region 1A and the peripheral circuit region 1B of the semiconductor substrate SB, respectively (Step S3 in FIG. 6). The p well regions Pw and PW2 can be formed by the ion implantation of a p type impurity such as boron (B) into the semiconductor substrate SB. The p wells PW and PW2 have a predetermined depth from the main surface of the semiconductor substrate SB. Since the p well PW and the p well PW2 have the same conductivity type, they may be formed by the same ion implantation step or may be formed using different ion implantation steps, respectively.

Next, in order to adjust the threshold voltage of a control transistor to be formed later in the memory cell region 1A, channel doping ion implantation is performed into a surface portion (surface layer portion) of the p well PW of the memory cell region 1A if necessary. Further, in order to adjust the threshold voltage of an n channel MISFET to be formed later in the peripheral circuit region 1B, channel doping ion implantation is performed into a surface portion (surface layer portion) of the p well PW2 of the peripheral circuit region 1B if necessary.

Next, after cleaning of the surface of the semiconductor substrate SB (p wells PW and PW2) by washing with dilute hydrofluoric acid, an insulating film GI for gate insulating film is formed on the main surface (the surface of the p wells PW and PW2) of the semiconductor substrate SB (Step S4 in FIG. 6).

The insulating film GI can be made of, for example, a thin silicon oxide film or silicon oxynitride film. When the insulating film GI is a silicon oxide film, the insulating film GI can be formed, for example, by thermal oxidation. When the insulating film GI is a silicon oxynitride film, on the other hand, it can be formed using high-temperature quick oxidation using $N_2O$, $O_2$, and $H_2$, or a method of subjecting a silicon oxide film formed by thermal oxidation to nitriding (plasma nitriding) treatment in plasma. The formation thickness of the insulating film GI thus formed is, for example, from about 2 to 3 nm. When the insulating film GI is formed using thermal oxidation, the insulating film GI is not formed on the element isolation region ST.

In Step S4, as another mode, the insulating film GI of the peripheral circuit region 1B and the insulating film GI of the memory cell region 1A can be formed in respectively different steps.

Figure 11:
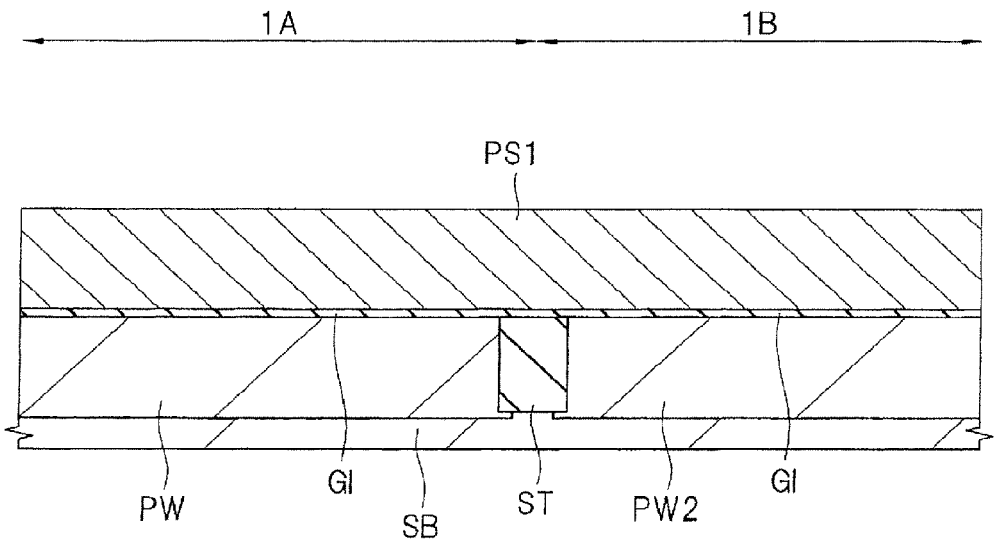
FIG. 11 is a fragmentary cross-sectional view of the semiconductor device during a manufacturing step following that of FIG. 10.

Next, as shown in FIG. 11, a silicon film PS1 is formed (deposited) as a conductive film for the formation of a control gate electrode CG on the main surface (on the entire main surface) of the semiconductor substrate SB, that is, on the insulating film GI in the memory cell region 1A and the peripheral circuit region 1B (Step S5 in FIG. 6).

The silicon film PS1 is made of a polycrystalline silicon film (polysilicon film) and can be formed using CVD (chemical vapor deposition) or the like. The thickness of the silicon film PS1 can be set at, for example, from about 50 to 250 nm. Upon forming the film, after formation of an amorphous silicon film for the silicon film PS1, the amorphous silicon film formed for the silicon film PS1 can be converted into a polycrystalline silicon film as the silicon film PS1. Alternatively, the silicon film PS1 may be an undoped silicon film during film formation.

After formation of the silicon film PS1, a photoresist pattern (not illustrated) is formed on the silicon film PS1 by using photolithography. This photoresist pattern is formed on the entirety of the peripheral circuit region 1B. By introducing an n type impurity into the silicon film PS1 in the memory cell region 1A by using ion implantation or the like with this photoresist pattern as a mask, the silicon film PS1 in the memory cell region 1A is converted into an n type silicon film PS1. In other words, an n type impurity is introduced into the silicon film PS1 in the memory cell region 1A to convert the silicon film PS1 in the memory cell region 1A into an n type silicon film PS1 having an n type impurity introduced therein. No n type impurity is introduced (ion-implanted) into the silicon film PS1 in the peripheral circuit region 1B because it is covered with the photoresist pattern. The photoresist pattern is then removed.

Figure 12:
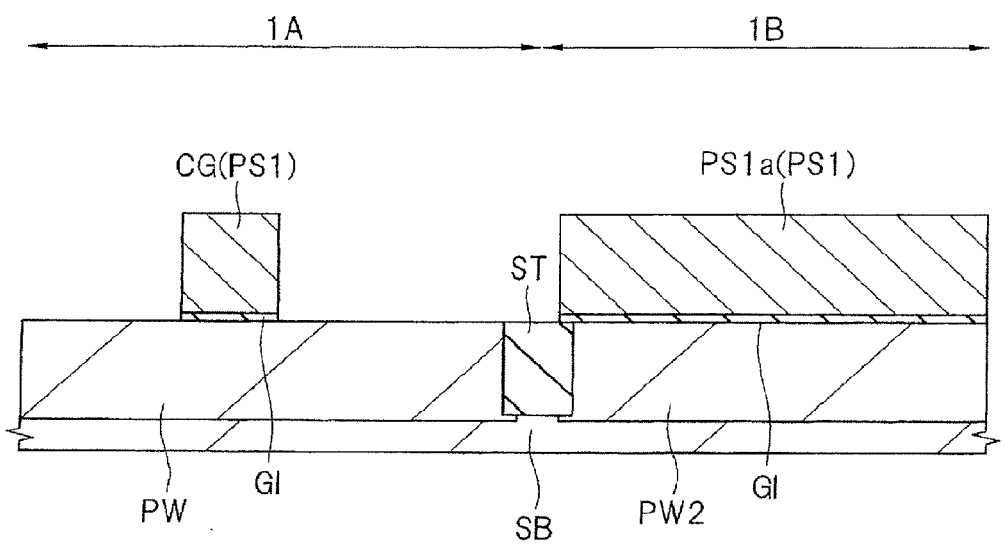
FIG. 12 is a fragmentary cross-sectional view of the semiconductor device during a manufacturing step following that of FIG. 11.

Next, as shown in FIG. 12, a control gate electrode CG is formed by patterning the n type silicon film PS1 in the memory cell region 1A by using photolithography and etching (Step S6 in FIG. 6). The patterning step of Step S6 can be carried out, for example, in the following manner.

Described specifically, the silicon film PS1 in the memory cell region 1A is patterned by etching (dry etching) with, as an etching mask, a photoresist pattern (not illustrated) formed on the silicon film PS1 by photolithography. Although this photoresist pattern is not illustrated here, it is formed on the entirety of a control gate electrode CG formation region and the peripheral circuit region 1B. After completion of the patterning of the silicon film PS1, this photoresist pattern is removed.

In such a manner, the silicon film PS1 is patterned in Step S6 and a control gate electrode CG made of the patterned silicon film PS1 is formed in the memory cell region 1A as shown in FIG. 12. At this time, in the peripheral circuit region 1B, due to the above-mentioned photoresist pattern, patterning of the silicon film PS1 is not performed and the silicon film PS1 remains as is. The silicon film PS1 remaining in the peripheral circuit region 1B will hereinafter be added with a reference numeral PS1$a$ and called "silicon film PS1$a$". In the memory cell region 1A, the insulating film GI remaining under the control gate electrode CG will be a gate insulating film of a control transistor. Therefore, the control gate electrode CG made of the silicon film PS1 lies on the semiconductor substrate SB (p well PW) via the insulating film GI serving as a gate insulating film.

In the memory cell region 1A, the insulating film GI (the insulating film GI other than a portion thereof which will be a gate insulating film) other than a portion covered with the control gate electrode CG can be removed by dry etching performed in the patterning step of Step S6 or wet etching after the dry etching.

Next, channel doping ion implantation is performed into the surface portion (surface layer) of the p well PW in the memory cell region 1A if necessary in order to adjust the threshold voltage of a memory transistor formed later in the memory cell region 1A.

Figure 13:
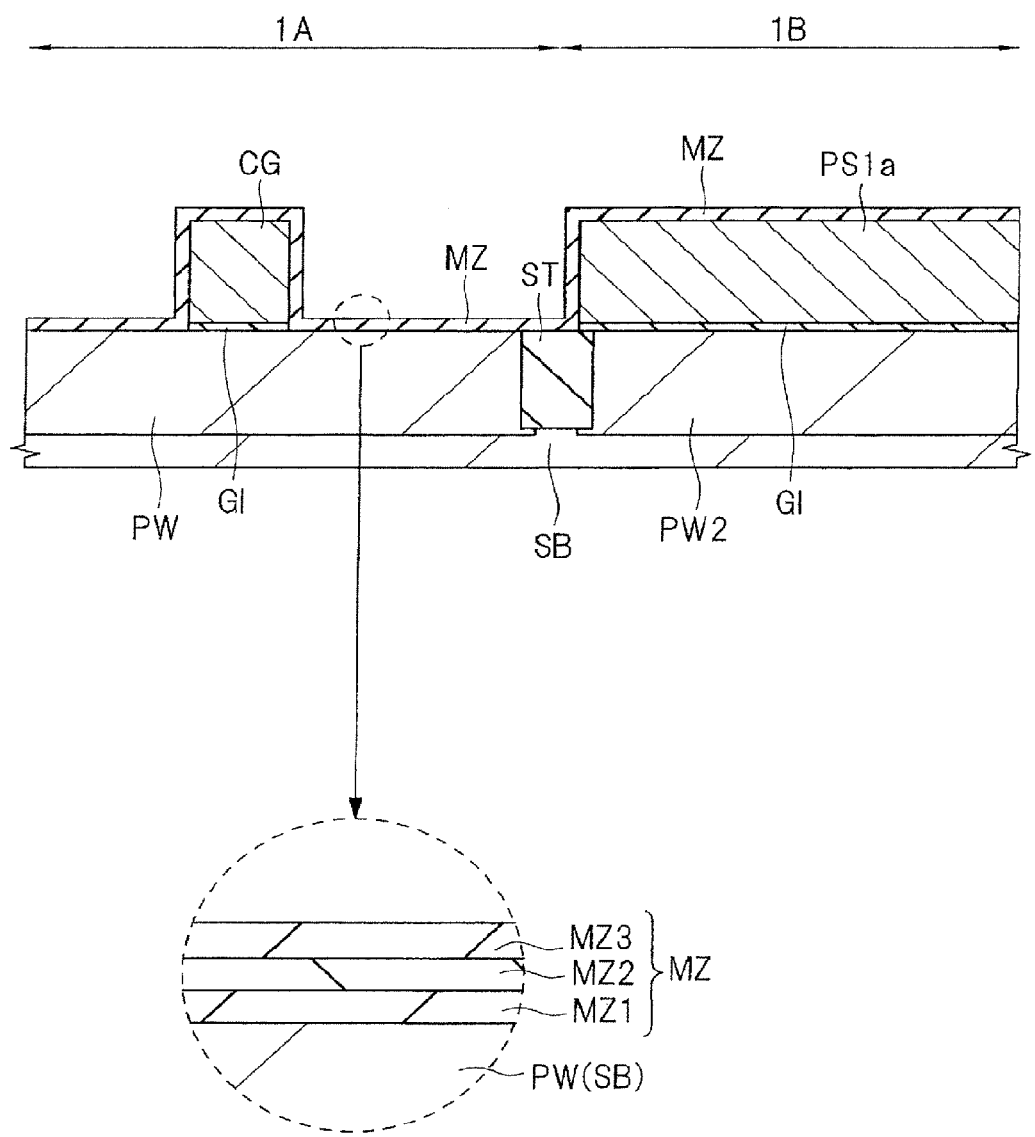
FIG. 13 is a fragmentary cross-sectional view of the semiconductor device during a manufacturing step following that of FIG. 12.

Next, after cleaning the main surface of the semiconductor substrate SB by washing treatment, an insulating film MZ for a gate insulating film of a memory transistor is formed on the entire main surface of the semiconductor substrate SB, that is, on the main surface (surface) of the semiconductor substrate SB and on the surface (upper surface and side surface) of the control gate electrode CG as shown in FIG. 13 (Step S7 in FIG. 6). The silicon film PS1$a$ remains in the peripheral circuit region 1B so that the insulating film MZ is also formed on the surface (upper surface and side surface) of this silicon film PS1$a$. In Step S7, the insulating film MZ is formed on the semiconductor substrate SB so as to cover the control gate electrode CG and the silicon film PS1$a$ of the peripheral circuit region 1B.

The insulating film MZ is an insulating film for a gate insulating film of a memory transistor and it is an insulating film having therein a charge accumulation layer (charge accumulation portion). This insulating film MZ is a stacked film (stacked insulating film) having an insulating film MZ1, an insulating film MZ2 formed on the insulating film MZ1, and an insulating film MZ3 formed on the insulating film MZ2. In the present embodiment, the insulating film MZ1 and the insulating film MZ3 can be formed from a silicon oxide film (oxide film), while the insulating film MZ2 can be formed from a silicon nitride film (nitride film).

To facilitate understanding of the drawing, FIG. 13 shows the insulating film MZ made of the insulating film MZ1, the insulating film MZ2, and the insulating film MZ3 simply as the insulating film MZ. It is a stacked film having the insulating film MZ1, the insulating film MZ2, and the insulating film MZ3 as shown in an enlarged view of a region enclosed by a dotted circle in FIG. 13.

Figure 14:
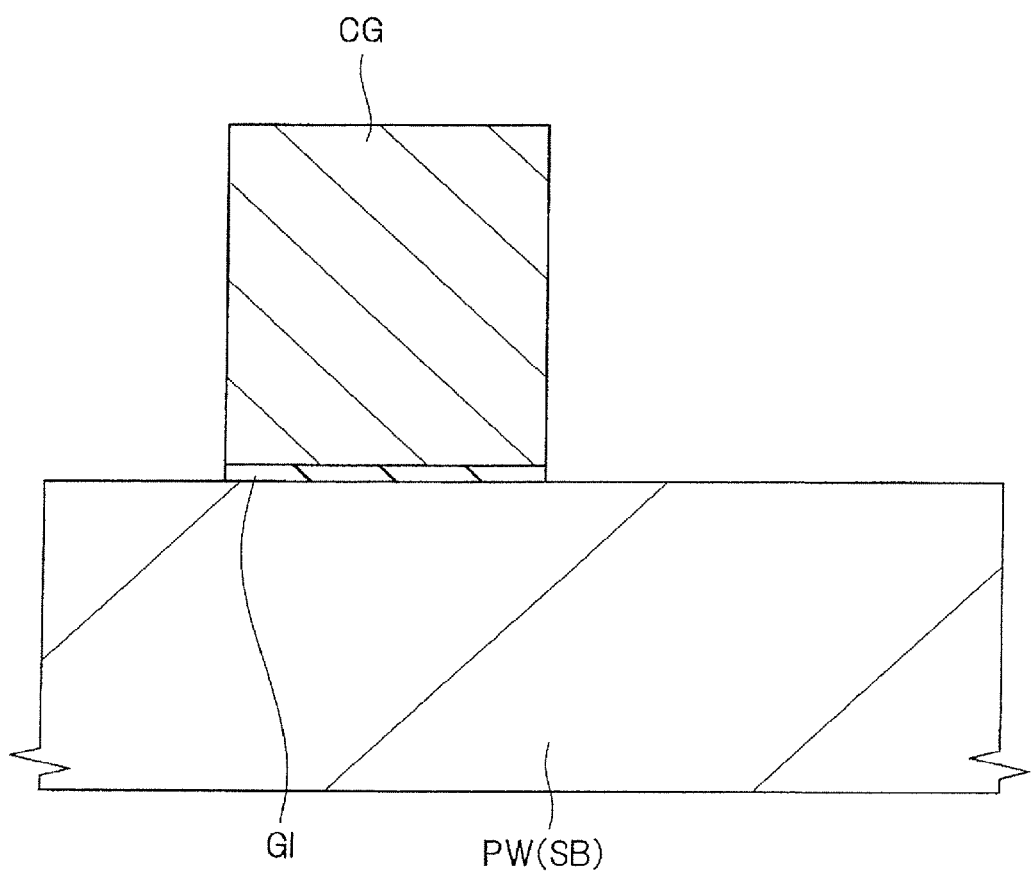
FIG. 14 is a fragmentary cross-sectional view showing details of the step of FIG. 13.

The insulating film MZ formation step in Step S7 will next be described specifically referring to FIG. 8 and FIGS. 14 to 17. FIG. 14 shows the state just before the insulating film MZ is formed and it corresponds to a step stage (stage before the insulating film MZ is formed after formation of the control gate electrode CG) similar to that of FIG. 12.

Figure 15:
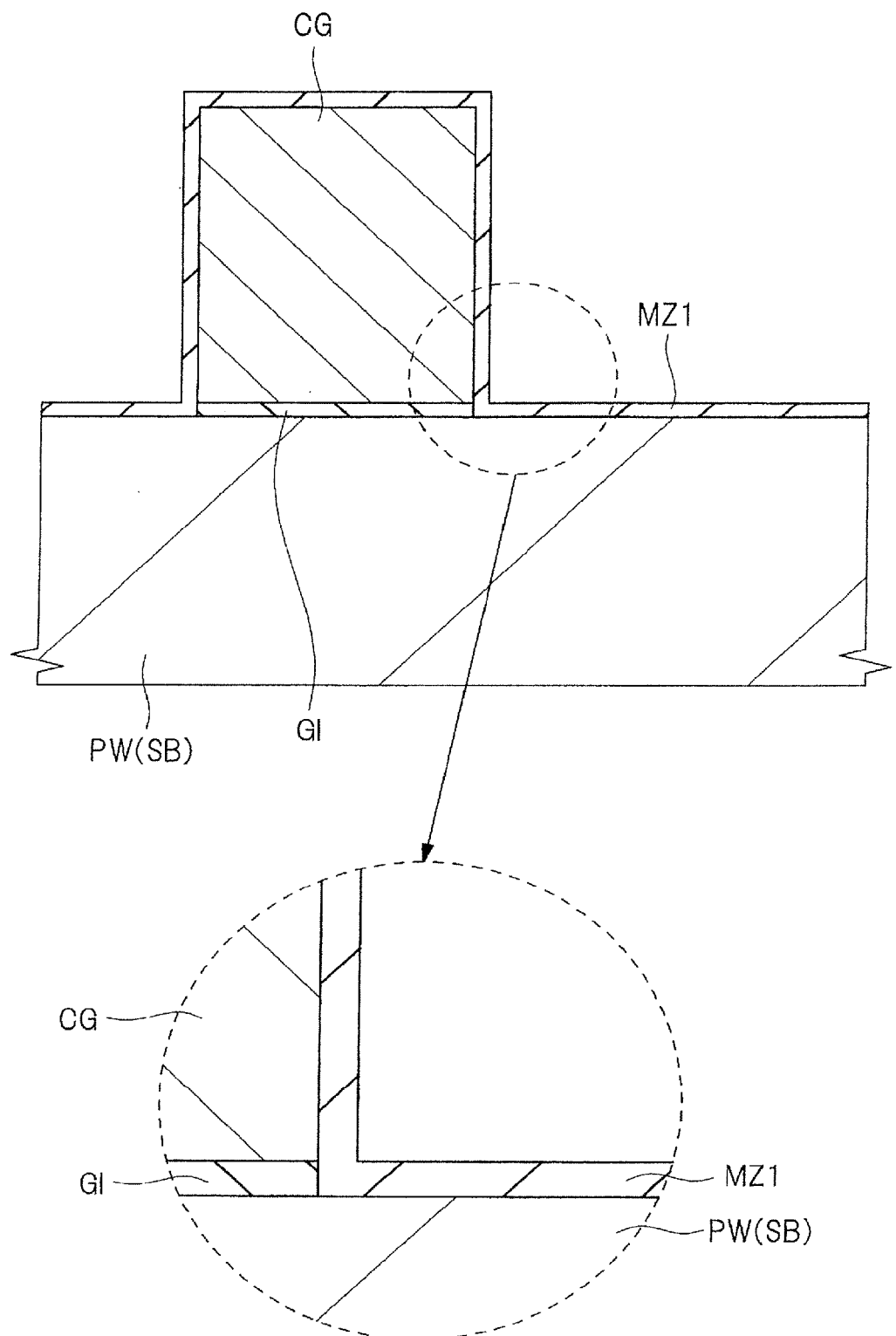
FIG. 15 is a fragmentary cross-sectional view showing details of the step of FIG. 13.

In order to form the insulating film MZ after formation of the control gate electrode CG as shown in FIGS. 12 and 14, first an insulating film MZ1 is formed as shown in FIG. 15 (Step S7$a$ in FIG. 8).

The insulating film MZ1 is made of a silicon oxide film and it can be formed through oxidation treatment (thermal oxidation treatment). As the oxidation treatment (thermal oxidation treatment) at this time, using ISSG (in situ steam generation) oxidation is preferred. The thickness (formed thickness) of the silicon oxide film as the insulating film MZ1 can be set at, for example, from about 3 to 10 nm. The silicon oxide film as the insulating film MZ1 may also be formed using CVD.

The silicon oxide film as the insulating film MZ1 is however formed preferably by oxidation treatment (thermal oxidation treatment) rather than by CVD, with formation through ISSG oxidation being particularly preferred. The silicon oxide film obtained by such a treatment has an improved film quality (becomes a dense film) and the insulating film MZ comprised thereof can therefore have improved charge retention characteristics.

When ISSG oxidation is used for the formation of a silicon oxide film as the insulating film MZ1, for example, an $O_2$ (oxygen) gas and an $H_2$ (hydrogen) gas can be used. When CVD is used for the formation of a silicon oxide film as the insulating film MZ1, a film formation gas such as an $SiH_4$ (monosilane) gas and an $N_2O$ (dinitrogen monoxide) gas can be used. Alternatively, a TEOS (tetraethoxysilane) gas or an $O_2$ (oxygen) gas may be used.

The silicon oxide film as the insulating film MZ1 is formed on the surface of a portion of the semiconductor substrate SB (p wells PW and PW2) not covered with the control gate electrode CG and silicon film PS1, the surface (side surface and upper surface) of the control gate electrode CG, and the surface (side surface and upper surface) of the silicon film PS1a.

Figure 16:
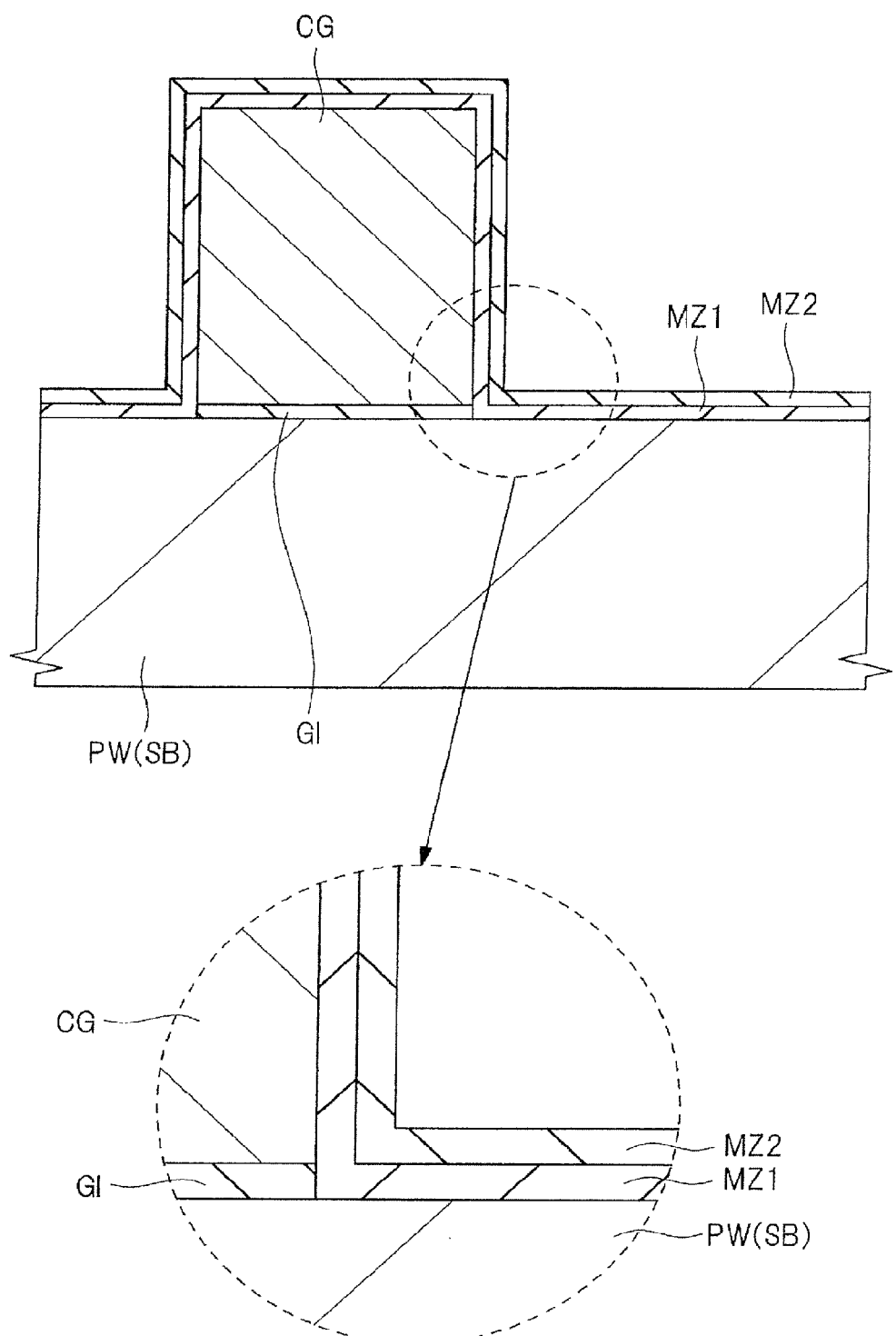
FIG. 16 is a fragmentary cross-sectional view showing details of the step of FIG. 13.

Next, as shown in FIG. 16, an insulating film MZ2 is formed on the insulating film MZ1 (Step S7b in FIG. 8).

The insulating film MZ2 is made of a silicon nitride film and it can be formed, for example, using CVD or ALD (atomic layer deposition). The thickness (formed thickness) of the silicon nitride film as the insulating film MZ2 can be set at, for example, from about 4 to 12 nm. When the silicon nitride film as the insulating film MZ2 is formed using CVD, a film formation gas, for example, an $SiH_2Cl_2$ (dichlorosilane) gas or an $NH_3$ (ammonia) gas.

Figure 17:
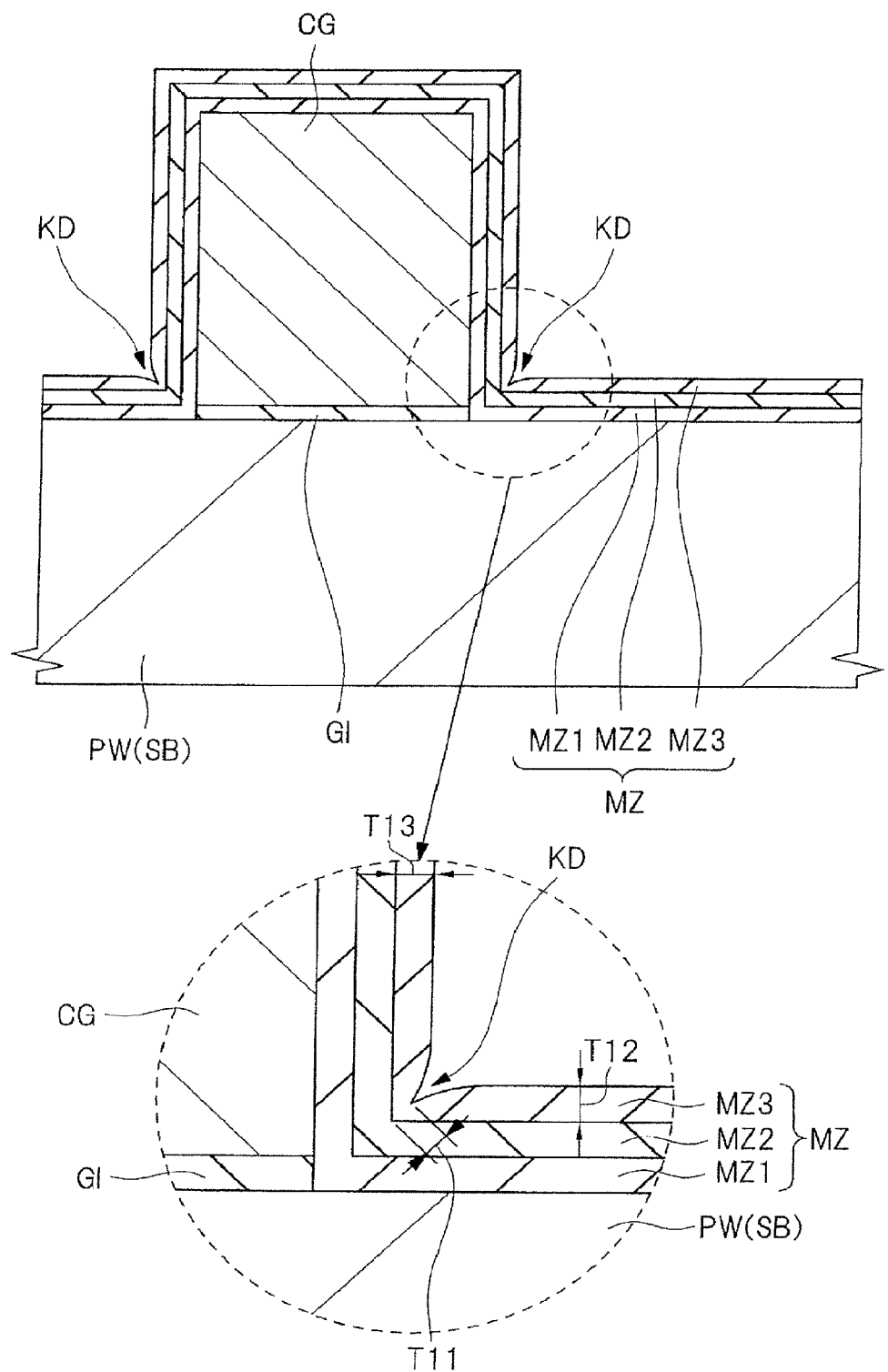
FIG. 17 is a fragmentary cross-sectional view showing details of the step of FIG. 13.

Next, as shown in FIG. 17, an insulating film MZ3 is formed on the insulating film MZ2 (Step S7c in FIG. 8).

The insulating film MZ3 is made of a silicon oxide film and can be formed using oxidation treatment (thermal oxidation treatment). Using ISSG oxidation for this oxidation treatment (thermal oxidation treatment) is more preferred. The thickness of the silicon oxide film as the insulating film MZ3 can be set at, for example, from about 5 to 15 nm. The silicon oxide film as the insulating film MZ3 may also be formed using CVD.

The silicon oxide film as the insulating film MZ3 is however formed preferably by oxidation treatment (thermal oxidation treatment) rather than by CVD, with formation using ISSG oxidation being particularly preferred. The silicon oxide film obtained by such a treatment has an improved film quality (becomes a dense film) and the insulating film MZ comprised thereof can therefore have more improved charge retention characteristics.

When ISSG oxidation is used for the formation of the silicon oxide film as the insulating film MZ3, for example, an $O_2$ (oxygen) gas and an $H_2$ (hydrogen) gas can be used. When CVD is used for the formation of the silicon oxide film as the insulating film MZ3, a film formation gas such as an $SiH_4$ (monosilane) gas or an $N_2O$ (dinitrogen monoxide) gas can be used. Instead of them, a TEOS (tetraethoxysilane) gas or an $O_2$ (oxygen) gas may be used.

The insulating film MZ formed in the memory cell region 1A functions as a gate insulating film of a memory gate electrode MG which will be formed later and has a charge retention (charge accumulation) function. The insulating film MZ should have a charge retention function so that it has a structure in which a a charge accumulation layer (the insulating film MZ made of a silicon nitride film in the present embodiment) is sandwiched between charge blocking layers (the insulating films MZ1 and MZ3 each made of a silicon oxide film in the present embodiment). The potential barrier height of the charge blocking layers (the insulating films MZ1 and MZ3 in the present embodiment) is higher than the potential barrier height of the charge accumulation layer (insulating film MZ2 in the present embodiment). This means that the insulating film MZ2 is an insulating film (trap insulating film) having a charge accumulation function and the band gap of each of the insulating film MZ1 and the insulating film MZ3 is greater than the band gap of the insulating film MZ2.

By performing these steps S7a, S7b, and S7c, the insulating film MZ made of stacked films of the insulating film MZ1, the insulating film MZ2, and the insulating film MZ3 is formed as shown in FIGS. 13 and 17. FIG. 13 and FIG. 17 both correspond to the same step stage (a stage of performing the insulating film MZ3 formation step in Step S7c, that is, a stage after completion of the insulating film MZ formation step).

In the present embodiment, the insulating film MZ3 formation step of Step S7c is designed so that the corner portion MG3 of the memory gate electrode MG which will be described later has an acute angle (refer to FIGS. 2 and 3).

The insulating film MZ1 formation step in Step S7a is performed so that the insulating film MZ1 has a substantially uniform thickness. Similarly, the insulating film MZ2 formation step in Step S7b is performed so that the insulating film MZ2 has a substantially uniform thickness. On the other hand, the insulating film MZ3 formation step in Step S7c is performed so that the thickness of the insulating film MZ3 becomes thin partially at the corner portion KD. The term "corner portion KD" as used herein means a corner portion between a portion of the insulating film MZ3 formed along the main surface of the semiconductor substrate SB and a portion of the insulating film MZ3 formed along the side surface (sidewall) of the control gate electrode CG.

In the formation step of an oxide film, a film formation rate becomes smaller at a corner portion than at a flat portion, though depending on the film formation conditions, because the corner portion is exposed to a smaller amount of the gas, in other words, the corner portion is supplied with a smaller amount of the gas, than the flat portion. Once the flat portion and the corner portion differ in film thickness, the difference between the flat portion and the corner portion in film thickness becomes larger with the progress of the film formation. As a result, the insulation film MZ3 becomes thin partially at the corner portion KD. Described specifically, a thickness T11 of the insulating film MZ3 at the corner portion KD becomes smaller than a thickness T12 of a portion of the insulating film MZ3 formed along the main surface of the semiconductor substrate SB and a thickness T13 of a portion of the insulating film MZ3 formed along the side surface (sidewall) of the control gate electrode CG (T11<T12 and T11<T13). When a silicon film PS2 which will be described later is then formed on the insulating film MZ3 and the resulting silicon film PS2 is etched back to form a memory gate electrode MG, a corner portion MG3 of the memory gate electrode MG formed at a position adjacent to the corner portion KD of the insulating film MZ3 having a partially small thickness can have an acute angle.

The thickness T1 is equal to the thickness T11 (T1=T11); the thickness T2 is equal to the thickness T12 (T2=T12); and the thickness T3 is equal to the thickness T13 (T3=T13).

As described above, the insulating film MZ3 formation step in Step S7c is performed so as to decrease the film formation rate at the corner portion KD and thereby decrease the thickness partially at the corner portion KD. To realize such film formation, the film formation conditions of Step S7c should be controlled. By controlling the conditions such as film formation temperature, pressure, kind of a film forming gas, flow rate of the gas, or a flow rate ratio of the gas, the insulating film MZ3 formation conditions can be set so as to decrease the film formation rate at the corner portion KD and thereby partially decrease the thickness at the corner portion KD. If a test is made while changing the above-mentioned conditions, it is possible to find the film forming conditions under which the film formation rate can be decreased at the corner portion KD and the insulating film MZ3 can be made thinner partially at the corner portion KD. It is therefore recommended to make a test in advance to find the conditions suited for the formation of the insulating film MZ3 and carry out Step S7c based on the film formation conditions thus found.

Figure 18:
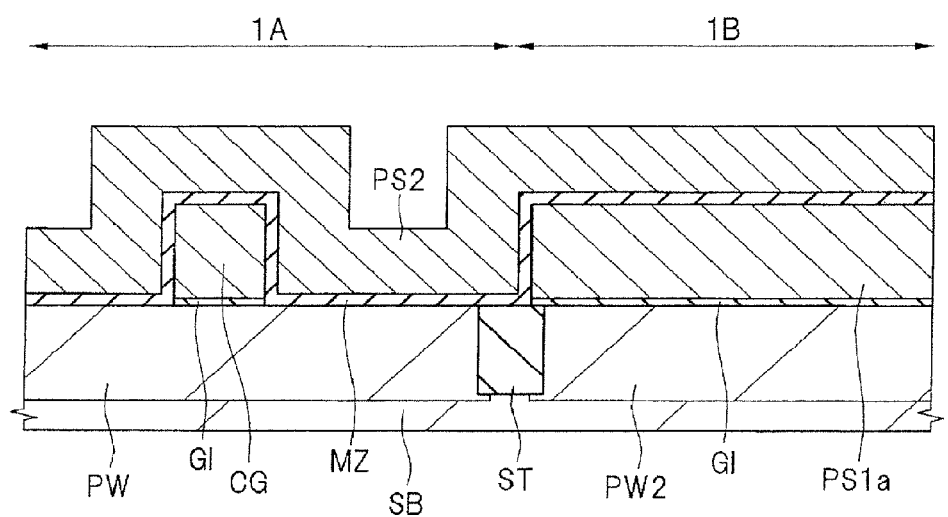
FIG. 18 is a fragmentary cross-sectional view of the semiconductor device during a manufacturing step following that of FIG. 13.
Figure 19:
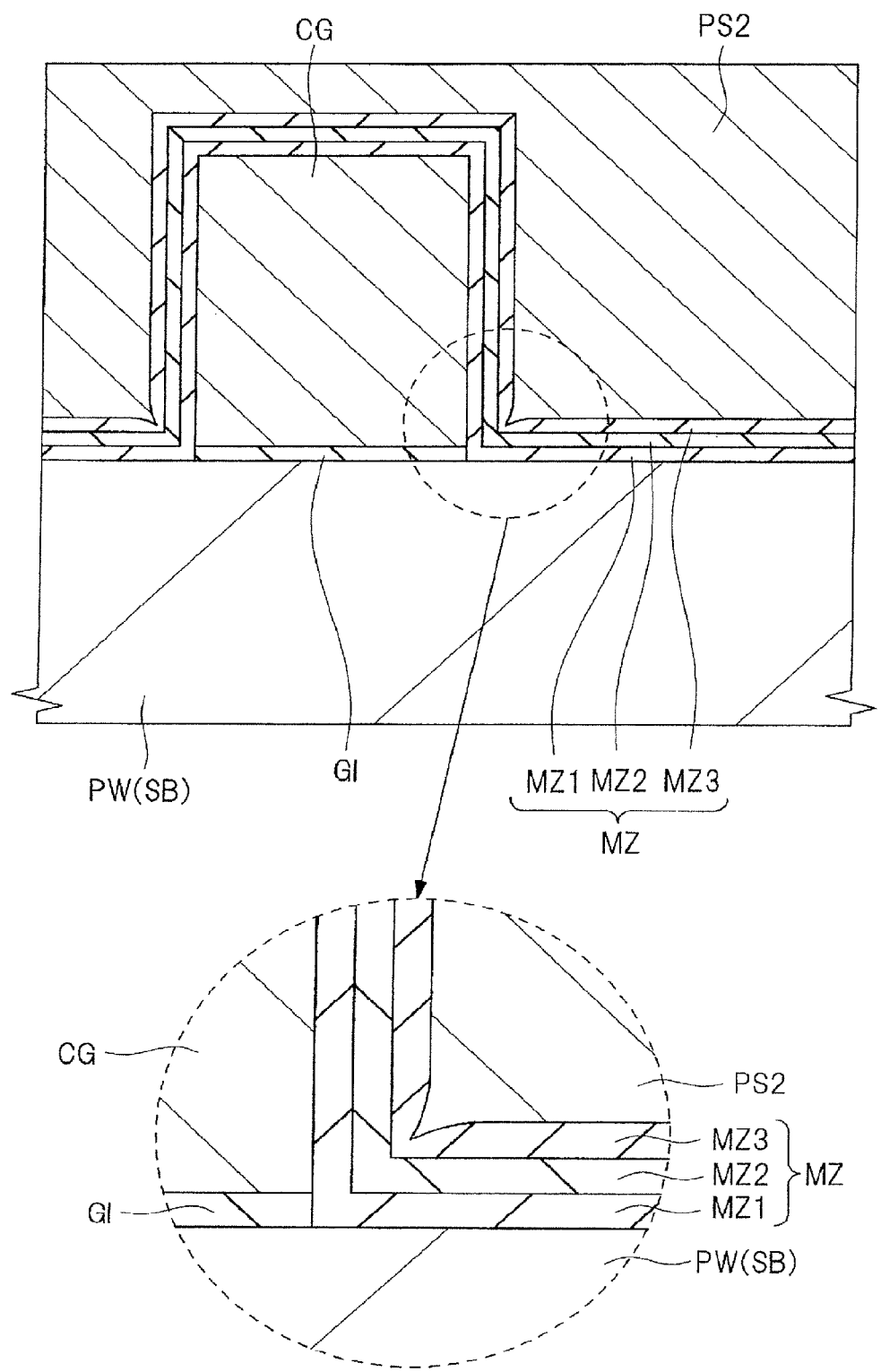
FIG. 19 is a partially enlarged cross-sectional view during the same step as that of FIG. 18.

Next, as shown in FIGS. 18 and 19, a silicon film PS2 is formed (deposited) as a conductive film for the formation of a memory gate electrode MG on the main surface (entire main surface) of the semiconductor substrate SB, that is, on the insulating film MZ so as to cover the control gate electrode CG in the memory cell region 1A and to cover the silicon film PS1a in the peripheral circuit region 1B (Step S8 in FIG. 6).

FIGS. 18 and 19 correspond to the same step stage (stage at which the silicon film PS2 formation step in Step S8 is performed). FIG. 18 shows a cross-sectional region similar to that shown above in FIGS. 9 to 13 and FIG. 19 shows a cross-sectional region similar to that shown above in FIGS. 14 to 17.

The silicon film PS2 is made of a polycrystalline silicon film and can be formed using CVD or the like. The thickness (deposition thickness) of the silicon film PS2 is set at, for example, from about 30 to 150 nm. Upon forming the film, after formation of an amorphous silicon film for the silicon film PS2, heat treatment can be performed to convert the amorphous silicon film formed for the silicon film PS2 into a polycrystalline silicon film as the silicon film PS2.

The silicon film PS2 has a low resistivity because of an n type impurity introduced therein. After formation of the silicon film PS2, an n type impurity can be introduced into the silicon film PS2 by ion implantation, but at the time of forming the silicon film PS2, an n type impurity can be introduced into the silicon film PS2. When an n type impurity is introduced at the time of forming the silicon film PS2, the silicon film PS2 having an n type impurity introduced therein can be formed by adding a doping gas (an n type impurity addition gas) to a gas for forming the silicon film PS2. By using either method, the silicon film PS2 having an n type impurity introduced therein is formed in the memory cell region 1A and the peripheral circuit region 1B.

Next, the silicon film PS2 is etched back (etched, dry etched, or anisotropically etched) using anisotropic etching technology (Step S9 in FIG. 7).

Figure 20:
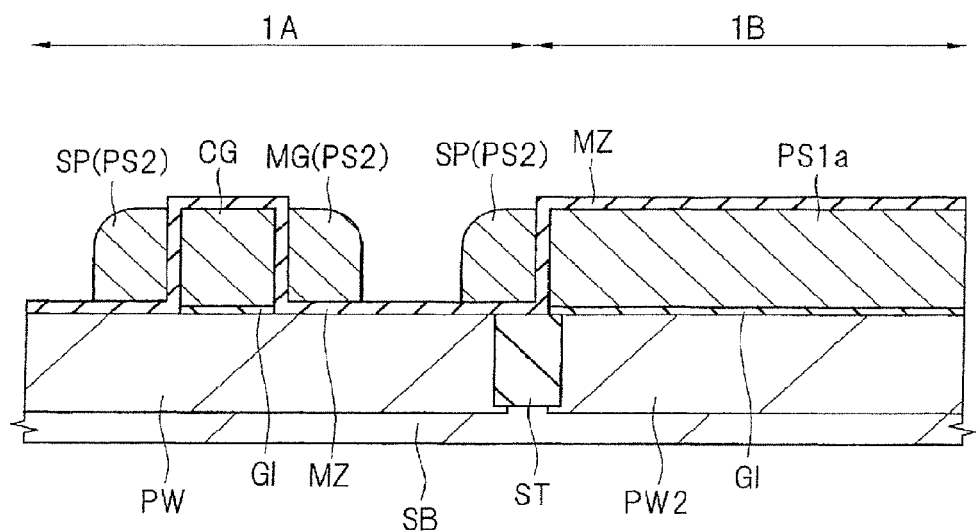
FIG. 20 is a fragmentary cross-sectional view of the semiconductor device during a manufacturing step following that of FIG. 18.
Figure 21:
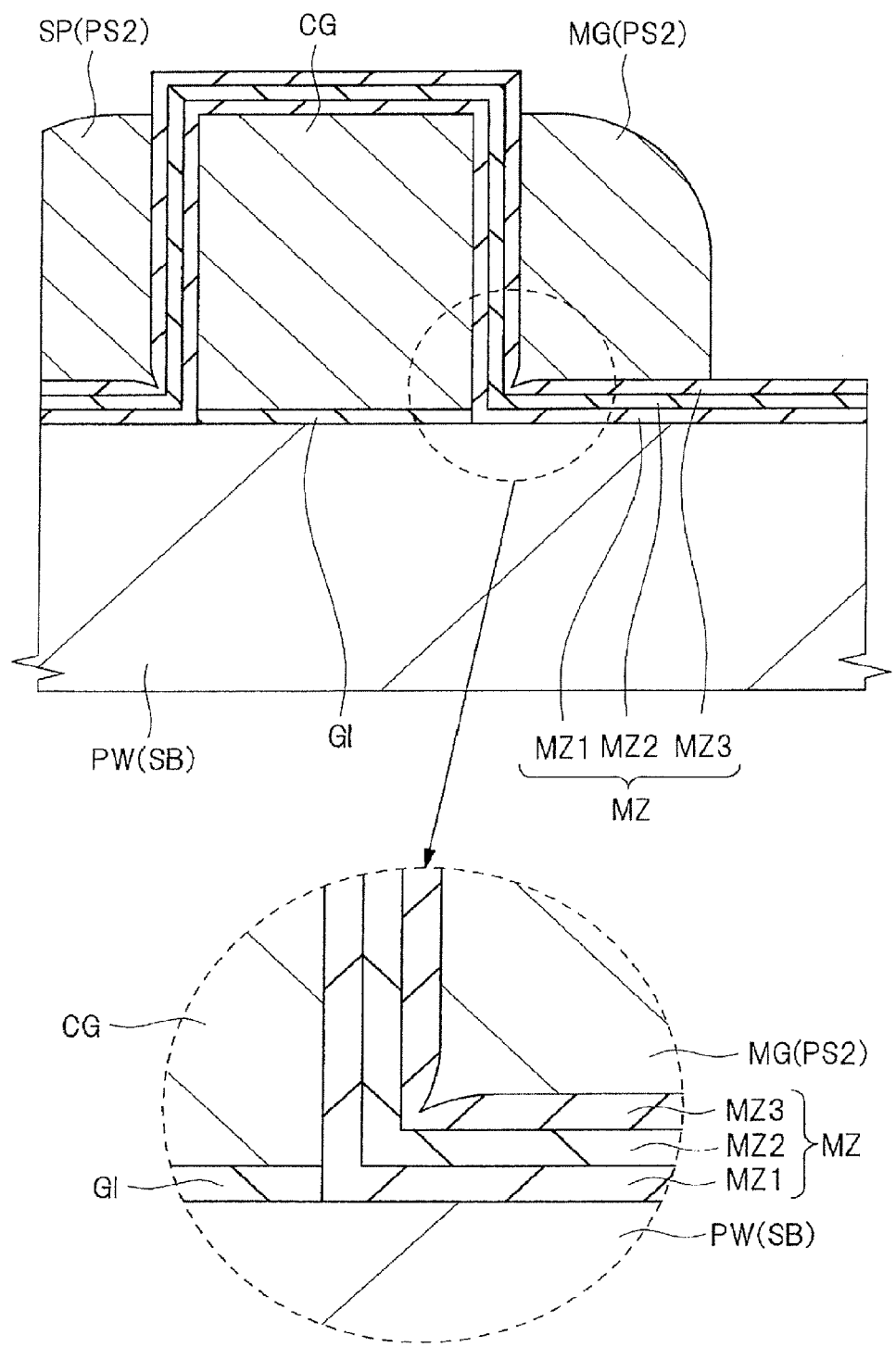
FIG. 21 is a partially enlarged cross-sectional view during the same step as that of FIG. 20.

In the etch back step in Step S9, a thickness of the silicon film PS2 corresponding to the deposition thickness of the silicon film PS2 is anisotropically etched (etched back) to leave the silicon film PS2 in a sidewall spacer form on both of the sidewalls (via the insulating film MZ) of the control gate electrode CG and remove the silicon film PS2 of the other region. As a result, as shown in FIGS. 20 and 21, in the memory cell region 1A, a memory gate electrode MG is formed from the silicon film PS2 which has remained in sidewall spacer form on one of the two sidewalls of the control gate electrode CG via the insulating film MZ. Further in the memory cell region 1A, a silicon spacer SP is formed from the silicon film PS2 which has remained in sidewall spacer form on the other one of the two sidewalls of the control gate electrode CG via the insulating film MZ. The memory gate electrode MG is formed on the insulating film MZ so as to be adjacent to the control gate electrode CG via the insulating film MZ.

FIGS. 20 and 21 correspond to the same step stage (stage at which the etch back step in Step S9 is performed). FIG. 20 shows a cross-sectional region similar to that of FIGS. 9 to 13 and FIG. 18, while FIG. 21 shows a cross-sectional region similar to FIGS. 14 to 17 and FIG. 19.

The silicon spacer SP can also be regarded as a sidewall spacer made of a conductor, that is, a conductor spacer. The memory gate electrode MG and the silicon spacer SP are formed on the sidewalls of the control gate CG which are opposite to each other and they have a substantially symmetric structure with the control gate electrode CG therebetween. A silicon spacer SP can also be formed, via the insulating film MZ, on the sidewall of the silicon film PS1a left in the peripheral circuit region 1B.

When the etch back step in Step S9 is performed, the insulating film MZ in a region not covered with the memory gate electrode MG and the silicon spacer SP is exposed. The memory gate electrode MG formed in Step S9 and the semiconductor substrate SB (p well PW) and also the memory gate electrode MG and the control gate electrode CG have therebetween the insulating film MZ. The insulating film MZ below the memory gate electrode MG in the memory cell region 1A will serve as a gate insulating film of a memory transistor. By adjusting the deposition thickness of the silicon film PS2 deposited in Step S8, the memory gate length (gate length of the memory gate electrode MG) can be adjusted.

Figure 22:
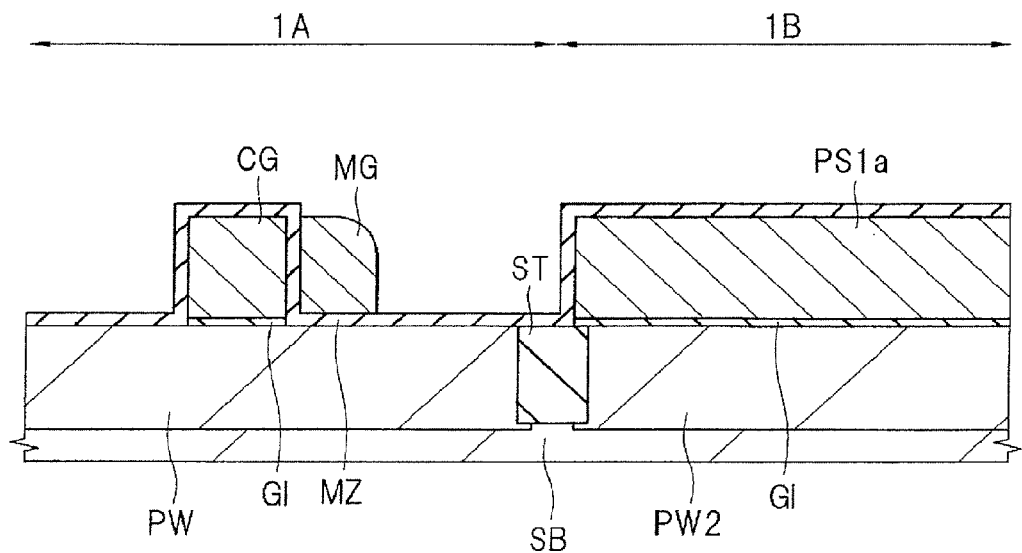
FIG. 22 is a fragmentary cross-sectional view of the semiconductor device during a manufacturing step following that of FIG. 20.

Next, after formation of a photoresist pattern (not illustrated) on the semiconductor substrate SB so as to cover the memory gate electrode MG and expose the silicon spacer SP by using photolithography, dry etching is carried out with this photoresist pattern as an etching mask to remove the silicon spacer SP (Step S10 in FIG. 7). Then, the photoresist pattern is removed. By the etching step of Step S10, the silicon spacer SP is removed as shown in FIG. 22, but the memory gate electrode MG remains without being etched because it is covered with the photoresist pattern.

Figure 23:
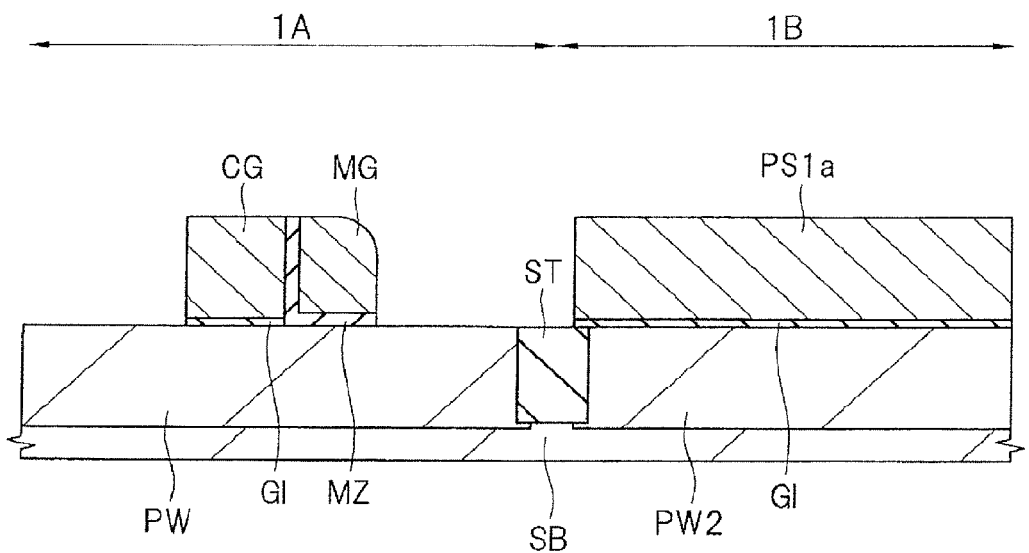
FIG. 23 is a fragmentary cross-sectional view of the semiconductor device during a manufacturing step following that of FIG. 22.
Figure 24:
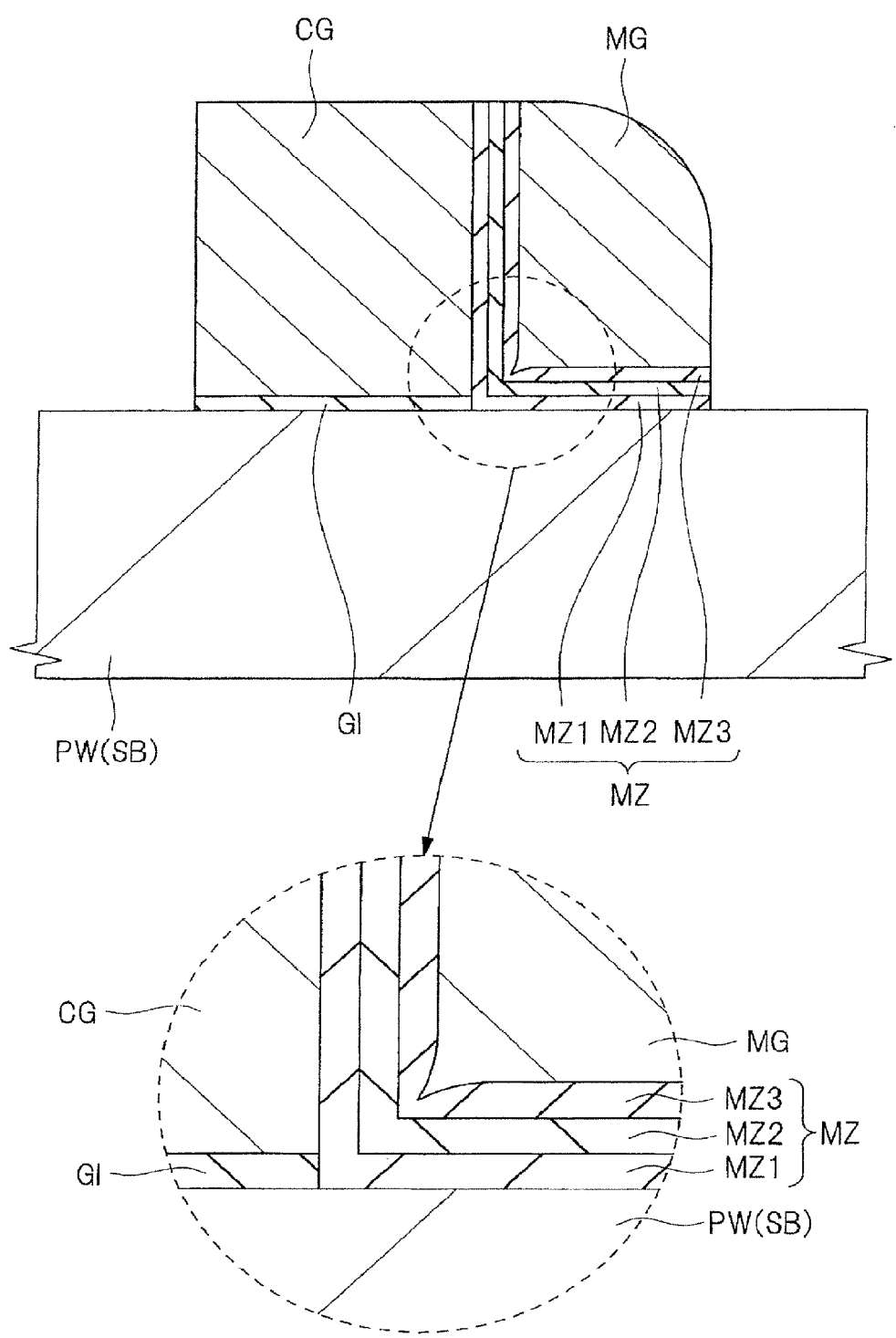
FIG. 24 is a partially enlarged cross-sectional view during the same step as that of FIG. 23.

Next, as shown in FIGS. 23 and 24, a portion of the insulating film MZ exposed without being covered with the memory gate electrode MG is removed by etching (for example, wet etching) (Step S11 in FIG. 7). At the time of this etching, the insulating film MZ located below the memory gate electrode MG and between the memory gate electrode MG and the control gate electrode CG remains without being removed in the memory cell region 1A, while the insulating film MZ in the other region is removed. As is apparent from FIGS. 23 and 24, in the memory cell region 1A, the insulating film MZ continuously extends over both a region between the memory gate electrode MG and the semiconductor substrate SB (p well PW) and a region between the memory gate electrode MG and the control gate electrode CG.

FIGS. 23 and 24 correspond to the same step stage (stage at which the insulating film MZ removing step of Step S10 is performed). FIG. 23 shows a cross-sectional region similar to that of FIGS. 9 to 13, 18, 20, and 22 and FIG. 24 shows a cross-sectional region similar to that of FIGS. 14 to 17, 19, and 21.

Figure 25:
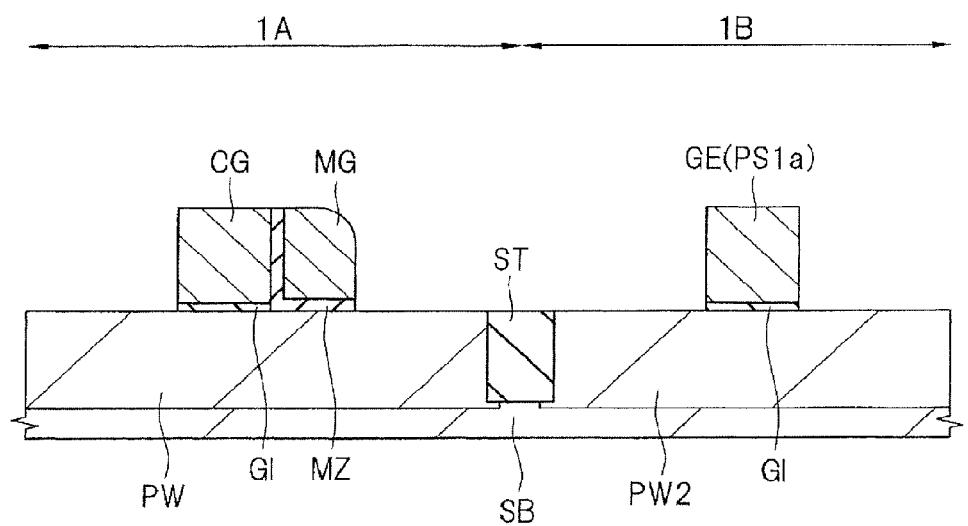
FIG. 25 is a fragmentary cross-sectional view of the semiconductor device during a manufacturing step following that of FIG. 23.

Next, the silicon film PS1a in the peripheral circuit region 1B is patterned using photolithography and etching to form a gate electrode GE in the peripheral circuit region 1B as shown in FIG. 25 (Step S12 in FIG. 7). This patterning step of Step S12 can be carried out, for example, in the following manner.

A photoresist pattern (not illustrated) is formed on the silicon film PS1a formed in the peripheral circuit region 1B by using photolithography. This photoresist pattern is formed in the entirety of the memory cell region 1A and a p channel MISFET formation region of the peripheral circuit region 1B.

With this photoresist pattern as a mask, an n type impurity is introduced into the silicon film PS1a of the peripheral circuit region 1B by using ion implantation or the like. This implantation converts the silicon film PS1a in the n channel MISFET formation region of the peripheral circuit region 1B into an n type silicon film PS1a. After removal of this photoresist pattern, another photoresist pattern (not illustrated) is formed on the silicon film PS1a by using photolithography. This photoresist pattern is formed in both the entirety of the memory cell region 1A and a gate electrode GE formation region of the peripheral circuit region 18. With this photoresist pattern as an etching mask, the silicon film PS1a is patterned by etching (dry etching). At this time, the memory cell region 1A is covered with the photoresist pattern so that it is not etched. Then, this photoresist pattern is removed. As a result, as shown in FIG. 25, a gate electrode GE made of the patterned n type silicon film PS1a is formed in the peripheral circuit region 1B. The gate electrode GE is a gate electrode of a MISFET including a peripheral circuit.

Figure 26:
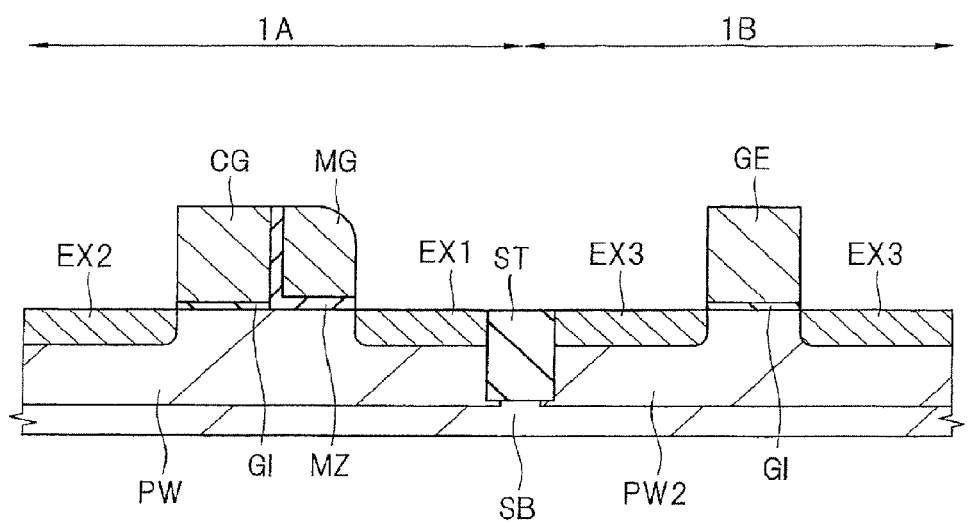
FIG. 26 is a fragmentary cross-sectional view of the semiconductor device during a manufacturing step following that of FIG. 25.

Next, as shown in FIG. 26, n⁻ type semiconductor regions (impurity diffusion layers) EX1, EX2, and EX3 are formed using ion implantation or the like (Step S13 in FIG. 7).

In Step S13, the n⁻ type semiconductor regions EX1, EX2, and EX3 can be formed by the ion implantation of an n type impurity, for example, arsenic (As) or phosphorus (P) into the semiconductor substrate SB (p wells PW and PW2) while using the control gate electrode CG, memory gate electrode MG, and gate electrode GE as masks (ion implantation blocking masks).

At this time, the n⁻ type semiconductor region EX1 is formed in self alignment with the sidewall (sidewall on the side opposite to a side adjacent to the control gate electrode CG via the insulating film MZ) of the memory gate electrode MG in the memory cell region 1A. The n⁻ type semiconductor region EX2 is formed in self alignment with the sidewall (sidewall on the side opposite to a side adjacent to the memory gate electrode MG via the insulating film MZ) of the control gate electrode MG in the memory cell region 1A. The n⁻ type semiconductor region EX3 is formed in self alignment with both sidewalls of the gate electrode GE in the peripheral circuit region 1B. The n⁻ type semiconductor region EX1 and the n⁻ type semiconductor region EX2 function as either one of source and drain regions (source region or drain region) of a memory cell to be formed in the memory cell region 1A, while the n⁻ type semiconductor region EX3 can function as either one of source and drain regions (source region or drain region) of a MISFET to be formed in the peripheral circuit region 1B. The n⁻ type semiconductor region EX1, the n⁻ type semiconductor region EX2, and the n⁻ type semiconductor region EX3 can be formed using the same ion implantation step, but can be formed using ion implantation steps different from each other.

Figure 27:
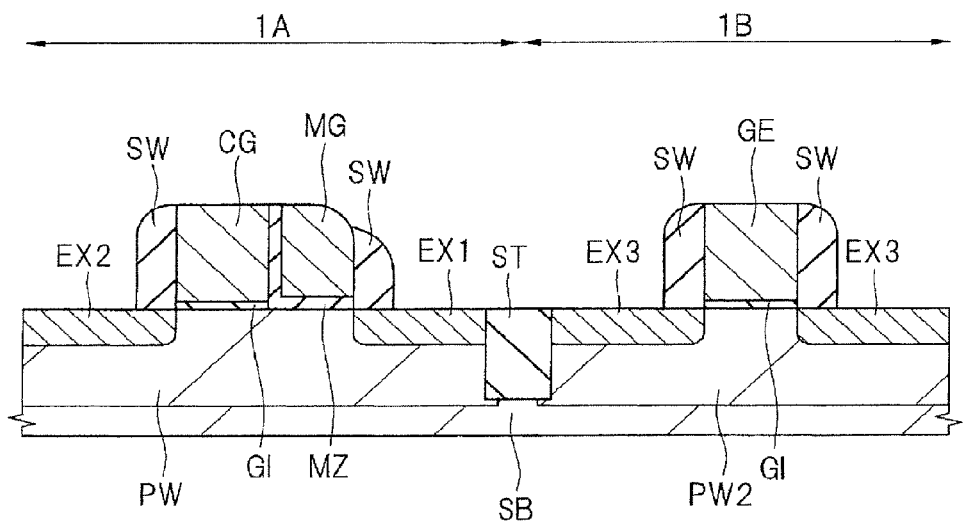
FIG. 27 is a fragmentary cross-sectional view of the semiconductor device during a manufacturing step following that of FIG. 26.

Next, as shown in FIG. 27, a sidewall spacer (sidewall or sidewall insulating film) SW made of an insulating film (silicon oxide film, silicon nitride film, or a stacked film thereof) is formed on the respective sidewalls of the control gate electrode CG and the memory gate electrode MG (sidewalls on the side opposite to a side where they are adjacent to each other via the insulating film MZ) and the sidewalls of the gate electrode GE (Step S14 in FIG. 7).

The sidewall spacer SW formation step in Step S14 can be carried out, for example, in the following manner. Described specifically, an insulating film for the formation of a sidewall spacer SW is deposited using CVD or the like on the entire main surface of the semiconductor substrate SB. This insulating film for the formation of a sidewall spacer SW is made of a silicon oxide film, a silicon nitride film, or a stacked film thereof. Then, the resulting insulating film for the formation of a sidewall spacer SW is anisotropically etched (etched back) to selectively leave this insulating film (insulating film for the formation of a sidewall spacer SW) on the respective sidewalls of the control gate electrode CG and the memory gate electrode MG (sidewalls on the side opposite to a side where they are adjacent to each other via the insulating film MZ) and the sidewalls of the gate electrode GE to form sidewall spacers SW. Thus, the sidewall spacers SW are formed on both the sidewalls of the gate electrode GE, on the sidewall of the control gate electrode CG on the side opposite to a side adjacent to the memory gate electrode MG via the insulating film MZ, and on the sidewall of the memory gate electrode MG on the side opposite to a side adjacent to the control gate electrode CG via the insulating film MZ.

Figure 28:
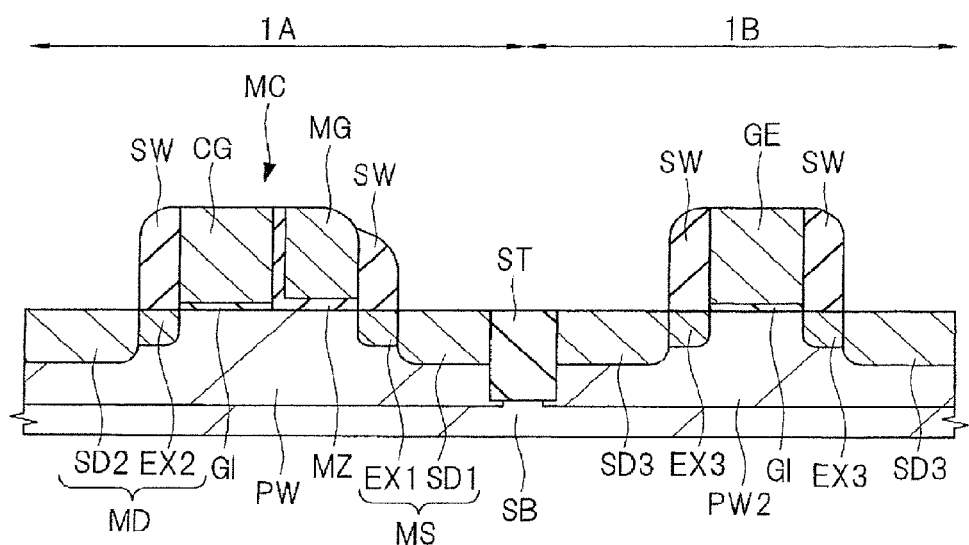
FIG. 28 is a fragmentary cross-sectional view of the semiconductor device during a manufacturing step following that of FIG. 27.

Next, as shown in FIG. 28, n⁺ type semiconductor regions (impurity diffusion layers) SD1, SD2, and SD3 are formed using ion implantation or the like (Step S15 in FIG. 7).

In Step S15, n⁺ type semiconductor regions SD1, SD2, and SD3 can be formed by the ion implantation of an n type impurity such as arsenic (As) or phosphorus (P) into the semiconductor substrate SB (p wells PW and PW2) with the control gate electrode CG, the memory gate electrode MG, and the gate electrode GE, and the sidewall spacers SW on the sidewalls thereof as a mask (ion implantation blocking mask). At this time, the n⁺ type semiconductor region SD1 is formed in self alignment with the sidewall spacer SW on the sidewall of the memory gate electrode MG in the memory cell region 1A, while the n⁺ type semiconductor region SD2 is formed in self alignment with the sidewall spacer SW on the sidewall of the control gate electrode CG in the memory cell region 1A. The n⁺ type semiconductor regions SD3 are formed in self alignment with the sidewall spacers SW on both sidewalls of the gate electrode GE, respectively. As a result, formation of an LDD structure is completed. The n⁺ type semiconductor region SD1, the n⁺ type semiconductor region SD2, and the n⁺ type semiconductor region SD3 can be formed using the same ion implantation step, but they may be formed by ion implantation steps different from each other.

In such a manner, an n type semiconductor region MS functioning as a source region of a memory transistor is formed from the n⁻ type semiconductor region EX1 and the n⁺ type semiconductor region SD1 having an impurity concentration higher than it, while an n type semiconductor region MD functioning as a drain region of a control transistor is formed from the n⁻ type semiconductor region EX2 and the n⁺ type semiconductor region SD2 having a higher impurity concentration than it. Further, an n type semiconductor region functioning as a source/drain region of the MISFET of the peripheral circuit region 1B is formed from the n⁻ type semiconductor region EX3 and the n⁺ type semiconductor region SD3 having an impurity concentration higher than it.

Next, activation annealing is performed as heat treatment for activating the impurity introduced into semiconductor regions (n⁻ type semiconductor regions EX1, EX2, and EX3, and n⁺ type semiconductor regions SD1, SD2, and SD3) for source and drain (Step S16 in FIG. 7).

In such a manner, a memory cell of a nonvolatile memory is formed in the memory cell region 1A and a MISFET is formed in the peripheral circuit region 1B.

Next, a silicon oxide film (not illustrated here) is formed on the entire main surface of the semiconductor substrate SB by using CVD or the like. Then, the silicon oxide film is removed using photolithography and etching to expose a silicon surface (silicon region or silicon film) of the upper surfaces (surfaces) of the n⁺ type semiconductor regions SD1, SD2, and SD3, the upper surface of the control gate electrode CG, the upper surface of the memory gate electrode MG, and the upper surface of the gate electrode GE. This silicon oxide film is left in a silicon region in which a metal silicide layer SL is not to be formed.

Figure 29:
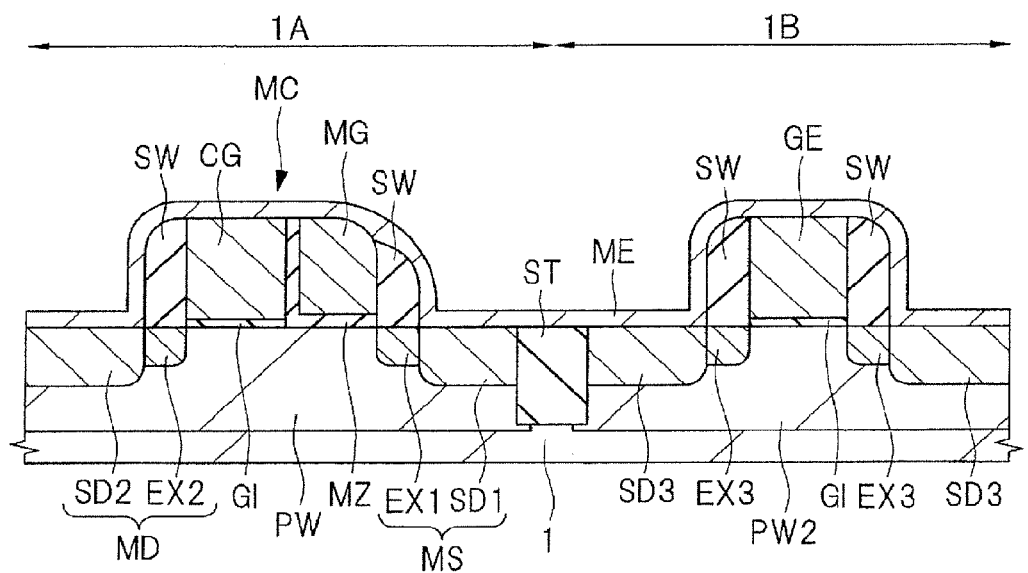
FIG. 29 is a fragmentary cross-sectional view of the semiconductor device during a manufacturing step following that of FIG. 28.

Next, as shown in FIG. 29, a metal film ME is formed (deposited) on the entire main surface of the semiconductor substrate SB including the upper surface (surface) of the $n^+$ type semiconductor region SD1, SD2, and SD3, the upper surface of the memory gate electrode MG, the upper surface of the control gate electrode CG, and the upper surface of the gate electrode GE so as to cover the control gate electrode CG, the memory gate electrode MG, the gate electrode GE, and the sidewall spacer SW. The upper surface of the memory gate electrode MG corresponds to a portion of the surface of the memory gate electrode MG not covered with the sidewall spacer SW. The metal film ME is made of, for example, a cobalt (Co) film, a nickel (Ni) film, or a nickel platinum alloy film and can be formed using sputtering or the like.

Figure 30:
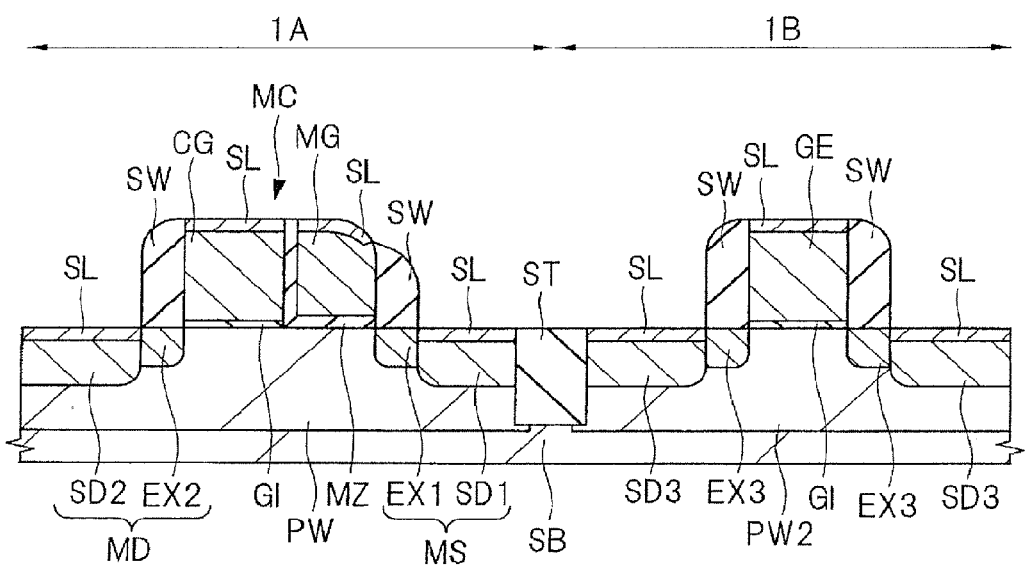
FIG. 30 is a fragmentary cross-sectional view of the semiconductor device during a manufacturing step following that of FIG. 29.

Next, the semiconductor substrate SB is heat treated to cause a reaction between the metal film ME and an upper layer portion (surface layer portion) of each of the $n^+$ type semiconductor regions SD1, SD2, and SD3, the control gate electrode CG (silicon film PS1), the memory gate electrode MG (silicon film PS2), and the gate electrode GE (silicon film PS1a). As a result, as shown in FIG. 30, a metal silicide layer SL is formed on the upper portion of each of the $n^+$ type semiconductor regions SD1, SD2, and SD3, the control gate electrode CG (silicon film PS1), the memory gate electrode MG (silicon film PS2), and the gate electrode GE (silicon film PS1a). When the metal film ME is a cobalt film, the metal silicide layer SL is made of a cobalt silicide layer; when the metal film ME is a nickel film, the metal silicide layer SL is a nickel silicide layer; and when the metal film ME is a nickel platinum alloy film, the metal silicide layer SL is made of a platinum-added nickel silicide layer. Then, an unreacted portion of the metal film ME is removed. FIG. 30 is a cross-sectional view of this stage.

In such a manner, the metal silicide layer SL is formed on the upper portion of each of the $n^+$ type semiconductor regions SD1, SD2, and SD3, the control gate electrode CG, the memory gate electrode MG, and the gate electrode GE by using so-called silicide (self aligned silicide) process, by which the resistance of the source, drain, and each of the gate electrodes (CG, MG, and GE) can be reduced.

Figure 31:
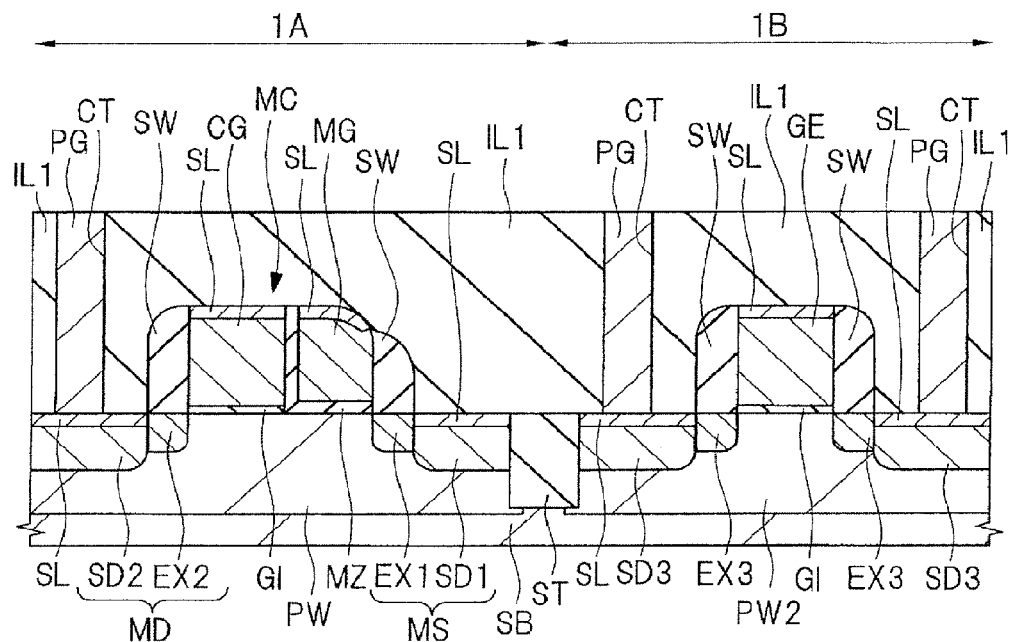
FIG. 31 is a fragmentary cross-sectional view of the semiconductor device during a manufacturing step following that of FIG. 30.

Next, as shown in FIG. 31, an interlayer insulating film IL1 is formed (deposited) as an insulating film on the entire main surface of the semiconductor substrate SR so as to cover the control gate electrode CG, memory gate electrode MG, gate electrode GE, and sidewall spacer SW.

The interlayer insulating film IL1 is made of a film composed only of a silicon oxide film or a stacked film obtained by stacking, over a silicon nitride film, a silicon oxide film thicker than the silicon nitride film. It can be formed, for example, by CVD. After formation of the interlayer insulating film IL1, the upper surface of the interlayer insulating film IL1 is planarized using CMP (chemical mechanical polishing) or the like if necessary.

Next, the interlayer insulating film IL1 is dry etched using lithography with a photoresist pattern (not illustrated) formed on the interlayer insulating film IL1 as an etching mask to form a contact hole (opening portion or through-hole) CT in the interlayer insulating film IL1.

Next, in the contact hole CT, a conductive plug PG made of tungsten (W) or the like is formed as a conductor portion for coupling.

The plug PG is formed, for example, in the following manner. A barrier conductor film is formed on the interlayer insulating film IL1 including that inside (on the bottom portion and the sidewall) the contact hole CT. This barrier conductor film is made of, for example, a titanium film, a titanium nitride film, or a stacked film thereof. Then, a main conductor film made of, for example, a tungsten film is formed on the barrier conductor film so as to fill the contact hole CT, followed by removal of an unnecessary portion of the main conductor film and the barrier conductor film on the interlayer insulating film IL1 by using CMP, etch back, or the like to form the plug PG. To simplify the drawing, FIG. 31 shows the barrier conductor film and the main conductor film (tungsten film) as one film including the plug PG.

The contact hole and the plug PG filling the contact hole are formed on the $n^+$ type semiconductor regions SD1, SD2, and SD3, the control gate electrode CG, the memory gate electrode MG, the gate electrode GE, or the like. From the bottom portion of the contact hole CT, exposed is a portion of the main surface of the semiconductor substrate SB, for example, a portion of the $n^+$ type semiconductor regions SD1, SD2, and SD3 (the metal silicide layer SL on the surface thereof), a portion of the control gate electrode CG (metal silicide layer SL on the surface thereof), a portion of the memory gate electrode MG (metal silicide layer SL on the surface thereof), or a portion of the gate electrode GE (metal silicide layer SL on the surface thereof). The cross-sectional view of FIG. 31 shows a cross section in which a portion of the $n^+$ type semiconductor regions SD2 and SD3 (the metal silicide layer SL on the surface thereof) is exposed from the bottom portion of the contact hole CT and it is electrically coupled with the plug PG filling the contact hole CT.

Next, a wiring (wiring layer) M1 which is a first wiring layer is formed on the interlayer insulating film IL1 having the plug PG buried therein. Formation of this wiring M1 by using damascene technology (meaning a single damascene technology) will hereinafter be described.

Figure 32:
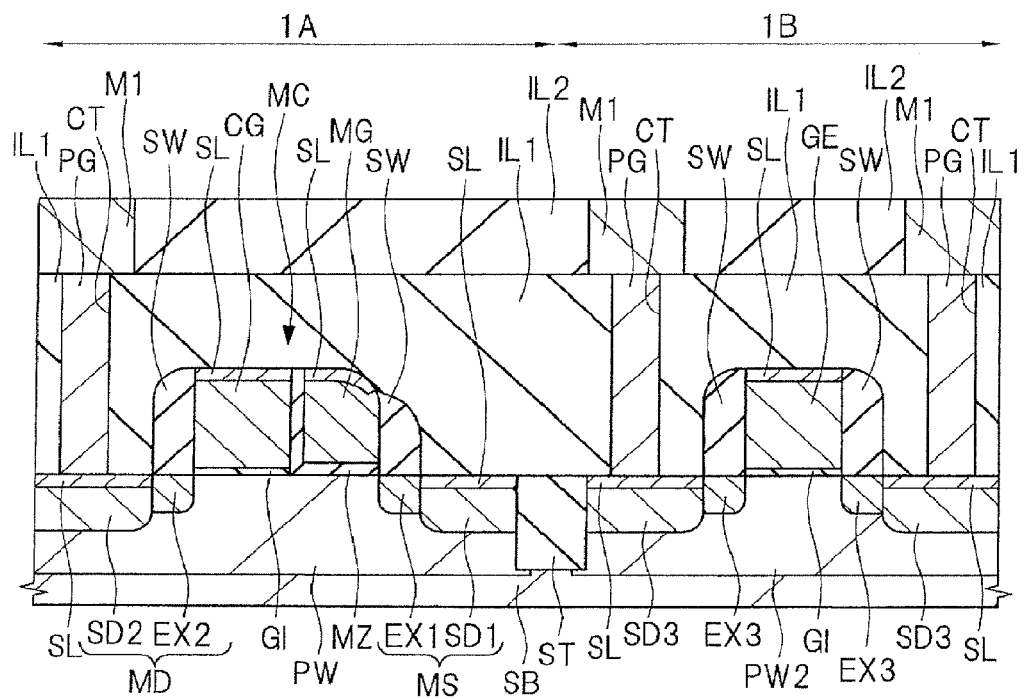
FIG. 32 is a fragmentary cross-sectional view of the semiconductor device during a manufacturing step following that of FIG. 31.

As shown in FIG. 32, an insulating film IL2 is formed on the interlayer insulating film IL1 having the plug PG buried therein. The insulating film IL2 may be formed from a stacked film of a plurality of insulating films. After formation of a wiring trench (trench for wiring) in a predetermined region of the insulating film IL2 by dry etching with a photoresist pattern (not illustrated) as an etching mask, a barrier conductor film is formed on the insulating film IL2 including that on the bottom portion and sidewall of the wiring trench. This barrier conductor film is made of, for example, a titanium nitride film, a tantalum film, or a tantalum nitride film. Then, a copper seed layer is formed on the barrier conductor film by using CVD, sputtering, or the like. Further, a copper plating film is formed on the seed layer by using electroplating or the like to fill the wiring trench with the copper plating film. Then the main conductor film (copper plating film and seed layer) and the barrier conductor film in a region other than the wiring trench are removed using CMP to form a wiring M1 of the first wiring layer having the copper, which has filled the wiring trench, as a main conductive material. To simplify the drawing, FIG. 32 shows the wiring M1 comprised of the barrier conductor layer, seed layer, and copper plating film as one film.

The wiring M1 is electrically coupled to the source region (semiconductor region MS) of the memory transistor, the drain region (semiconductor region MD) of the control transistor, the source and drain regions ($n^+$ type semiconductor regions SD3) of the MISFET of the peripheral circuit region 1B, the control gate electrode CG, the memory gate electrode, MG, the gate electrode GE, or the like via the plug PG. Then, a second wiring layer or a wiring layer thereabove are formed using a dual damascene process or the like. These wirings are neither shown nor described herein. The wiring M1 and a wiring thereabove are not limited to a damascene wiring but can be formed by patterning a conductor film for wiring. They may be, for example, a tungsten wiring or aluminum wiring.

The semiconductor device of the present embodiment is manufactured as described above.

As a modification example of the present embodiment, the stack of the control gate electrode CG and the metal silicide layer SL formed on the control gate electrode CG can be replaced with a stack of the control gate electrode CG and an insulating film formed on the control gate electrode CG. The latter structure can be obtained by forming, upon forming a silicon film PS1 in Step S5 (the step shown in FIG. 11), a stacked film of the silicon film PS1 and an insulating film on the silicon film PS1. In this case, the control gate electrode CG formed in Step S6 (the step shown in FIG. 12) therefore has a stacked structure of the silicon film PS1 and the insulating film on the silicon film PS1. Then, Steps S7 to Steps S11 are carried out to form a memory gate electrode MG adjacent, via the insulating film MZ, to the control gate electrode CG having a stacked structure of the silicon film PS1 and the insulating film on the silicon film PS1.

<Background of Investigation>

Figure 33:
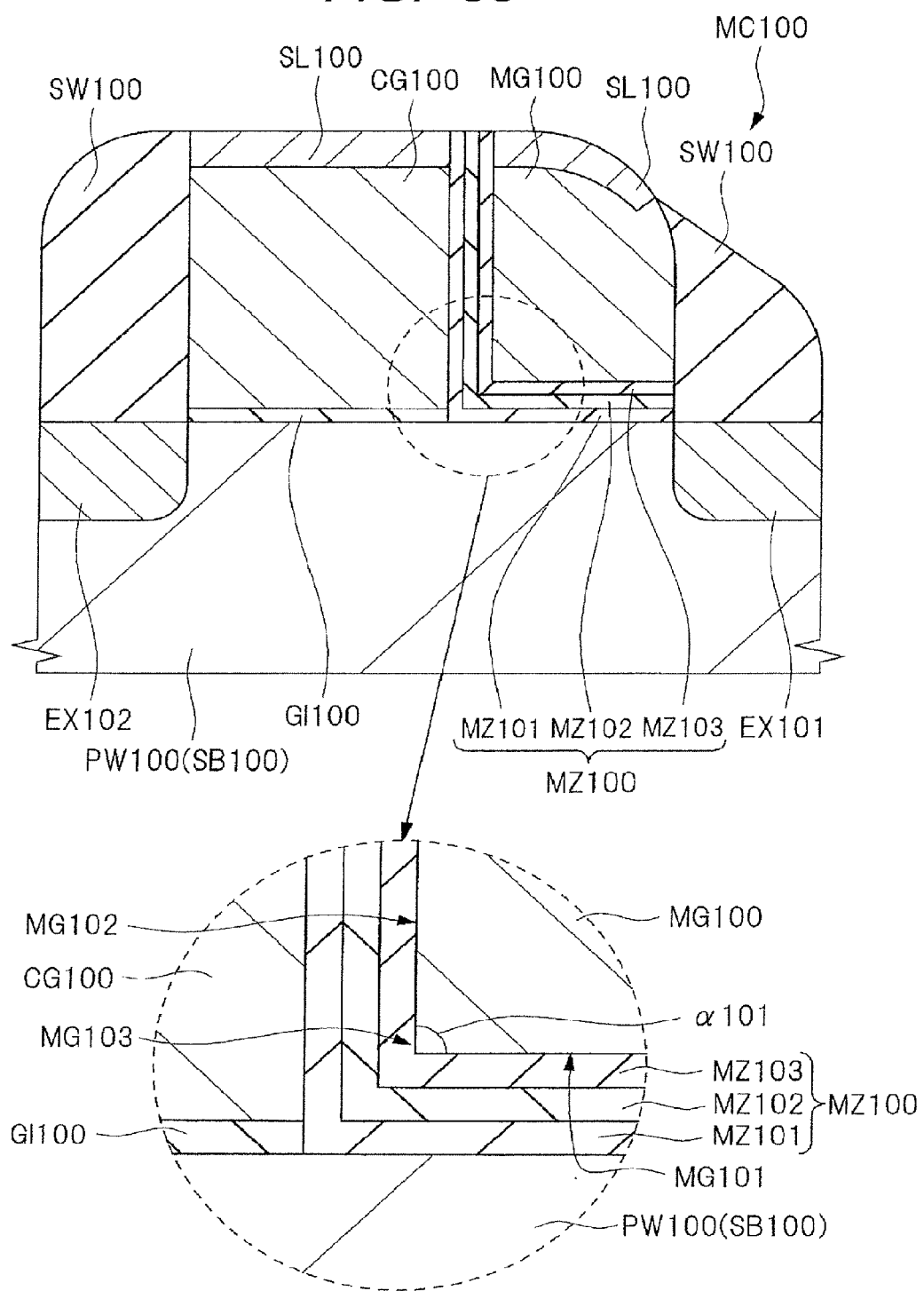
FIG. 33 is a fragmentary cross-sectional view of a semiconductor device of a first investigation example.
Figure 34:
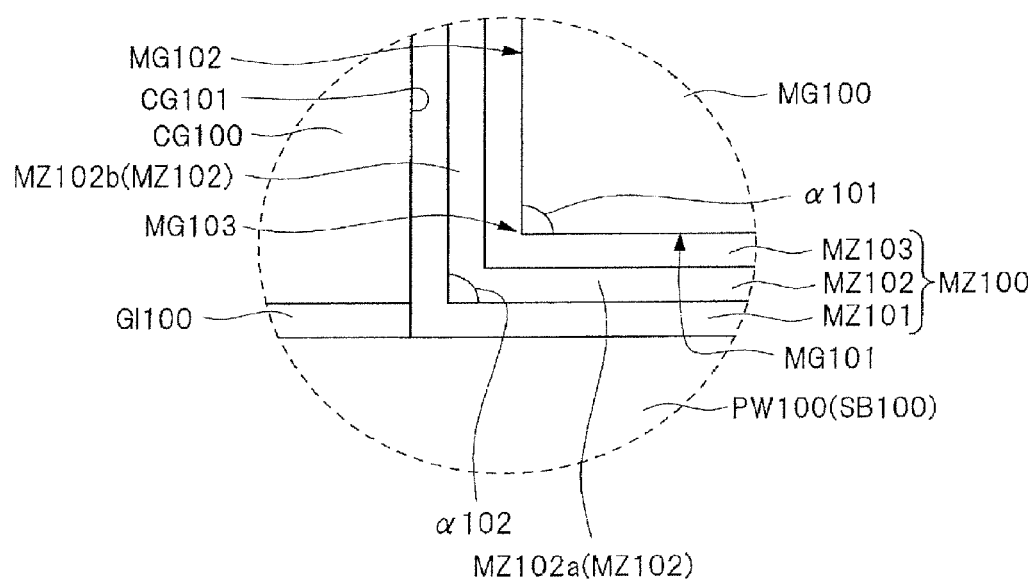
FIG. 34 is a cross-sectional view showing a portion of FIG. 33.

First, a semiconductor device of a first investigation example investigated by the present inventors will be described. FIG. 33 is a fragmentary cross-sectional view of the semiconductor device of the first investigation example investigated by the present inventors and it corresponds to FIG. 2 of the present embodiment. FIG. 33 includes, on the lower side of FIG. 33, an enlarged view of a region enclosed by a dotted circle of FIG. 33. FIG. 34 is a cross-sectional view showing the region enclosed by the dotted circle of FIG. 33 and it corresponds to FIG. 3 of the present embodiment. To facilitate understanding of the drawing, hatching is omitted. The cross-sectional view shown on the lower side of FIG. 33 while being enclosed by a dotted circle and the cross-sectional view shown in FIG. 34 while being enclosed by a dotted circle show the same region, but different in hatching (the region is hatched in FIG. 33 and the region is not hatched in FIG. 34).

The semiconductor device of the first investigation example shown in FIGS. 33 and 34 is a semiconductor device having a memory cell MC100 of a nonvolatile memory. A control gate electrode CG100 and a memory gate electrode MG100 including the nonvolatile memory cell are formed so as to be adjacent to each other on a p well PW100 of a semiconductor substrate SB100. The control gate electrode CG100 and the p well PW100 have therebetween an insulating film GI100 as a gate insulating film. Further, the memory gate electrode MG100 and the p well PW100 and the control gate electrode CG100 and the memory gate electrode MG100 have therebetween an insulating film MZ100 made of a stacked film of an insulating film MZ101, an insulating film MZ102, and an insulating film MZ103. The insulating film MZ101 is made of a silicon oxide film; the insulating film MZ102 is made of a silicon nitride film; and the insulating film MZ103 is made of a silicon oxide film. The insulating film MZ102 is sandwiched between the insulating films MZ101 and MZ103 each functioning as a charge block film and can function as a charge accumulation layer (trap insulating film). The control gate electrode CG100 and the memory gate electrode MG100 are each made of an n type polysilicon film and they have thereon a metal silicide layer SL100. The control gate electrode CG100 and the memory gate electrode MG100 have, on the sidewalls on the sides opposite to a side on which they are adjacent to each other, a sidewall spacer SW100 which is a sidewall insulating film.

The p well PW100 has therein an n type semiconductor region for source including an n⁻ type semiconductor region EX101 and an n type semiconductor region for drain including an n⁻ type semiconductor region EX102.

The memory gate electrode MG100 in the first investigation example shown in FIGS. 33 and 34 corresponds to the memory gate electrode MG of the present embodiment. It is however different from the memory gate electrode MG of the present embodiment and in the memory gate electrode MG100 in the first investigation example, an inner angle α101 of a corner portion MG103 of the memory gate electrode MG100 between a lower surface MG101 of the memory gate electrode MG100 and a side surface MG102 of the memory gate electrode MG100 is a right angle, that is, 900 (α101=90°). In other words, the lower surface MG101 of the memory gate electrode MG and the side surface MG102 of the memory gate electrode MG100 include the corner portion MG103 having a right angle in a cross-sectional view (cross-sectional view of the memory gate electrode MG100).

The lower surface MG101 of the memory gate electrode MG100 is a surface on a side facing to the semiconductor substrate SB100 and the side surface MG102 of the memory gate electrode MG100 is a surface on a side facing to the control gate electrode CG100. The memory gate electrode MG100 in a cross-sectional view corresponds to that when viewed in a cross-section substantially perpendicular to both the lower surface MG101 and the side surface 102 of the memory gate electrode MG100. The memory gate electrode MG100 in a cross-sectional view not only corresponds to that when viewed in a cross-section perpendicular to a gate width direction of the memory gate electrode MG100 but also to that when viewed in a cross-section perpendicular to a gate width direction of the control gate electrode CG100.

When an erase operation is performed by injecting holes from the memory gate electrode MG100 to a charge accumulation layer (meaning the insulating film MZ102) of the insulating film MZ100, erase characteristics can be improved further by decreasing the thickness of the insulating film MZ103 in the insulating film MZ100. For example, decreasing the thickness of the insulating film MZ103 in the insulating film MZ100 facilitates penetration of holes from the memory gate electrode MG100 through the insulating film MZ103 of the insulating film MZ100 by tunneling and injection of the holes into a charge accumulation layer (meaning the insulating film MZ102) of the insulating film MZ100. This leads to an increase in an erase rate. Decreasing the thickness of the insulating film MZ103 in the insulating film MZ100 however increases a probability of generating a phenomenon in which charges retained by the charge accumulation layer (meaning the insulating film MZ102) of the insulating film MZ100 penetrate through the insulating film MZ103 and drop out to the side of the memory gate electrode MG100. This therefore acts to deteriorate the retention characteristics (charge retention characteristics). Increasing the thickness of the insulating film MZ103 in the insulating film MZ100, on the other hand, improves the retention characteristics but acts to deteriorate the erase characteristics. Deterioration in erase characteristics and deterioration in retention characteristics each inevitably lead to deterioration in the performance of a semiconductor device having a nonvolatile memory.

A write operation of a memory cell is achieved by injecting electrons in the accumulation layer (meaning the insulating film MZ102) of the insulating film MZ100 and an erase operation of a memory cell is achieved by injecting holes in the charge accumulation layer (the insulating film MZ102) of the insulating film MZ100. When in the charge accumulation layer (meaning the insulating film MZ102) of the insulating film MZ100, there is a distance between a position where electrons are injected upon write operation and a position where holes are injected upon erase operation, a threshold voltage of the memory transistor after the erase operation is likely to vary. This inevitably leads to deterioration in the performance of a semiconductor device having a nonvolatile memory.

<Major Characteristics and Advantages>

The major characteristics and advantages of the present embodiment will next be described.

The semiconductor device of the present embodiment is a semiconductor device equipped with a memory cell MC of a nonvolatile memory. It has a semiconductor substrate SB, a control gate electrode CG (first gate electrode) formed on the semiconductor substrate SB via an insulating film GI (first gate insulating film), and a memory gate electrode MG (second gate electrode) formed on the semiconductor substrate SB via an insulating film MZ and adjacent to the control gate electrode CG via the insulating film MZ. The insulating film MZ is a stacked insulating film and has an insulating film MZ1 (first insulating film), an insulating film MZ2 (second insulating film) on the insulating film MZ1, and an insulating film MZ3 (third insulating film) on the insulating film MZ2. The insulating film MZ extends over between the semiconductor substrate SB and the memory gate electrode MG and between the control gate electrode CG and the memory gate electrode MG. The insulating film MZ2 is an insulating film having a charge accumulation function and the band gap of each of the insulating film MZ1 and the insulating film MZ3 is greater than the band gap of the insulating film MZ2.

The first characteristic, which is one of the major characteristics, of the semiconductor device of the present embodiment is that as shown in FIGS. 2 and 3, an inner angle (angle) $\alpha 1$ of a corner portion MG3 (first corner portion) of the memory gate electrode MG formed by a lower surface MG1 (first surface) of the memory gate electrode MG and a side surface MG2 (second surface) of the memory gate electrode MG is less than 90° (meaning $\alpha 1 < 90°$). In other words, the lower surface MG1 of the memory gate electrode MG and the side surface MG2 of the memory gate electrode MG form the corner portion MG3 having an angle less than 90° in a cross-sectional view (cross-sectional view of the memory gate electrode MG). This means that the corner portion MG3 of the memory gate electrode MG has an angle more acute than a right angle, that is, an angle less than 90°, that is, an acute angle. Therefore, the angle between the lower surface MG1 of the memory gate electrode MG and the side surface MG2 of the memory gate electrode MG is less than 90°. The corner portion MG3 of the memory gate electrode MG can also be regarded as an end portion (corner portion) of the lower surface MG1 of the memory gate electrode MG on the side of the control gate. The first characteristic therefore also means that the lower surface MG1 of the memory gate electrode MG has, at an end portion (meaning the corner portion MG3) on the side of the control gate, an angle less than 90°, that is, an acute angle.

In this structure, the lower surface MG1 of the memory gate electrode MG is a surface (first surface) on the side facing to the semiconductor substrate SB and the side surface MG2 of the memory gate electrode MG is a surface (second surface) on the side facing to the control gate electrode CG. The term "cross-sectional view" (cross-sectional view of the memory gate electrode MG) means a view when viewed in a cross-section substantially perpendicular to both the lower surface MG1 and the side surface MG2 of the memory gate electrode MG. The cross-sectional view of the memory gate electrode MG is therefore a view when viewed in a cross-section perpendicular to the gate width direction (meaning the extending direction of the memory gate electrode MG) of the memory gate electrode MG and also a view when viewed in a cross-section perpendicular to the gate width direction (meaning the extending direction of the control gate electrode CG) of the control gate electrode CG. Further, the cross-sectional view of the memory gate electrode MG means also a view when viewed in a cross-section perpendicular to the main surface of the semiconductor substrate SB and at the same time, parallel to the gate length direction of the memory gate electrode MG. The cross-section of the memory gate electrode MG shown in FIGS. 1 to 3 corresponds to a cross-sectional view of the memory gate electrode MG. Not only the inner angle $\alpha 1$ but also an angle $\alpha 2$, an angle $\alpha 3$, and an angle $\alpha 4$ which will be described later correspond to the angles in this cross-sectional view (cross-sectional view of the memory gate electrode MG).

In the present embodiment, the corner portion MG3 of the memory gate electrode MG has an angle more acute than a right angle, that is, an acute angle so that application of a voltage (voltage for erasing) to the memory gate electrode MG upon erase operation inevitably causes electric field concentration to the acute corner portion MG3 of the memory gate electrode MG. Upon erase operation, charges (meaning holes) can be injected in a concentrated manner into the charge accumulation layer (meaning the insulating film MZ2) of the insulating film MZ from the acute corner portion MG3 of the memory gate electrode MG at which electric field has concentrated. This makes it possible to make the position of the charge accumulation layer (meaning the insulating film MZ2) of the insulating film MZ into which charges (meaning electrons) are injected upon write operation substantially the same as the position of the charge accumulation layer into which charges (meaning holes) are injected upon erase operation. Variations in threshold voltage of the memory transistor after erase operation can therefore be prevented. For example, since the position of the charge accumulation layer of the insulating film MZ into which electrons are injected upon write operation can be made substantially the same as the position of the charge accumulation layer into which holes are injected upon erase operation, charges (electrons) which have remained in the charge accumulation layer (insulating film MZ2) of the insulating film MZ without being erased decrease, making it possible to suppress or prevent variations in the threshold voltage of the memory transistor due to charges (electrons) which have remained without being erased. As a result, the semiconductor device having a nonvolatile memory thus obtained can have improved reliability and further improved performance. This will hereinafter be described more specifically referring to FIGS. 35 and 36.

Figure 35:
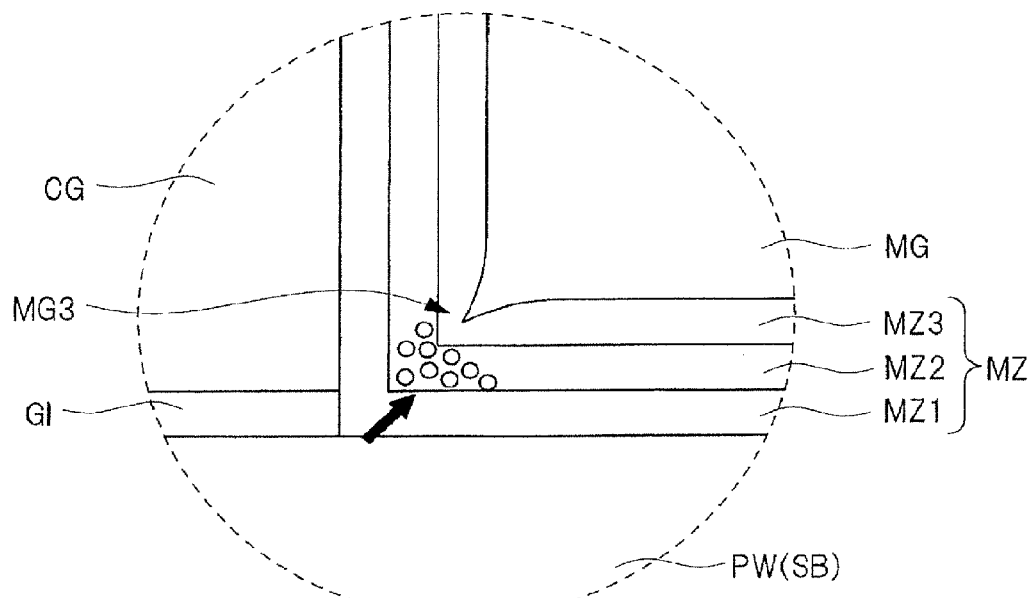
FIG. 35 is an explanatory view showing electrons being injected into a charge accumulation layer upon write operation.
Figure 36:
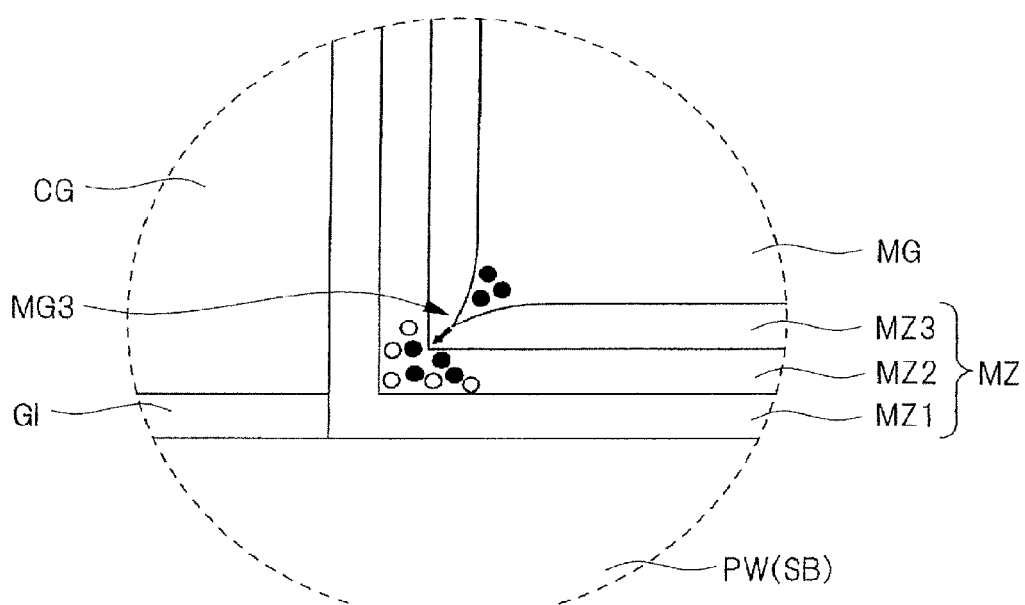
FIG. 36 is an explanatory view showing electrons being injected into a charge accumulation layer upon erase operation.

FIG. 35 is an explanatory view showing injection of electrons into the charge accumulation layer (meaning the insulating film MZ2) of the insulating film MZ upon write operation. FIG. 36 is an explanatory view showing injection of holes into the charge accumulation layer (meaning the insulating film MZ2) of the insulating film MZ upon erase operation. FIGS. 35 and 36 are each a cross-sectional view showing a region similar to that of FIG. 3 and to facilitate understanding of the drawing, hatching is omitted. FIGS. 35 and 36 schematically show an electron with a blank circle and a hole with a solid circle.

In the present embodiment, charges are injected from the semiconductor substrate SB into the insulating film MZ2 of the insulating film MZ to write data to a selected memory cell and charges are injected from the memory gate electrode MG to the insulating film MZ2 of the insulating film MZ to erase data in the selected memory cell. The charges injected into the insulating film MZ2 of the insulating film MZ upon writing and the charges injected into the insulating film MZ2 of the insulating film MZ upon erasing are opposite in polarity. Described specifically, upon writing, charges of a first polarity are injected from the semiconductor substrate SB into the insulating film MZ2 of the insulating film MZ and upon erasing, charges of a second polarity opposite to the first polarity are injected from the memory gate electrode MG into the insulating film MZ2 of the insulating film MZ. Charges injected into the insulating film MZ2 of the insulating film MZ upon writing are electrons, meaning that the charges of the first polarity are electrons. Charges injected into the insulating film MZ2 of the insulating film MZ upon erasing are holes, meaning that the charges of the second polarity are holes. Upon writing, charges (meaning electrons) of the first polarity are injected to the insulating film MZ (insulating film MZ2 thereof) on the side of the control gate electrode CG by source side injection.

In the present embodiment, the angle of the corner portion MG3 of the memory gate electrode MG is more acute than a right angle, that is, an acute angle so that application of a voltage for erasing upon erase operation, electric field concentration occurs at the acute corner portion MG3 of the memory gate electrode MG. As shown in FIG. 36, this facilitates injection of holes from the corner portion MG3 of the memory gate electrode MG where electric field concentration has occurred into the insulating film MZ2 serving as a charge accumulation layer of the insulating film MZ. In other words, upon erase operation, this facilitates injection of holes from the acute corner portion MG3 of the memory gate electrode MG after passing through the insulating film MZ3 of the insulating film MZ by tunneling. In short, upon erase operation, holes are likely to be injected concentratedly into the position of the insulating film MZ2 of the insulating film MZ near the acute corner portion MG3 of the memory gate electrode MG. The distribution of holes injected upon erase operation in the charge accumulation layer (meaning the insulating film MZ2) of the insulating film MZ becomes relatively large at a position near the acute corner portion MG3 of the memory gate electrode MG. Therefore, the injection position of holes in the insulating film MZ2 of the insulating film MZ upon erase operation is near the acute corner portion MG3 of the memory electrode MG.

On the other hand, the injection position of electrons in the insulating film MZ2 serving as a charge accumulation of the insulating film MZ upon write operation is also near the acute corner portion MG3 of the memory electrode MG. This occurs because in SSI (source side injection) system writing, as shown in FIG. 35, hot electrons are generated in a channel region (substrate region) below a region between the memory gate electrode MG and the control gate electrode CG and these hot electrons are injected into the insulating film MZ2 serving as a charge accumulation layer of the insulating film MZ. In the SSI system writing, electrons are easily injected into a position near the end portion (that is, an end portion on the side of the control gate electrode CG), on the side of the semiconductor region MD, of the charge accumulation layer (meaning the insulating film MZ2) of the insulating film MZ extending along the semiconductor substrate SB.

The acute corner portion MG3 of the memory gate electrode MG corresponds to an end portion of the lower surface MG1 of the memory gate electrode MG on the side of the control gate so that it corresponds to an end portion of the lower surface MG1 of the memory gate electrode MG on the side of the semiconductor region MD. Upon erase operation, if holes can be injected concentratedly in the charge accumulation layer (meaning the insulating film MZ2) of the insulating film MZ from the corner portion MG3 of the memory gate electrode MG, the position of the insulating film MZ into which electrons are injected upon write operation can be made substantially equal to that into which holes are injected upon erase operation.

In the present embodiment, by making the angle of the corner portion MG3 of the memory gate electrode MG more acute than a right angle, that is, making it acute, electric field concentration is likely to occur at the corner portion MG3 of the memory gate electrode MG particularly upon erase operation. This facilitates concentrated injection of holes, which has passed through the insulating film MZ3 of the insulating film Mz from the acute corner portion MG3 of the memory gate electrode MG by tunneling, into the charge accumulation layer (meaning the insulating film MZ2) of the insulating film MZ. As shown in FIGS. 35 and 36, in the present embodiment, the position of the charge accumulation layer (meaning the insulating film MZ2) of the insulating film MZ into which electrons are injected upon write operation can be made substantially equal to that into which holes are injected upon erase operation.

When in the charge accumulation (meaning the insulating film MZ2) layer of the insulating film MZ, there is a distance between the position into which electrons are injected upon write operation and the position into which holes are injected upon erase operation, charges (electrons) remain in the charge accumulation layer (meaning the insulating film MZ2) of the insulating film MZ without being erased after erase operation and these remaining charges (electrons) may cause variations in threshold voltage of the memory transistor.

In the present embodiment, on the other hand, since the position of the charge accumulation layer (meaning the insulating film MZ2) of the insulating film MZ into which electrons are injected upon write operation can be made substantially equal to that into which holes are injected upon erase operation. The electrons injected into the charge accumulation layer (meaning the insulating film MZ2) of the insulating film MZ upon write operation can be easily erased with the holes injected into the charge accumulation layer (meaning the insulating film MZ2) of the insulating film MZ upon erases operation. This suppresses remaining of the charges (electrons) in the charge accumulation layer (meaning the insulating film MZ2) of the insulating film MZ after erase operation, thereby preventing variations in threshold voltage of the memory transistor due to charges (electrons) which have remained without being erased. As a result, the semiconductor device having a nonvolatile memory thus obtained has improved reliability and further has improved performance.

The second characteristic, which is the other major characteristic of the semiconductor device of the present embodiment, is that as shown above in FIGS. 2 and 3, the angle $\alpha 2$ between the portion MZ2$a$ of the insulating film MZ2 extending between the semiconductor substrate SB and the memory gate electrode MG and the portion MZ2$b$ of the insulating film MZ2 between the control gate electrode CG and the memory gate electrode MG is 90° or greater ($\alpha 2 \geq 90°$).

To facilitate understanding of the meaning of this second characteristic, it will be described referring to FIG. 37, while using a second investigation example investigated by the present inventors.

Figure 37:
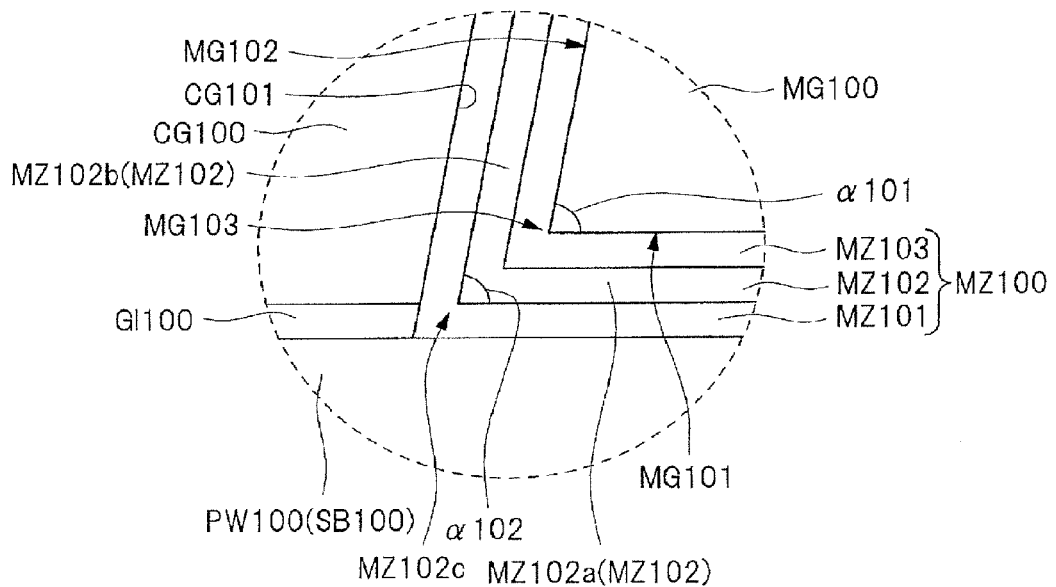
FIG. 37 is a fragmentary cross-sectional view of a semiconductor device of a second investigation example.

FIG. 37 is a fragmentary cross-sectional view of a semiconductor device of the second investigation example investigated by the present inventors. It corresponds to FIG. 34 of the first investigation example. Similar to FIG. 34, FIG. 37 is a cross-sectional view and to facilitate understanding, hatching is omitted in this drawing.

In the first investigation example shown in FIGS. 33 and 34, the inner angle α101 of the corner portion MG103 of the memory gate electrode MG100 formed between the lower surface MG101 of the memory gate electrode MG100 and the side surface MG102 of the memory gate electrode MG100 is a right angle, that is, 90° (α101=90°). In the second investigation example shown in FIG. 37, on the other hand, the inner angle α101 of the corner portion MG103 of the memory gate electrode MG100 formed between the lower surface MG101 of the memory gate electrode MG100 and the side surface MG102 of the memory gate electrode MG100 is less than 90° (α101<90°). In short, the corner portion MG103 of the memory gate electrode MG100 has an acute angle.

In the first investigation example shown in FIG. 34, the side surface CG101 of the control gate electrode CG is substantially perpendicular to the main surface of the semiconductor substrate SB. In the second investigation example shown in FIG. 37, on the other hand, the side surface CG101 of the control gate electrode CG10 is inclined so as to have a reverse tapered shape to make the angle acute at the corner portion MG103 of the memory gate electrode MG100. The term "side surface CG101 of the control gate electrode" as used herein means a side surface (sidewall) of the control gate electrode on the side facing to the memory gate electrode MG100.

In the second investigation example shown in FIG. 37, the angle of the corner portion MG103 of the memory gate electrode MG100 is more acute than a right angle, that is, an acute angle so that application of a voltage to the memory gate electrode MG100 upon erase operation causes electric field concentration to the acute corner portion MG103 of the memory gate electrode MG100. In the second investigation example shown in FIG. 37 compared with the first investigation example of FIG. 34, therefore, holes can be injected more easily, upon erase operation, into the charge accumulation layer (meaning the insulating film MZ102) of the insulating film MZ100 from the acute corner portion MG103 of the memory gate electrode MG100 at which electric field concentration has occurred.

In the second investigation example shown in FIG. 37, however, the angle α102 formed between a portion MZ102a of the insulating film MZ102 between the semiconductor substrate SB 100 and the memory gate electrode MG100 and a portion MZ102b of the insulating film MZ102 extending between the control gate electrode CG100 and the memory gate electrode MG100 is less than 90° (α102<90°). In the first investigation example shown in FIG. 34, this angle α102 is 90° (α102=90°).

The second investigation example shown in FIG. 37 has the following problems compared with the first investigation example shown in FIG. 34.

Upon writing, electrons are injected from a channel region and retained in the vicinity of a corner portion MZ102c formed by the insulating film MZ102, more specifically, formed by a portion (MZ102a) of the insulating film MZ102 extending between the semiconductor substrate SB 100 and the memory gate electrode MG100 and a portion (MZ102b) of the insulating film MZ102 extending between the control gate electrode CG100 and the memory gate electrode MG100. Upon erase operation, on the other hand, holes are injected from the corner portion MG103 of the memory gate electrode MG100 to the vicinity of the corner portion MZ102c of the insulating film MZ102. In the second investigation example shown in FIG. 37, however, since the angle α102<90°, electric field concentration to the corner portion MZ102c of the insulating film MZ102 is likely to occur upon erase operation and an electron injection phenomenon to the vicinity of the corner portion MZ102c of the insulating film MZ102 from the channel region easily occurs. Upon erase operation, when electrons are injected from the channel region (the semiconductor substrate SB100) to the insulating film MZ102 disturbs an erase operation. It is therefore desirable to prevent, upon erase operation, the electron injection phenomenon from the channel region (semiconductor substrate SB100) to the insulating film MZ102 as much as possible.

Compared with the first investigation example shown in FIG. 34, the second investigation example of FIG. 37 is advantageous in that holes can be injected concentratedly into the insulating film MZ102 from the acute corner portion MG103 of the memory gate electrode MG100 upon erase operation, but it inevitably has the problem that upon erase operation, an electron injection phenomenon into the insulating film MZ102 from the channel region (semiconductor substrate SB 100) is likely to occur upon erase operation.

In the case of the second investigation example shown in FIG. 37 wherein α102<90°, the thickness of the insulating film MZ102 tends to decrease partially in the vicinity of the corner portion MZ102c. Since upon writing, electrons are injected mainly into a region of the insulating film MZ102 in the vicinity of the corner portion MZ102c, a partial decrease in the thickness of the insulating film MZ102 in the vicinity of the corner portion MZ102c may lead to a reduction in an amount of charges which can be accumulated in the charge accumulation layer (meaning the insulating film MZ102). An increase in the entirety of the insulating film MZ102, on the other hand, requires a high operating voltage of the memory cell, causing an increase in power consumption. In addition, in the case of the second investigation example shown in FIG. 37 wherein α102<90°, the quality of the insulating film MZ102 in the vicinity of the corner portion MZ102c is likely to deteriorate. These are also the problems of the second investigation example shown in FIG. 37.

On the other hand, as the second characteristic in the present embodiment, the angle α2 formed between the portion (MZ2a) of the insulating film MZ2 extending between the semiconductor substrate SB and the memory gate electrode MG and the portion (MZ2b) of the insulating film MZ2 extending between the control gate electrode CG and the memory gate electrode MG is 90° or greater (α2≥90°). Since the angle is set at α2≥90°, the present embodiment is also free from the above-mentioned problem of the second investigation example shown in FIG. 37.

Described specifically, upon writing, electrons are injected from the channel region (the semiconductor substrate SB) and retained in the vicinity of the corner portion MZ2c formed by the insulating film MZ2, more specifically, formed by a portion (MZ102a) of the insulating film MZ2 extending between the semiconductor substrate SB and the memory gate electrode MG and a portion (MZ2b) of the insulating film MZ2 extending between the control gate electrode CG and the memory gate electrode MG. Upon erase operation, on the other hand, holes are injected from the corner portion MG3 of the memory gate electrode MG to the vicinity of the corner portion MZ2c of the insulating film MZ2. In the present embodiment, since the angle is set at α2≥90°, electric field concentration to the corner portion MZ2c of the insulating film MZ2 can be relaxed and an electron injection phenomenon that may otherwise occur from the channel region (semiconductor substrate SB) to the vicinity of the corner portion MZ2c of the insulating film MZ2 can be suppressed or prevented. Upon erase operation, injection of electrons from the channel region (the semiconductor substrate SB) to the insulating film MZ2 disturbs progress of the erase operation. The present embodiment can prevent this so that the erase operation can be carried out more adequately. The semiconductor device having a nonvolatile memory thus obtained can therefore have improved performance.

In the present embodiment, the angle is set at $\alpha 2 \geq 90°$ so that the phenomenon that the thickness of the insulating film MZ2 decreases partially in the vicinity of the corner portion MZ2c can be suppressed or prevented. This facilitates securement of an amount of charges that can be accumulated in the charge accumulation layer (meaning the insulating film MZ2). Since the amount of charges that can be accumulated in the charge accumulation layer (meaning the insulating film MZ2) can be secured easily, formation of the insulating film M with a large thickness is not necessary. This eliminates the need for increasing the operating voltage of the memory cell, leading to reduction in power consumption. As a result, the semiconductor device thus obtained can have improved performance. In addition, in the present embodiment, since the angle is set at $\alpha 2 \geq 90°$, deterioration in the quality of the insulating film MZ2 in the vicinity of the corner portion MZ2c can be suppressed or prevented. As a result, the semiconductor device thus obtained can have improved reliability and further, improved performance.

As in the present embodiment, it is highly important to satisfy both the first characteristic and the second characteristic in order to improve the performance of a semiconductor device having a nonvolatile memory. The present embodiment can provide a semiconductor device having excellent performance by satisfying both the first characteristic and the second characteristic.

FIG. 38 is a cross-sectional view showing a first modification example of the semiconductor device of the present embodiment and it corresponds to FIG. 3. FIG. 38 shows a cross-sectional region similar to that of FIG. 3 and similar to FIG. 3, hatching is omitted in spite that it is a cross-sectional view.

Similar to the semiconductor device shown in FIGS. 1 to 3, the first modification example of FIG. 38 also satisfies the first characteristic so that an overlapping description is omitted.

Both the first modification example shown in FIG. 38 and the semiconductor device shown above in FIGS. 1 to 3 satisfy the second characteristic, but the angle is set at $\alpha 2 = 90°$ in the semiconductor device shown in FIGS. 1 to 3, while the angle is set at $\alpha 2 > 90°$ in the first modification example shown in FIG. 38. This is a main difference between the first modification example shown in FIG. 38 and the semiconductor device shown in FIGS. 1 to 3.

In the semiconductor device shown in FIGS. 1 to 3, the angle $\alpha 2$ formed between the portion (MZ2a) of the insulating film MZ2 extending between the semiconductor substrate SB and the memory gate electrode MG and the portion (MZ2b) of the insulating film MZ2 extending between the control gate electrode CG and the memory gate electrode MG is a right angle, that is, 90° ($\alpha 2 = 90°$). Further, in the semiconductor device shown in FIGS. 1 to 3, also the angle $\alpha 3$ formed between a portion of the insulating film MZ1 extending between the semiconductor substrate SB and the memory gate electrode MG and a portion of the insulating film MZ1 extending between the control gate electrode CG and the memory gate electrode MG is a right angle, that is, 90° ($\alpha 3 = 90°$). Still further, in the semiconductor device shown in FIGS. 1 to 3, the angle $\alpha 4$ formed between a portion of the insulating film MZ3 extending between the semiconductor substrate SB and the memory gate electrode MG and a portion of the insulating film MZ3 extending between the control gate electrode CG and the memory gate electrode MG is a right angle, that is, 90° ($\alpha 4 = 90°$). In the semiconductor device shown in FIGS. 1 to 3, the side surface (sidewall) CG1 of the control gate electrode CG on the side adjacent to the memory gate electrode MG via the insulating film MZ is substantially perpendicular to the main surface of the semiconductor substrate SB.

In the first modification example shown in FIG. 38, on the other hand, the angle $\alpha 2$ formed between the portion (MZ2a) of the insulating film MZ2 extending between the semiconductor substrate SB and the memory gate electrode MG and a portion (MZ2b) of the insulating film MZ2 extending between the control gate electrode CG and the memory gate electrode MG is an obtuse angle, that is, an angle greater than 90° ($\alpha 2 > 90°$). Further, in the first modification example shown in FIG. 38, also the angle $\alpha 3$ formed between the portion of the insulating film MZ1 extending between the semiconductor substrate SB and the memory gate electrode MG and the portion of the insulating film MZ1 extending between the control gate electrode CG and the memory gate electrode MG is an obtuse angle, that is, an angle greater than 90° ($\alpha 3 > 90°$). Still further, in the first modification example shown in FIG. 38, the angle $\alpha 4$ formed between the portion of the insulating film MZ3 extending between the semiconductor substrate SB and the memory gate electrode MG and the portion of the insulating film MZ3 extending between the control gate electrode CG and the memory gate electrode MG is also an obtuse angle, that is, an angle greater than 90° ($\alpha 4 > 90°$). In the first modification example shown in FIG. 38, the side surface (sidewall) CG1 of the control gate electrode CG on the side adjacent to the memory gate electrode MG via the insulating film MZ is inclined at a predetermined angle from the perpendicular with respect to the main surface of the semiconductor substrate. The side surface is inclined in a direction to taper the cross-sectional shape (cross-sectional shape perpendicular to the gate width direction of the control gate electrode CG) of the control gate electrode CG. The dimension (dimension in the gate length direction) of the control gate electrode CG becomes greater from the upper side to the lower side of the control gate electrode CG.

In the first modification example shown in FIG. 38, the angle $\alpha 2$ is an obtuse angle ($\alpha 2 > 90°$) so that upon erase operation, electric field concentration to the corner portion MZ2c of the insulating film MZ2 can be relaxed more adequately and an electron injection phenomenon from the channel region (semiconductor substrate SB) into the vicinity of the corner portion MZ2c of the insulating film MZ2 can be suppressed or prevented more adequately. In the first modification example shown in FIG. 38, the angle $\alpha 2$ is an obtuse angle ($\alpha 2 > 90°$) so that a partially thinning phenomenon of the insulating film MZ2 in the vicinity of the corner portion MZ2c can be suppressed or prevented more adequately. Further, in the first modification example shown in FIG. 38, the angle $\alpha 2$ is an obtuse angle ($\alpha 2 > 90°$) so that deterioration in the quality of the insulating film MZ2 in the vicinity of the corner portion MZ2c can be suppressed or prevented more adequately.

The semiconductor device shown in FIGS. 1 to 3, on the other hand, is advantageous that the corner portion MG3 of the memory gate electrode MG can have an acute angle easily. This means that as shown in FIG. 17, the insulating film MZ3 having a partially small thickness at the corner portion KD can be formed easily, which facilitates formation of the corner portion MG3 of the memory gate electrode MG having an acute angle.

FIG. 39 is a cross-sectional view showing a second modification example of the semiconductor device of the present embodiment and FIG. 40 is a cross-sectional view showing a third modification example of the semiconductor device of the present embodiment. These drawings each correspond to FIG. 3. FIGS. 39 and 40 show the cross-sectional region same as that of FIG. 3 and similar to FIG. 3, hatching is omitted in spite that they are cross-sectional views.

The second modification example shown in FIG. 39 is a modification example of the semiconductor device shown in FIGS. 1 to 3 and the third modification example shown in FIG. 40 is a further modification example of the first modification example shown in FIG. 38.

A difference between the second modification example shown in FIG. 39 and the semiconductor device shown in FIGS. 1 to 3 and a difference between the third modification example shown in FIG. 40 and the first modification example shown in FIG. 38 are mainly that the insulating film MZ2 in the second modification example shown in FIG. 39 and the third modification example shown in FIG. 40 have a rounded (round) corner portion MZ2c. For example, when the semiconductor substrate SB in a region adjacent to the control gate electrode is overetched to retreat the substrate surface by etching upon formation of the control gate electrode CG in Step S6 or another etching, an oxidation step performed thereafter rounds the corner portion MZ1c of the insulating film MZ1. As a result, the insulating film MZ2 is likely to have the round corner portion MZ2c.

The term "the corner portion MZ1c of the insulating film MZ1" as used herein means the corner portion MZ1c formed by the insulating film MZ1, more specifically, formed by a portion of the insulating film MZ1 extending between the semiconductor substrate SB and the memory gate electrode MG and a portion of the insulating film MZ1 extending between the control gate electrode CG and the memory gate electrode MG. Further, the term "corner portion MZ2c of the insulating film MZ2" means, as described above, the corner portion MZ2c of the insulating film MZ2 formed by the insulating film MZ2, more specifically, formed by the portion (MZ2a) of the insulating film MZ2 extending between the semiconductor substrate SB and the memory gate electrode MG and the portion (MZ2b) of the insulating film MZ2 extending between the control gate electrode CG and the memory gate electrode MG.

Even the semiconductor device of the second modification example shown in FIG. 39 can produce, when it satisfies the above-mentioned first characteristic and the second characteristic, an advantage substantially similar to that of the semiconductor device shown in FIGS. 1 to 3. Even the semiconductor device of the third modification example shown in FIG. 40 can produce, when it satisfies the above-mentioned first characteristic and the second characteristic, an advantage substantially similar to that of the semiconductor device of the first modification example shown in FIG. 38.

There is no difference in how to define the angle α2 here irrespective of whether the corner portion MZ2c of the insulating film MZ2 is round or not round. This means that the angle α2 is an angle formed between the portion (MZ2a) of the insulating film MZ2 extending between the semiconductor substrate SB and the memory gate electrode MG and the portion (MZ2b) of the insulating film MZ2 extending between the control gate electrode CG and the memory gate electrode MG. For example, when the portion (MZ2b) of the insulating film MZ2 extending between the control gate electrode CG and the memory gate electrode MG is perpendicular to the portion (MZ2a) of the insulating film MZ2 extending between the semiconductor substrate SB and the memory gate electrode MG, the angle α2 is a right angle, that is, 90°, irrespective of whether the corner portion MZ2c of the insulating film MZ2 is round or not round. When the portion (MZ2b) of the insulating film MZ2 extending between the control gate electrode CG and the memory gate electrode MG is inclined at an angle of 100° with respect to the portion (MZ2a) of the insulating film MZ2 extending between the semiconductor substrate SB and the memory gate electrode MG, the angle α2 is 100°, that is, an obtuse angle irrespective of whether the corner portion MZ2c of the insulating film MZ2 is round or not round. Therefore, the angle α2 can be defined by the inclination degree of the portion (MZ2b) of the insulating film MZ2 extending between the control gate electrode CG and the memory gate electrode MG with respect to the portion (MZ2a) of the insulating film MZ2 extending between the semiconductor substrate SB and the memory gate electrode MG.

In the semiconductor device shown in FIG. 3, the corner portion MZ2c of the insulating film MZ2 is almost not round. In the semiconductor device shown in FIG. 39, on the other hand, the corner portion MZ2c of the insulating film MZ2 is round. In either the semiconductor device shown in FIG. 3 or that shown in FIG. 39, the angle α2 is 90° (α2=90°), suggesting that these semiconductor devices satisfy the second characteristic. In the semiconductor device shown in FIG. 38, the corner portion MZ2c of the insulating film MZ2 is almost not round, while in the semiconductor device shown in FIG. 40, the corner portion MZ2c of the insulating film MZ2 is round. In either the semiconductor device shown in FIG. 38 or that shown in FIG. 40, the angle α2 is greater than 90° (α2>90°), suggesting that these devices satisfy the second characteristic.

The insulating film MZ3 of the insulating film MZ has preferably the following film thickness relationship, which is common to the semiconductor device shown in FIGS. 1 to 3, the first modification example shown in FIG. 38, the second modification example shown in FIG. 39, and the third modification example shown in FIG. 40.

As the first film thickness relationship, the thickness T1 (first thickness) of the insulating film MZ3 at a position contiguous (adjacent) to the corner portion MG3 of the memory gate electrode MG is smaller than the thickness T2 (second thickness) of the portion of the insulating film MZ3 extending between the semiconductor substrate SB and the memory gate electrode MG (T1<T2). As the second film thickness relationship, the thickness T1 (first thickness) of the insulating film MZ3 at a position contiguous (adjacent) to the corner portion MG3 of the memory gate electrode MG is smaller than the thickness T3 (third thickness) of the portion of the insulating film MZ3 extending between the control gate electrode CG and the memory gate electrode MG (T1<T3).

The thickness T1, thickness T2, and thickness T3 are shown in FIG. 3. None of the reference numerals T1, T2, and T3 is shown in FIGS. 38 to 40, but the positions represented by the thickness T1, thickness T2, and thickness T3 respectively in FIGS. 38 to 40 are similar to those shown in FIG. 3.

The thickness T1, the thickness T2, and the thickness T3 are, each a thickness (film thickness) of the insulating film MZ3 but they are different in a region where the thickness is measured. The thickness T1 is a thickness (film thickness) of the insulating film MZ3 at a position contiguous (adjacent) to the corner portion MG3 (the tip thereof) of the memory gate electrode MG. As is also apparent from FIG. 3, therefore, the thickness of the insulating film MZ3 present between the corner portion MG3 (the tip thereof) of the memory gate electrode MG and the corner portion of the insulating film MZ3 facing to this corner portion MG3 (the tip thereof) corresponds to the thickness T1. The thickness T2 is a thickness (film thickness) of a portion of the insulating film MZ3 extending between the semiconductor substrate SB and the memory gate electrode MG. As is also apparent from FIG. 3, the thickness of the portion of the insulating film MZ3 extending between the semiconductor substrate SB and the memory gate electrode MG at a position distant from the corner portion MG3 of the memory gate electrode MG corresponds to the thickness T2. For example, the thickness of the insulating film MZ3 present between the memory gate electrode MG and the semiconductor substrate SB in the vicinity of the center of the memory gate electrode MG in a gate length direction corresponds to the thickness T2. The thickness T3 is a thickness (film thickness) of a portion of the insulating film MZ3 extending between the control gate electrode CG and the memory gate electrode MG. As is also apparent from FIG. 3, therefore, the thickness of a portion of the insulating film MZ3 extending between the control gate electrode CG and the memory gate electrode MG at a position distant from the corner portion MG3 of the memory gate electrode MG corresponds to the thickness T3. For example, the thickness of the insulating film MZ3 present between the memory gate electrode MG and the control gate electrode CG at a position about half of the height of the memory gate electrode MG corresponds to the thickness T3.

When the first film thickness relationship, that is, T1<T2 is satisfied, the following advantage can be obtained. Described specifically, since the distance between the corner portion MG3 of the memory gate electrode MG and the charge accumulation layer (meaning the insulating film MZ2) is equal to the thickness T1, by making the thickness T1 smaller (thinner) than thickness T2, the corner portion MG3 of the memory gate electrode MG can be brought closer to the charge accumulation layer (meaning the insulating film MZ2). This makes it possible, upon injecting holes from the memory gate electrode MG to the charge accumulation layer (meaning the insulating film MZ2) of the insulating film MZ upon erase operation, to inject holes in a more concentrated manner. In other words, by making the angle acute at the corner portion MG3 of the memory gate electrode MG and at the same time, making the thickness T1 of the insulating film MZ3 at a position contiguous to the corner portion MG3 smaller than the thickness T2 of the insulating film MZ3 extending between the semiconductor substrate SB and the memory gate electrode MG, injection of holes from the memory gate electrode MG to the insulating film MZ2 upon erasing can be carried out in a more concentrated manner. As a result, the above-mentioned advantage available by the first characteristic (obtained by making the angle acute at the corner portion MG3 of the memory gate electrode MG) can be obtained more adequately.

When the second film thickness relationship, that is, T1<T3 is satisfied, the following advantage can be obtained. Described specifically, by making the thickness T1 smaller (thinner) than the thickness T3, the corner portion MG3 of the memory gate electrode MG can be brought closer to the charge accumulation layer (meaning the insulating film MZ2). This makes it possible, upon injecting holes from the memory gate electrode MG to the charge accumulation layer (meaning the insulating film MZ2) of the insulating film MZ upon erase operation, to inject holes in a more concentrated manner. By making the thickness T3 greater (thicker) than the thickness T1, the thickness of the insulating film MZ between the control gate electrode CG and the memory gate electrode MG except for the corner portion MG3 of the memory gate electrode MG can be made greater so that the withstand voltage between the control gate electrode CG and the memory gate electrode MG can be improved further.

When both the first film thickness relationship, that is, T1<T2 and the second film thickness relationship T1<T3 are satisfied, the following advantage can be obtained further. Described specifically, by making the thickness T1 smaller (thinner) than each of the thickness T2 and the thickness T3, it is possible to make the angle acute at the corner portion MG3 and thereby sharpen the tip of the corner portion MG3. The first characteristic can easily achieved by it. In addition, since the angle of the corner portion MG3 of the memory gate electrode MG can easily be made acute to sharpen the tip of the corner portion MG3, the injection of holes from the memory gate electrode MG into the insulating film MZ2 upon erase operation can be carried out in a more concentrated manner from the corner portion MG3 of the memory gate electrode MG.

The insulating film MZ3 has preferably a small thickness partially at a position contiguous to the corner portion MG3 of the memory gate electrode MG, by which both the relationships T1<T2 and T1<T3 are satisfied.

In the semiconductor device of the first investigation example shown in FIGS. 33 and 34, it is advantageous to increase the thickness of the insulating film MZ103 from the standpoint of improving retention characteristics (charge retention characteristics) of a nonvolatile memory, but thickening of the insulating film MZ103 leads to difficulty in injection of holes from the memory gate electrode MG100 to the insulating film MZ102 upon erase operation. This may further lead to reduction in erase rate.

In the present embodiment and each of the modification examples, on the other hand, by making the angle acute at the corner portion MG3 of the memory gate electrode MG, which is the first characteristic or partially decreasing the thickness of the insulating film MZ3 at a position contiguous to the corner portion MG3 of the memory gate electrode MG based on the first film thickness relationship, holes can be injected from the corner portion MG3 of the memory gate electrode MG to the insulating film MZ2 upon erase operation. In the present embodiment and each of the modification examples, therefore, this facilitates injection of holes from the memory gate electrode MG to the insulating film MZ2 upon erase operation while securing the thickness of the insulating film MZ3 at a position other than that contiguous to the corner portion MG3 of the memory gate electrode MG. This leads to improvement in erase rate. In the present embodiment and each of the modification examples, therefore, it is possible to improve the erase rate while keeping the retention characteristics (charge retention characteristics) of a nonvolatile memory. Or, in the present embodiment and each of the modification examples, it is possible to satisfy both the improvement in the retention characteristics (charge retention characteristics) of a nonvolatile memory and improvement in the erase rate.

Figure 41:
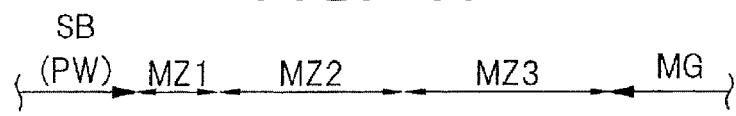
FIG. 41 is an energy band diagram from a semiconductor substrate to a memory gate electrode.
Figure 41:
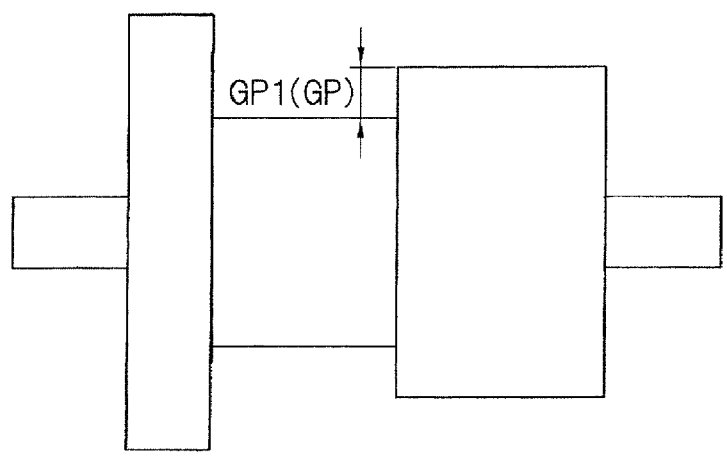
Figure 42:
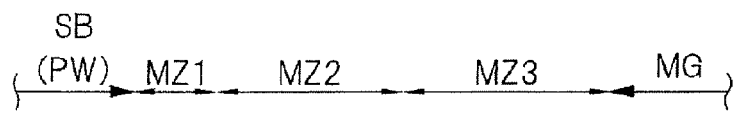
FIG. 42 is an energy band diagram from a semiconductor substrate to a memory gate electrode.
Figure 42:
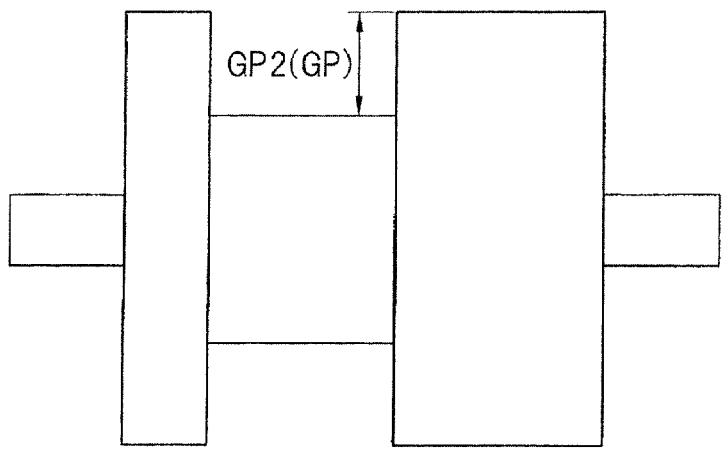

FIGS. 41 and 42 are each an energy band diagram of a stacked structure of the semiconductor substrate SB (p well PW), the insulating film MZ, and the memory gate electrode MG. They show an energy band in a thickness direction (a direction substantially perpendicular to the main surface of the semiconductor substrate SB). In FIGS. 41 and 42, the abscissa shows the thickness direction of the stacked structure of the semiconductor substrate SB (p well PW), the insulating film MZ, and the memory gate electrode MG, while the ordinate shows energy. FIG. 41 shows the energy band when the semiconductor substrate SB is a silicon substrate, the insulating film MZ1 is a silicon oxide film, the insulating film MZ2 is a silicon nitride film, the insulating film MZ3 is a silicon oxynitride film, and the memory gate electrode MG is a silicon gate electrode. FIG. 42 shows the energy band when the semiconductor substrate SB is a silicon substrate, the insulating film MZ1 is a silicon oxide film, the insulating film MZ2 is a silicon nitride film, the insulating film MZ3 is a silicon oxide film, and the memory gate electrode MG is a silicon gate electrode. Therefore, FIG. 41 and FIG. 42 are different in the insulating film MZ3. It is a silicon oxynitride film (in FIG. 41) or a silicon oxide film (in FIG. 42).

As shown in FIGS. 41 and 42, the band gap of the insulating film MZ1 is greater than that of the insulating film MZ2 and at the same time, the band gap of the insulating film MZ3 is greater than that of the insulating film MZ2. This enables the insulating film MZ2 to function as an insulating film having a charge accumulation function and enables the insulating film MZ1 and the insulating film MZ3 to function as a charge blocking layer (or charge confining layer) for confining charges in the insulating film MZ2.

The band gap of silicon oxide is greater than that of silicon oxynitride so that an energy barrier GP between the insulating film MZ2 functioning as a charge accumulation layer and the insulating film MZ3 functioning as a charge blocking layer can be made higher when a silicon oxide film is used as the insulating film MZ3 (corresponding to FIG. 42) than when a silicon oxynitride film is used as the insulating film MZ3 (corresponding to FIG. 41).

Supposing that the energy barrier GP between the insulating film MZ2 and the insulating film MZ3 in the case where a silicon nitride film is used as the insulating film MZ2 and a silicon oxynitride film is used as the silicon nitride film MZ3 (corresponding to FIG. 41) is designated by a reference character GP1 and called "energy barrier GP1"; and the energy barrier GP between the insulating film MZ2 and the insulating film MZ3 in the case where a silicon nitride film is used as the insulating film MZ2 and a silicon oxide film is used as the insulating film MZ3 (corresponding to FIG. 42) is designated by a reference character GP2 and is called "energy barrier GP2", the energy barrier GP2 exceeds the energy barrier GP1 (GP2>GP1).

Either a silicon oxynitride film or a silicon oxide film can be used as the insulating film MZ3, but using a silicon oxide film is more preferred. When a silicon oxide film is used as the insulating film MZ3, the energy barrier GP between the insulating film MZ2 and the insulating film MZ3 can be made greater, making it possible to adequately prevent unintentional loss of charges, which have been retained in the insulating film MZ2 functioning as a charge accumulation layer, to the side of the memory gate electrode MG. As a result, the resulting nonvolatile memory can have improved retention characteristics (charge retention characteristics).

In the semiconductor device of the first investigation example shown in FIGS. 33 and 34, using a silicon oxynitride film as the insulating film MZ103 decreases the energy barrier between the insulating film MZ102 and the insulating film MZ103. This facilitates injection of holes from the memory gate electrode MG100 to the insulating film MZ102 upon erase operation and facilitates improvement in erase rate, but causes deterioration in retention characteristics (charge retention characteristics). In the semiconductor device of the first investigation example shown in FIGS. 33 and 34, on the other hand, using a silicon oxide film as the insulating film MZ103 increases the energy barrier between the insulating film MZ102 and the insulating film MZ103. This facilitates improvement in retention characteristics (charge retention characteristics), but disturbs injection of holes from the memory gate electrode MG100 to the insulating film MZ102 upon erase operation and reduces the erase rate.

In the present embodiment and each of the modification examples, on the other hand, making the angle acute at the corner portion MG3 of the memory gate electrode MG according to the first characteristic or thinning the insulating film MZ3 partially at a position contiguous to the corner portion MG3 of the memory gate electrode MG in order to satisfy the first film thickness relationship facilitates injection of holes from the corner portion MG3 of the memory gate electrode MG to the insulating film MZ2 upon erase operation, leading to improvement in erase rate. Even if the energy barrier GP2 between the insulating film MZ2 and the insulating film MZ3 becomes high by using a silicon oxide film as the insulating film MZ3, the erase rate can be improved. In the present embodiment and each of the modification examples, it is therefore possible to improve retention characteristics (charge retention characteristics) by using a silicon oxide film as the insulating film MZ3 to increase the energy barrier GP2 between the insulating film MZ2 and the insulating film MZ3 while improving the erase rate.

Second Embodiment

Figure 43:
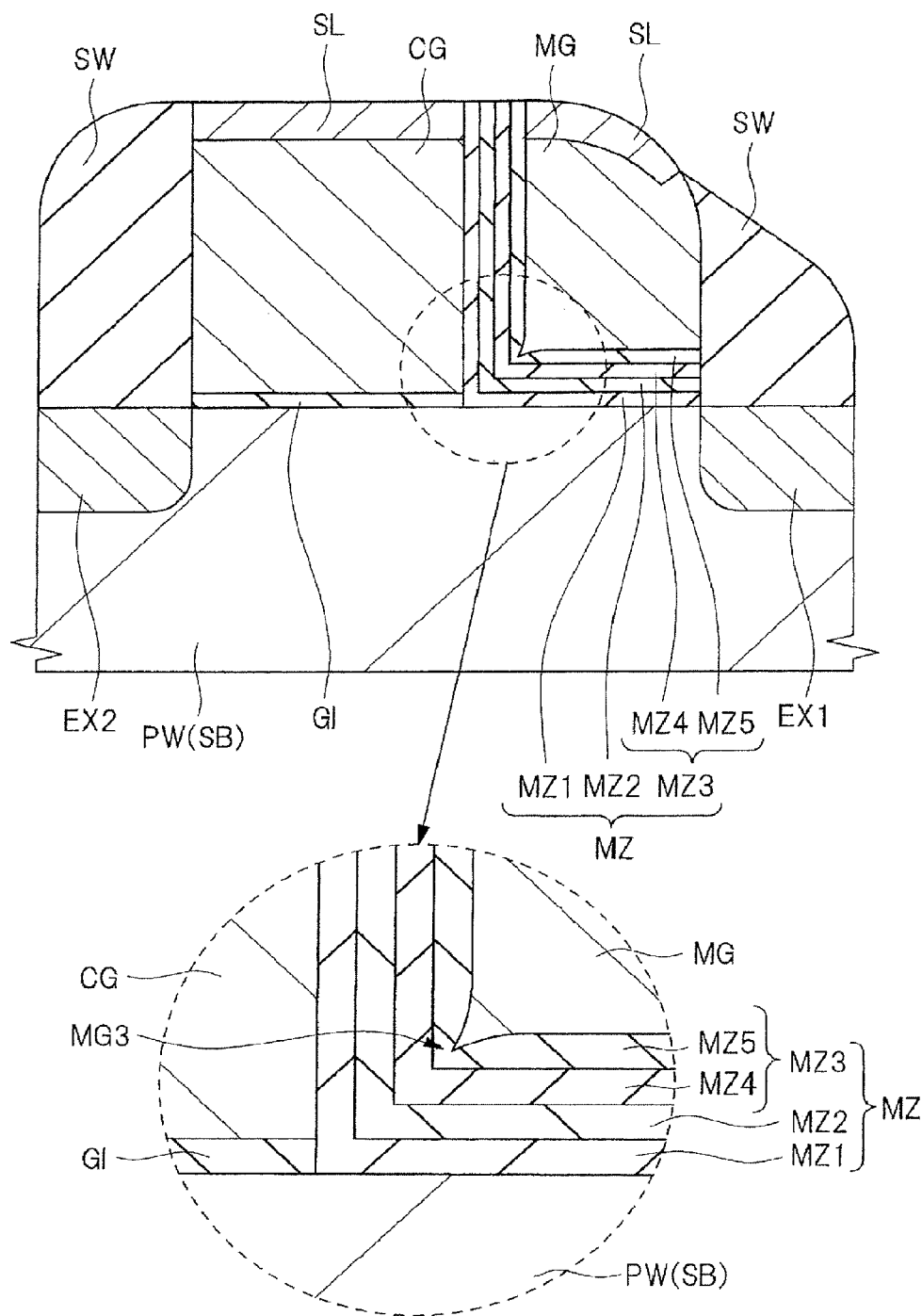
FIG. 43 is a fragmentary cross-sectional view of a semiconductor device according to another embodiment of the invention.

FIG. 43 is a fragmentary cross-sectional view of a semiconductor device according to Second Embodiment and it corresponds to FIG. 2 showing First Embodiment. Similar to FIG. 2, an enlarged view of a region enclosed by a dotted circle in FIG. 43 is extracted on the lower side of FIG. 43.

The semiconductor device of Second Embodiment is different from the semiconductor device of First Embodiment in that in Second Embodiment, the insulating film MZ3 is comprised of a stacked film of an insulating film MZ4 and an insulating film MZ5 stacked on the insulating film MZ4. Except for this, the semiconductor device of Second Embodiment is essentially similar to the semiconductor device of First Embodiment so that an overlapping description will be omitted.

In the semiconductor device of Second Embodiment shown in FIG. 43, the insulating film MZ3 is comprised of a stacked film of an insulating film MZ4 and an insulating film MZ5 stacked on the insulating film MZ4. In Second Embodiment, therefore, the insulating film MZ is comprised of a stacked film of the insulating film MZ1, the insulating film MZ2 on the insulating film MZ1, the insulating film MZ4 on the insulating film MZ2, and the insulating film MZ5 on the insulating film MZ4. The insulating film MZ4 is comprised of preferably a silicon oxynitride film and the insulating film MZ5 is comprised of preferably a silicon oxide film.

From another standpoint, the insulating film MZ5 made of a silicon oxide film in Second Embodiment can be regarded that it corresponds to the insulating film MZ3 made of a silicon oxide film in First embodiment. It is therefore possible to say that in Second Embodiment, a silicon oxynitride film (meaning the insulating film MZ4) is inserted between the insulating film MZ2 made of a silicon nitride film and the insulating film MZ3 made of a silicon oxide film in First Embodiment.

In Second Embodiment, the band gap of the insulating film MZ4 is greater than the band gap of the insulating film MZ2 and the band gap of the insulating film MZ5 is greater than the band gap of the insulating film MZ2. The band gap of the insulating film MZ3 made of a stacked film of the insulating film MZ4 and the insulating film MZ5 is therefore greater than the band gap of the insulating film MZ2. As a result, the insulating film MZ4 and the insulating film MZ5 can each function as a charge blocking layer (or a charge confining layer) for confining charges in the insulating film MZ2. The insulating film MZ3 comprised of a stacked film of the insulating film MZ4 and the insulating film MZ5 on the insulating film MZ4 can function as a charge blocking layer (or a charge confining layer) for confining charges in the insulating film MZ2.

Also in Second Embodiment similar to First Embodiment, the band gap of the insulating film MZ1 is greater than the band gap of the insulating film MZ2 so that the insulating film MZ1 can function as a charge blocking layer (or charge confining layer) for confining charges in the insulating film MZ2.

Figure 44:
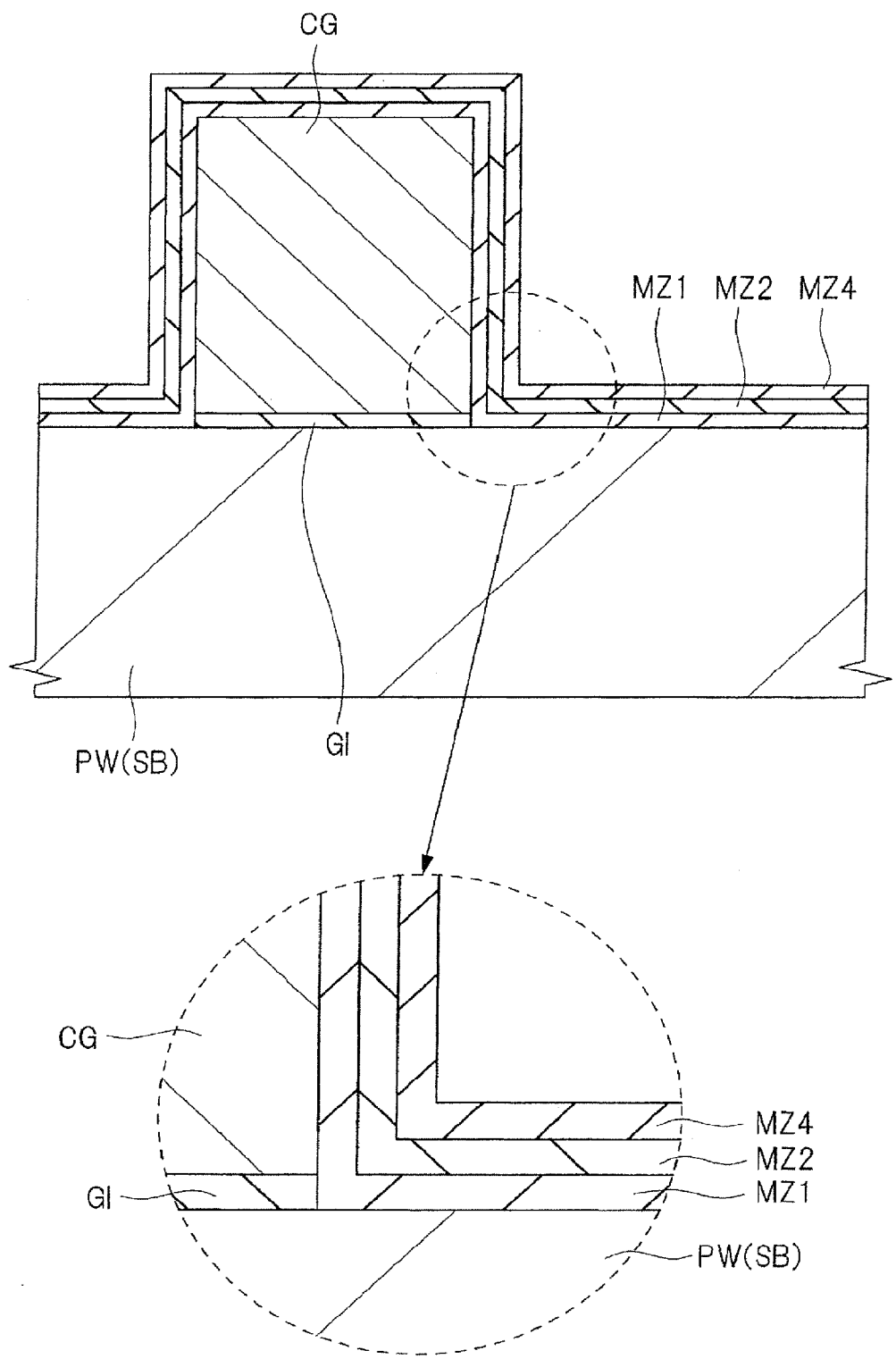
FIG. 44 is a fragmentary cross-sectional view of the semiconductor device according to the another embodiment of the invention during a manufacturing step.
Figure 45:
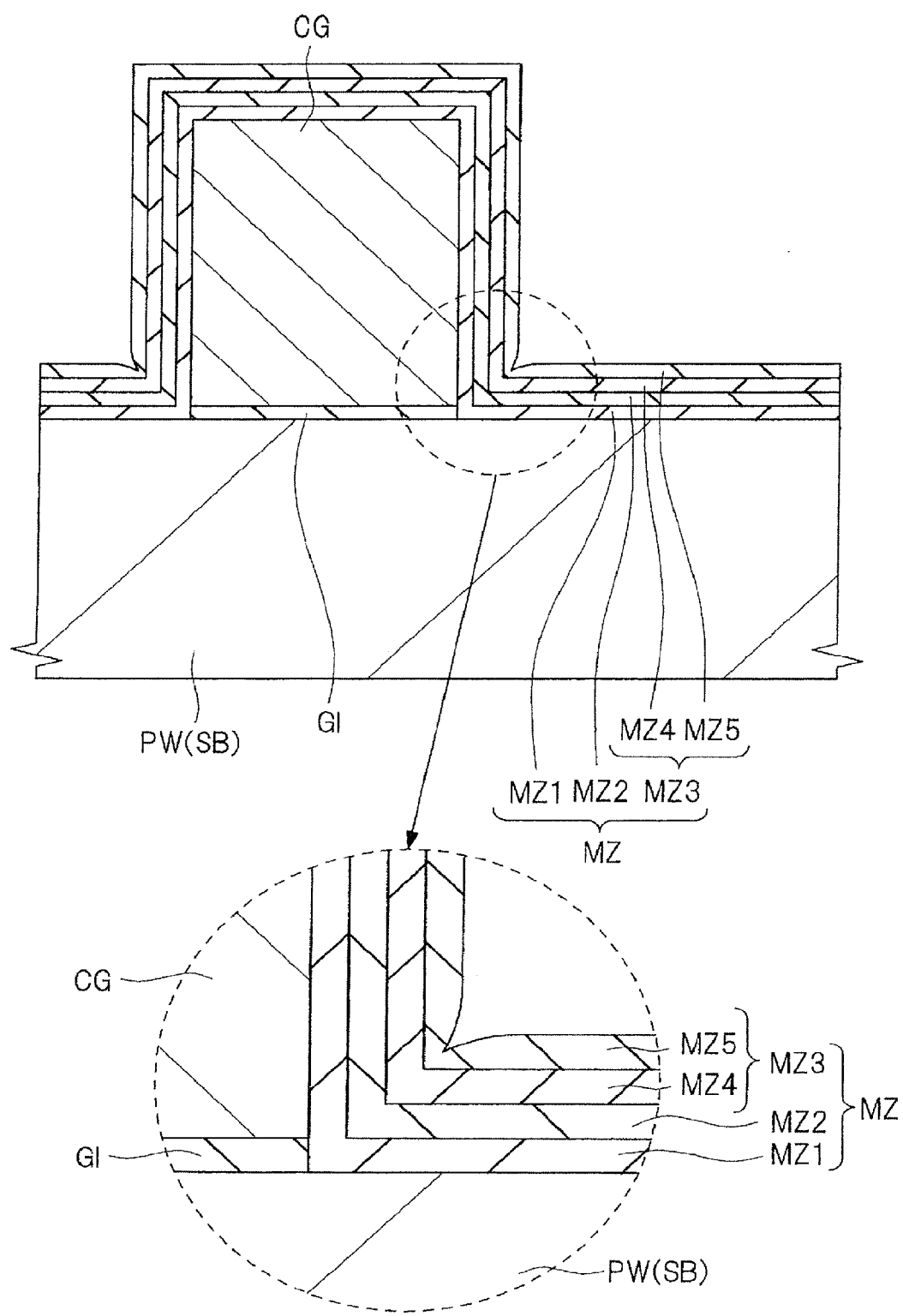
FIG. 45 is a fragmentary cross-sectional view of the semiconductor device during a manufacturing step following that of FIG. 44.
Figure 46:
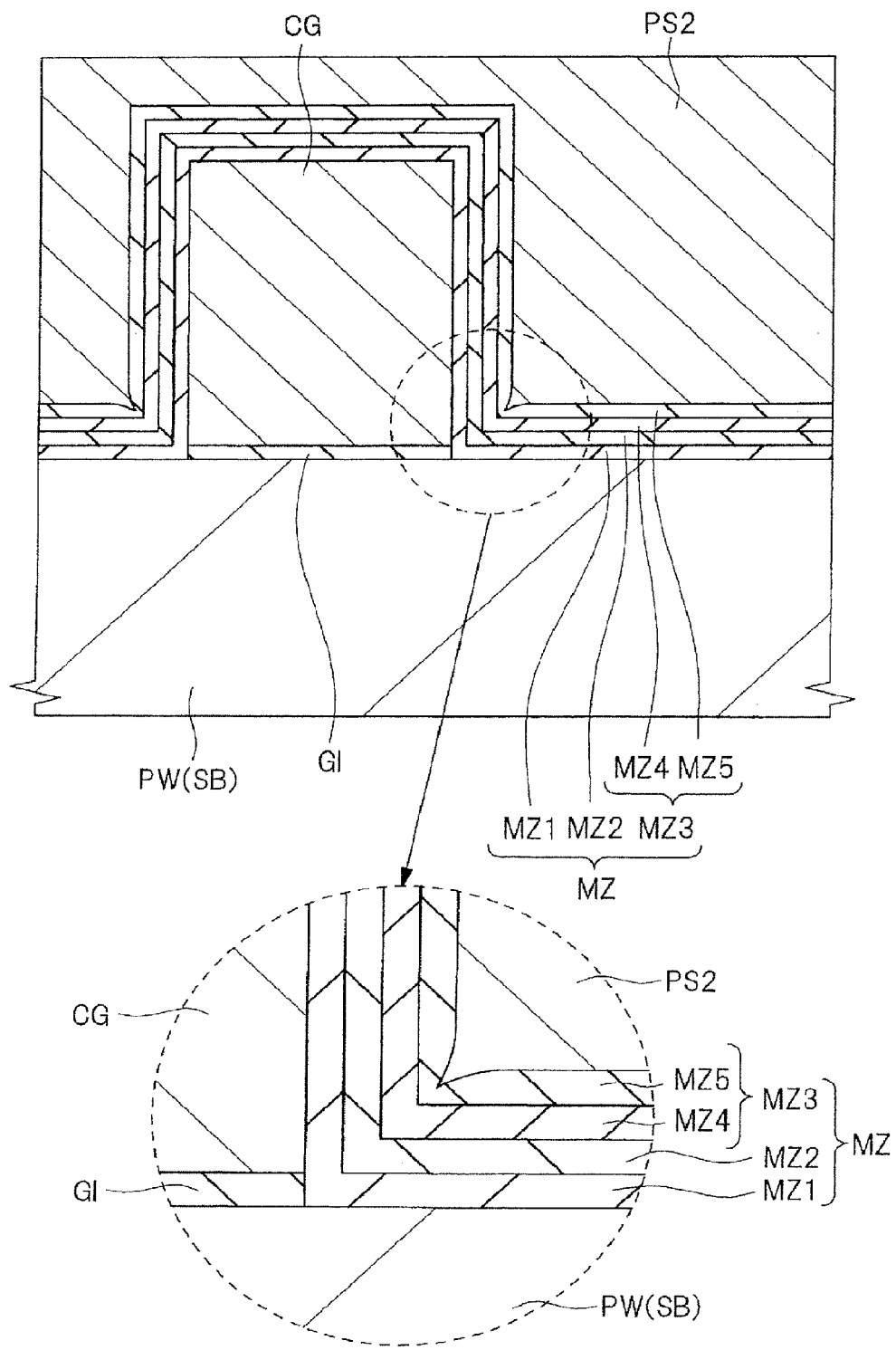
FIG. 46 is a fragmentary cross-sectional view of the semiconductor device during a manufacturing step following that of FIG. 45.

FIGS. 44 to 46 are fragmentary cross-sectional views of the semiconductor device of Second Embodiment during manufacturing steps thereof and they show a cross-sectional region corresponding to that of First Embodiment shown in FIGS. 14 to 17 and FIG. 19.

Manufacturing steps of the semiconductor device of Second Embodiment are substantially similar to those of First Embodiment until the formation of the insulating film MZ2 in Step S7b so that an overlapping description is omitted here.

Also in Second Embodiment, steps until the insulating film MZ2 formation step in Step S7b are carried out in a manner substantially similar to those of First Embodiment to obtain the structure shown in FIG. 16. The thickness (formed thickness) of a silicon oxide film as the insulating film MZ1 can be set at, for example, about 3 to 10 nm and the thickness (formed thickness) of a silicon nitride film as the insulating film MZ2 can be set at, for example, about 4 to 8 nm.

Then, in Second Embodiment, an insulating film MZ4 is formed on the insulating film MZ2 as shown in FIG. 44. The insulating film MZ4 is made of a silicon oxynitride film and can be formed, preferably using CVD. The thickness (formed thickness) of the silicon oxynitride film as the insulating film MZ4 can be set at, for example, from about 5 to 12 nm. When the silicon oxynitride film (insulating film MZ4) is formed using CVD, for example, a mixed gas of $SiH_2Cl_2$ (dichlorosilane) gas, an $NH_3$ (ammonia) gas, and an $N_2O$ (dinitrogen monoxide) gas can be used as a film forming gas.

In Second Embodiment, as shown in FIG. 45, an insulating film MZ5 is then formed on the insulating film MZ4. The insulating film MZ5 is made of a silicon oxide film. A method of forming this film is similar to that of the insulating film MZ3 in First Embodiment so that an overlapping description is omitted here. The thickness (formed thickness) of the silicon oxide film as the insulating film MZ5 can be set at, for example, from about 5 to 15 nm.

As described above, the insulating film MZ made of a stacked film of the insulating film MZ1, the insulating film MZ2, the insulating film MZ4, and the insulating film MZ5 is formed in Second Embodiment.

Steps after that are essentially similar to those of First Embodiment. Described specifically, the silicon film PS2 formation step of Step S8 is carried out in a manner similar to that of First Embodiment to obtain the structure of FIG. 46 corresponding to that of FIG. 19. Then, Step S9 (the silicon film PS2 etch back step) and steps subsequent thereto are carried out as in First Embodiment, but an overlapping description is omitted here.

Second Embodiment can provide the following advantage in addition to the advantage available by First Embodiment.

Described specifically, when the insulating film MZ3 made of a silicon oxide film is formed directly on the insulating film MZ2 made of a silicon nitride film, there is a possibility that a transition layer obtained by oxidation of a silicon nitride film is formed at the interface between the insulating film MZ2 and the insulating film MZ3 and a shallow trap level is formed in the transition layer. If such a shallow trap level is formed, it permits movement of charges in and out from the shallow trap level. As a result, the nonvolatile memory thus obtained inevitably has deteriorated retention characteristics (charge retention characteristics). In Second Embodiment, on the other hand, a silicon oxide film is not formed directly on the insulating film MZ2 made of a silicon nitride film, but after formation of the insulating film MZ4 made of a silicon oxynitride film on the insulating film MZ2 made of a silicon nitride film, the insulating film MZ5 made of a silicon oxide film is formed on the insulating film MZ4. In Second Embodiment, therefore, a transition layer obtained by the oxidation of a silicon nitride film is hardly formed at the interface between the insulating film MZ2 and the insulating film MZ4 and formation of a shallow trap level in the transition layer can be prevented. In Second Embodiment, the shallow trap level is hardly formed at the interface between the insulating film MZ2 and the insulating film MZ3 and therefore, the nonvolatile memory thus obtained can have adequately improved retention characteristics (charge retention characteristics).

In First Embodiment, on the other hand, the insulating film MZ3 can be formed from a single-layer insulating film. This leads to a decrease in the number of manufacturing steps and also improvement in the throughput of the semiconductor device.

In addition, the corner portion MG3 of the memory gate electrode MG can be sharpened more easily in First Embodiment than in Second Embodiment so that the structure of the first characteristic can be formed more easily in the former one. This is because the insulating film MZ3 of First Embodiment which does not have the insulating film MZ4 made of a silicon oxynitride film but is composed of a silicon oxide film can be made thicker by the thickness of the silicon oxynitride film than the insulating film MZ5 made of a silicon oxide film in Second Embodiment. A silicon oxide film capable of satisfying the first film thickness relationship and the second film thickness relationship can be obtained more easily when the formed thickness of the silicon oxide film is greater. The greater formed thickness of the silicon oxide film facilitates sharpening of the corner portion MG3 of the memory gate electrode MG to make the angle thereof acute.

Second Embodiment can be applied to each of the modification examples of First Embodiment. In this case, in each of the modification example of First Embodiment, the insulating film MZ3 is formed from a stacked film of the insulating film MZ4 and the insulating film MZ5 stacked on the insulating film MZ4.

Third Embodiment

Figure 47:
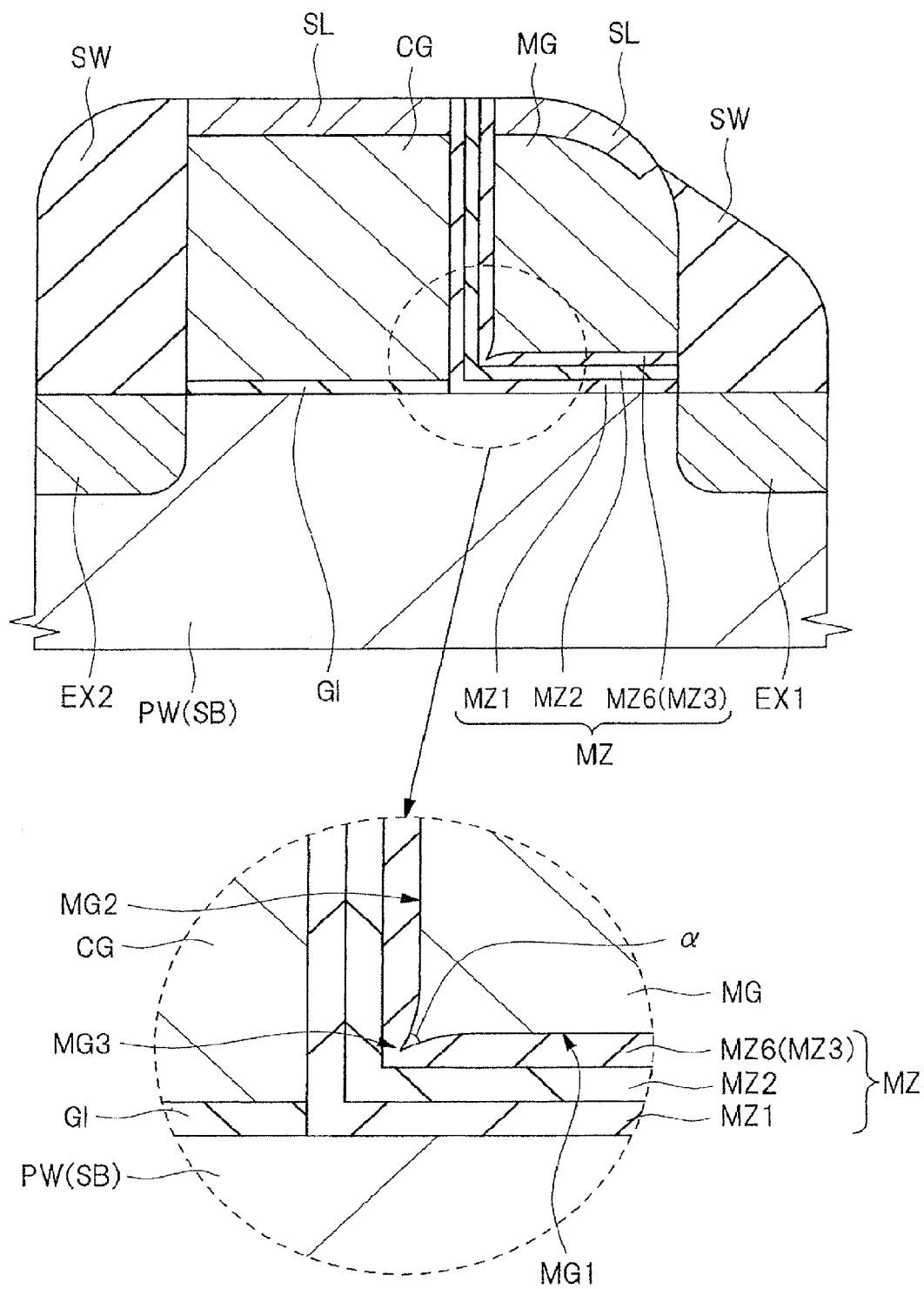
FIG. 47 is a fragmentary cross-sectional view of a semiconductor device according to a further embodiment of the invention.

FIG. 47 is a fragmentary cross-sectional view of a semiconductor device of Third Embodiment and it corresponds to FIG. 2 of First Embodiment. Similar to FIG. 2, FIG. 47 has, on the lower side of FIG. 47, an enlarged view of a region enclosed by a dotted circle in FIG. 47.

The semiconductor device of Third Embodiment is different from the semiconductor device of First Embodiment in that in Third Embodiment, the insulating film MZ3 is made of a high dielectric constant insulating film. The term "high dielectric constant insulating film" as used herein means an insulating film having a dielectric constant (specific dielectric constant) higher than that of a silicon nitride film. Except for it, the semiconductor device of Third Embodiment is essentially similar to the semiconductor device of First Embodiment so that an overlapping description is omitted. The semiconductor device of Third Embodiment therefore has a constitution similar to that of the semiconductor device of First Embodiment except for that the material of the insulating film MZ3.

The semiconductor device of Third Embodiment shown in FIG. 47 is different from the semiconductor device of First Embodiment in that the insulating film MZ3 which is an upper side layer in the insulating film MZ and serves as a charge blocking layer (charge confining layer) is made of a high dielectric constant insulating film MZ6. The high dielectric constant insulating film MZ6 has a dielectric constant higher than that of a silicon nitride film and as this film, a metal oxide film (oxidized metal film) such as an aluminum oxide film (typically, an $Al_2O_3$ film), a hafnium oxide film (typically, an $HfO_2$ film), or a hafnium aluminate film (HfAlO film) can be preferably used.

Even when the insulating film MZ3 is made of the high dielectric constant insulating film MZ6, the insulating film MZ2 is an insulating film (trap insulating film) having a charge accumulation function as in First Embodiment and the band gap of each of the insulating film MZ1 and the insulating MZ3 (meaning the high dielectric constant insulating film MZ6) is greater than the band gap of the insulating film MZ2.

Figure 48:
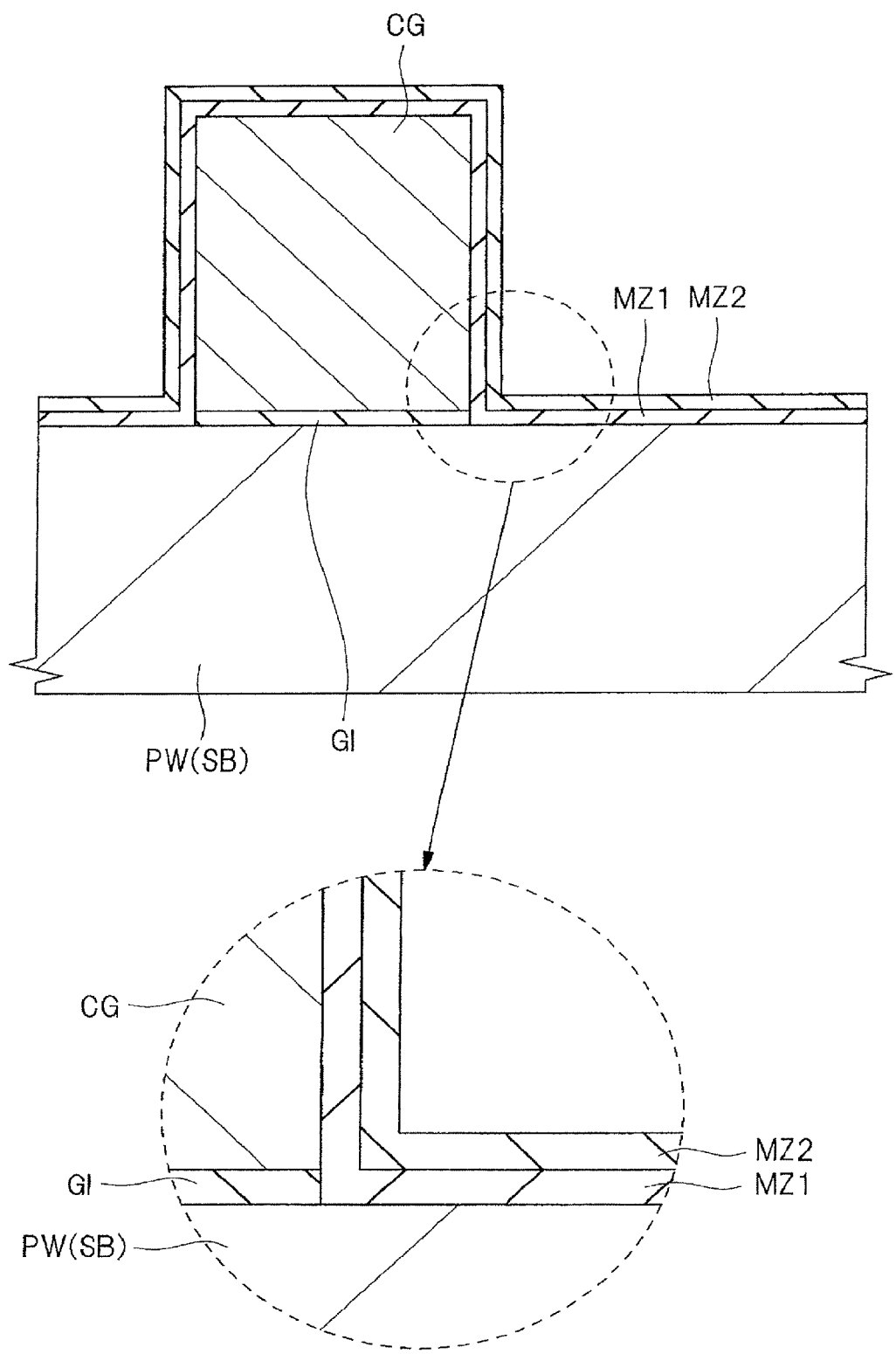
FIG. 48 is a fragmentary cross-sectional view of the semiconductor device step according to the further embodiment of the invention during a manufacturing step.
Figure 49:
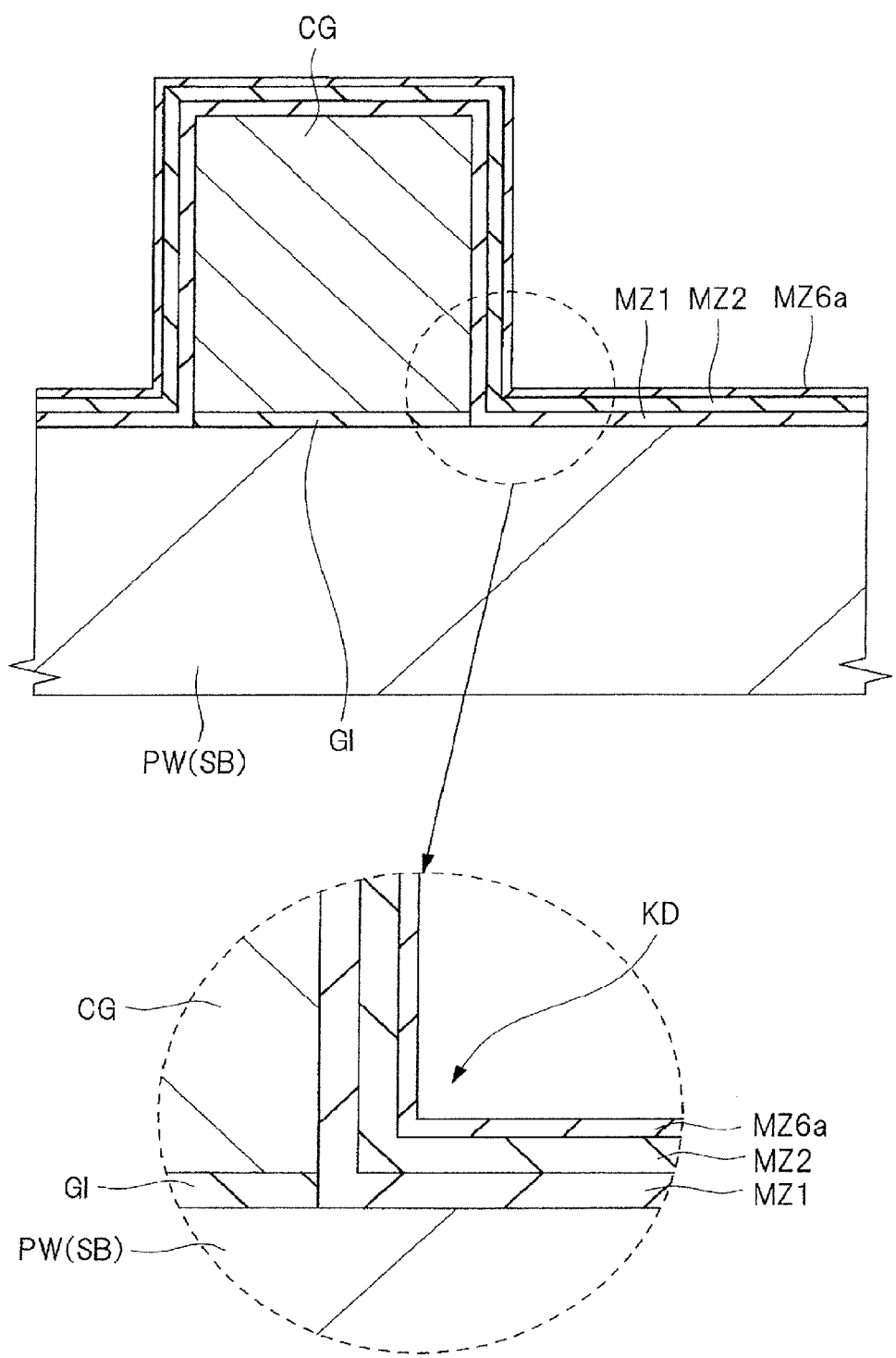
FIG. 49 is a fragmentary cross-sectional view of the semiconductor device during a manufacturing step following that of FIG. 48.
Figure 50:
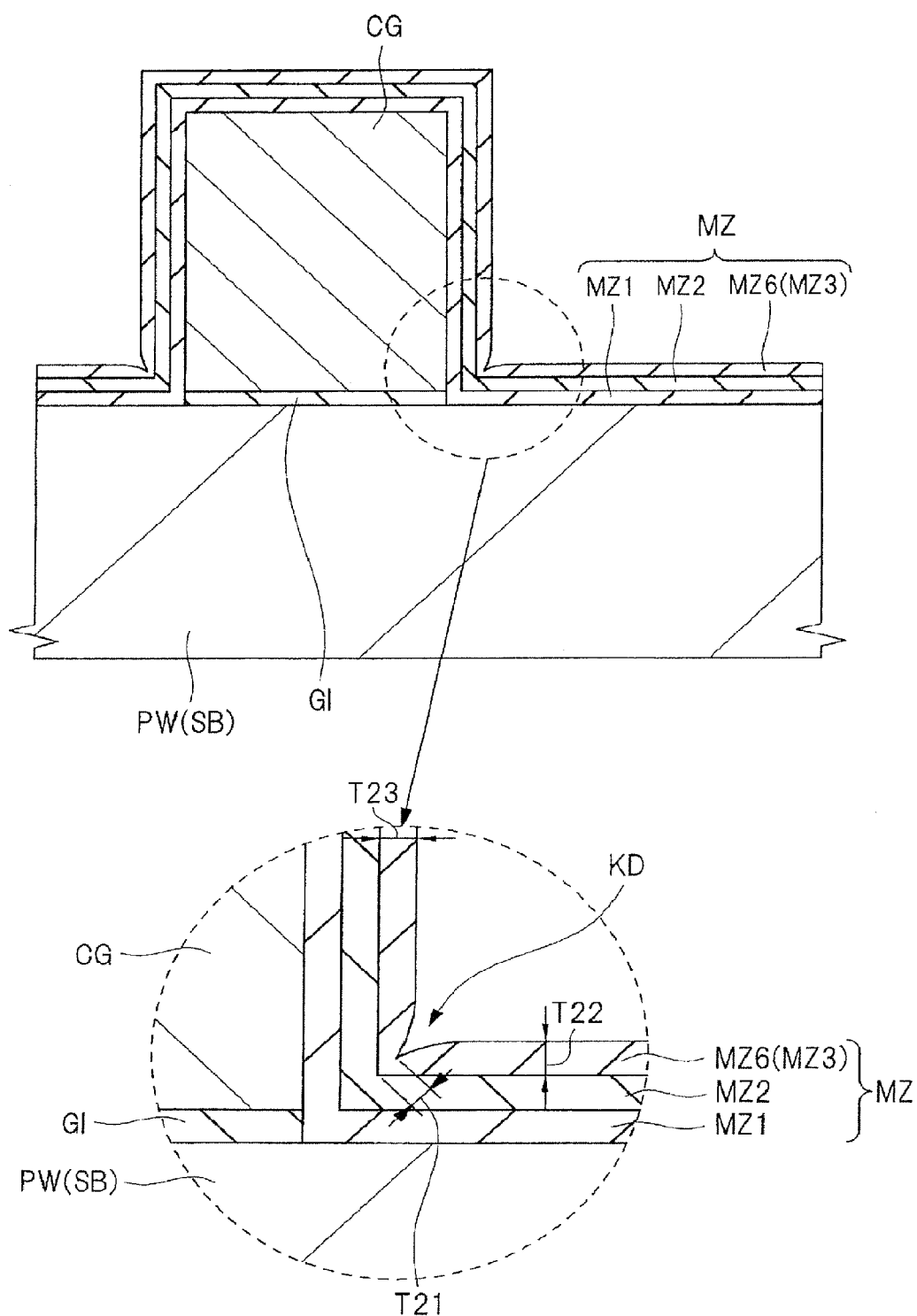
FIG. 50 is a fragmentary cross-sectional view of the semiconductor device during a manufacturing step following that of FIG. 49.

FIGS. 48 to 50 are each a fragmentary cross-sectional view of the semiconductor device of Third Embodiment during manufacturing steps thereof. They show a cross-sectional region corresponding to that of First Embodiment shown in FIGS. 14 to 17 and FIG. 19.

Manufacturing steps of the semiconductor device of Third Embodiment are substantially similar to those of First Embodiment until the formation of the insulating film MZ2 in Step S7b so that an overlapping description is omitted here.

Also in Third Embodiment, manufacturing steps until the insulating film MZ2 formation step of Step S7b are carried out as in First Embodiment to obtain the structure of FIG. 48 similar to that of FIG. 16.

In Third Embodiment, a high dielectric constant insulating film MZ6 formation step is then carried out. This high dielectric constant insulating film MZ6 formation step includes a step of forming a base film MZ6a (corresponding to FIG. 49) and a step of oxidizing the base film MZ6a (corresponding to FIG. 50). These steps will hereinafter be described specifically.

Described specifically, after formation of the insulating film MZ2 in Step S7b in a manner substantially similar to that of First Embodiment, a base film MZ6a is formed on the insulating film MZ2 as shown in FIG. 49 in Third Embodiment. The base film MZ6a is a film which will be a base of the high dielectric constant insulating film MZ6 and it is a metal film (a base film which will be a base of the high dielectric constant insulating film), for example, an aluminum film (Al film), a hafnium film (Hf film), or an aluminum hafnium film (AlHf film). The base film MZ6a can be formed using, for example, ALD or sputtering.

Then, as shown in FIG. 50, the high dielectric constant insulating film MZ6 is formed by oxidizing the base film MZ6a. This means that the base film MZ 6a is oxidized into the high dielectric constant insulating film MZ6. When the base film MZ6a is an aluminum film (Al film), the high dielectric constant insulating film MZ6 is an aluminum oxide film (typically, an $Al_2O_3$ film). When the base film MZ6a is a hafnium film (Hf film), the high dielectric constant insulating film MZ6 is a hafnium oxide film (typically, an $HfO_2$ film). When the base film MZ6a is an aluminum hafnium film (AlHf film), the high dielectric constant insulating film MZ6 is a hafnium aluminate film (HfAlO film). The base film MZ6a is oxidized preferably through thermal oxidation. Using ISSG oxidation is more preferred. When ISSG oxidation is used, for example, an $O_2$ (oxygen) gas and an $H_2$ (hydrogen) gas can be used.

Just after formation of the base film MZ6a, the base film MZ 6a has a substantially uniform thickness. When the base film MZ6a is oxidized into the high dielectric constant insulating film MZ6, however, the thickness of the resulting oxide film (meaning the high dielectric constant insulating film MZ6) becomes smaller at the corner portion than the flat portion because an amount of a gas supplied to the corner portion is smaller than that supplied to the flat portion and a progression rate of oxidation at the corner portion becomes smaller than that at the flat portion, though depending on the oxidation conditions. This results in partial decrease in thickness at the corner portion KD of the high dielectric constant insulating film MZ6 formed by the oxidation of the base film MZ6a between a portion formed along the main surface of the semiconductor substrate SB and a portion formed along the side surface (sidewall) of the control gate electrode CG.

In other words, a thickness T21 of the insulating film MZ3 at the corner portion KD becomes smaller than a thickness T22 of a portion of the high dielectric constant insulating film MZ6 formed along the main surface of the semiconductor substrate SB and a thickness T23 of a portion of the high dielectric constant insulating film MZ6 formed along the side surface (sidewall) of the control gate electrode CG (T21<T22 and T21<T23). When a memory gate electrode MG is formed by forming the silicon film PS2 on the resulting high dielectric constant insulating film MZ6 and then etching back the resulting silicon film PS2, it is possible to make the angle acute at the corner portion MG3 of the memory gate electrode MG formed at a position adjacent to the partially thinned corner portion KD of the high dielectric constant insulating film MZ6.

The high dielectric constant insulating film MZ6 formation step is thus carried out so as to decrease the oxidation rate at the corner portion KD and decrease the thickness partially at the corner portion KD. In order to achieve this, control of the oxidation treatment conditions upon oxidizing the base film MZ61 is necessary. By controlling the conditions such as treatment temperature, pressure, kind of a gas, a gas flow rate, and a flow rate ratio of a gas, oxidation conditions permitting a decrease an oxidation rate at the corner portion KD and a partial decrease in the thickness at the corner portion KD can be set. By making a test while changing the above-mentioned conditions, it is possible to find the oxidation conditions under which the oxidation rate decreases at the corner portion KD and the high dielectric constant insulating film MZ6 is thinned partially at the corner portion KD can be formed. It is therefore recommended to make the test in advance to find the conditions suited for oxidation of the base film MZ6a and carry out the oxidation step of the base film MZ6a according to the oxidation conditions thus found.

As another method for forming the high dielectric constant insulating film MZ6, a high dielectric constant insulating film can be used as the base film MZ6a formed in the step of FIG. 49. For example, a metal oxide film (oxidized metal film) such as aluminum oxide film, hafnium oxide film, or hafnium aluminate film can be used. The high dielectric constant insulating film as the base film MZ6a can also be formed using ALD or sputtering. The high dielectric constant insulating film as the base film MZ6a can be oxidized in the step of FIG. 50 to form the high dielectric constant insulating film MZ6. As a method of oxidizing the base film MZ6a, thermal oxidation is preferred, with ISSG oxidation being more preferred. When ISSG is used, for example, an $O_2$ (oxygen) gas and an $H_2$ (hydrogen) gas can be used.

Even when a high dielectric constant insulating film is used as the base film MZ6a, the base film MZ6a is oxidized into the high dielectric constant insulating film MZ6. When the base film MZ6a is an aluminum oxide film, the high dielectric constant insulating film MZ6 becomes an aluminum oxide film. When the base film MZ6a is a hafnium oxide film, the high dielectric constant insulating film MZ6 becomes a hafnium oxide film. When the base film MZ6a is a hafnium aluminate film, the high dielectric constant insulating film MZ6 becomes a hafnium aluminate film. However, the composition ratio of oxygen in the high dielectric constant insulating film MZ6 becomes greater than that in the base film MZ6a.

Even when a high dielectric constant insulating film is used as the base film MZ6a, upon oxidizing the base film MZ6a into the high dielectric constant insulating film MZ6, an amount of a gas supplied to the corner portion is smaller than that to the flat portion so that a progression rate of oxidation at the corner portion is smaller than that at the flat portion, though depending on the oxidation conditions and the thickness of the oxide film thus formed (meaning the high dielectric constant insulating film MZ6) becomes smaller at the corner portion than that at the flat portion. This results in a partial decrease in thickness at the corner portion KD of the high dielectric constant insulating film MZ6 between a portion formed along the main surface of the semiconductor substrate SB and a portion formed along the side surface (sidewall) of the control gate electrode CG. In short, the thickness T21 becomes smaller than the thickness T22 and the thickness T23 (T21<T22 and T21<T23). This makes it possible to make the angle acute at the corner portion MG3 of the memory gate electrode MG formed at a position adjacent to the corner portion KD of the partially thinned high dielectric constant insulating film MZ6.

The relationship among the thicknesses T21, T22, and T23 (meaning the following relationship: T21<T22 and T21<T23) can be controlled more easily by using a metal film as base film MZ6a than by using a high dielectric constant insulating film as the base film MZ6a.

In Third Embodiment, as described above, the insulating film MZ made of a stacked film of the insulating film MZ1, the insulating film MZ2, and the high dielectric constant insulating film MZ6 is formed.

Steps after that are essentially similar to those of First Embodiment. Described specifically, the silicon film PS2 formation step of Step SR and steps subsequent thereto are carried out as in First Embodiment. An overlapping description is however omitted here.

Third Embodiment can be applied to each of the modification examples of First Embodiment. In this case, in each of the modification examples, the insulating film MZ3 is formed from a high dielectric constant insulating film.

In addition to the advantage available by First Embodiment, Third Embodiment can produce the following advantage further.

Described specifically, the insulating film MZ3 becomes thin partially at a position adjacent to the corner portion MG3 of the memory gate electrode MG. Although the insulating film MZ3 can have improved retention characteristics (charge retention characteristics) because it becomes thick at a position distant from the corner portion MG3 of the memory gate electrode MG, a portion of the insulating film MZ corresponding to the gate insulating film of the memory transistor inevitably has an increased physical thickness. In Third Embodiment, on the other hand, by forming the insulating film MZ3 from the high dielectric constant insulating film MZ6, the EOT (equivalent oxide thickness) of the insulating film MZ3 can be suppressed while increasing the physical film thickness of the insulating film MZ3. Suppression of the EOT of the insulating film MZ3 leads to suppression of the EOT of the gate insulating film (meaning the insulating film MZ) of the memory transistor, a reduction in the operating voltage and further, improvement in the operation rate. It also leads to a reduction in power consumption. As a result, the semiconductor device thus obtained can have more improved performance.

As a modification example of Third Embodiment, not only the insulating film MZ3 but also either one or both of the insulating film MZ1 and the insulating film MZ2 can be formed from a high dielectric constant insulating film. Also in this case, however, it is necessary that the insulating film MZ2 is an insulating film (trap insulating film) having a charge accumulation function and the band gap of each of the insulating film MZ1 and the insulating film MZ3 is greater than that of the insulating film MZ2. By forming either one or both of the insulating film MZ1 and the insulating film MZ2 from a high dielectric constant insulating film, the EOT of the gate insulating film (the insulating film MZ) of the memory transistor can be suppressed further. This leads to a further reduction in the operating voltage and further improvement in the operation rate. Moreover, it leads to further reduction in power consumption. As a result, the semiconductor device thus obtained has further improved performance.

Fourth Embodiment

Figure 51:
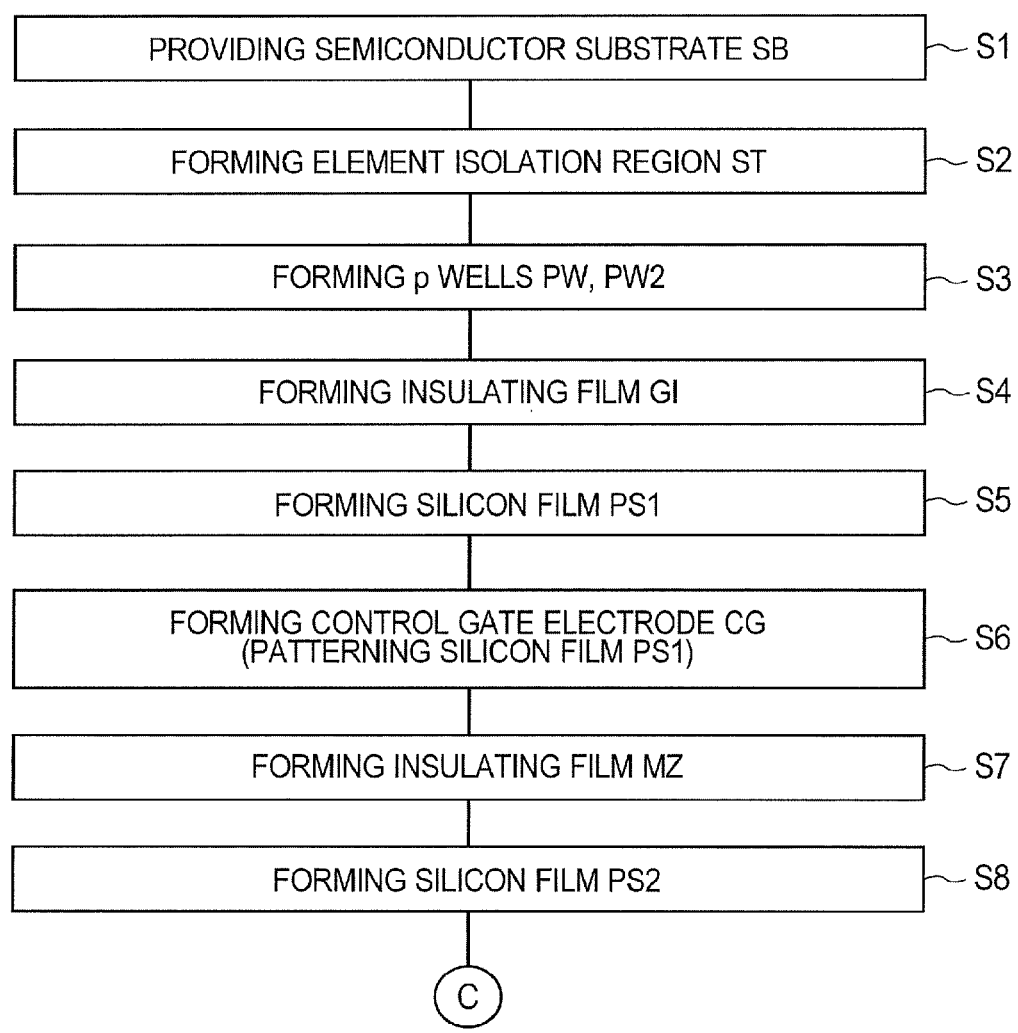
FIG. 51 is a process flow chart showing some of manufacturing steps of a semiconductor device according to a still further embodiment of the invention.
Figure 52:
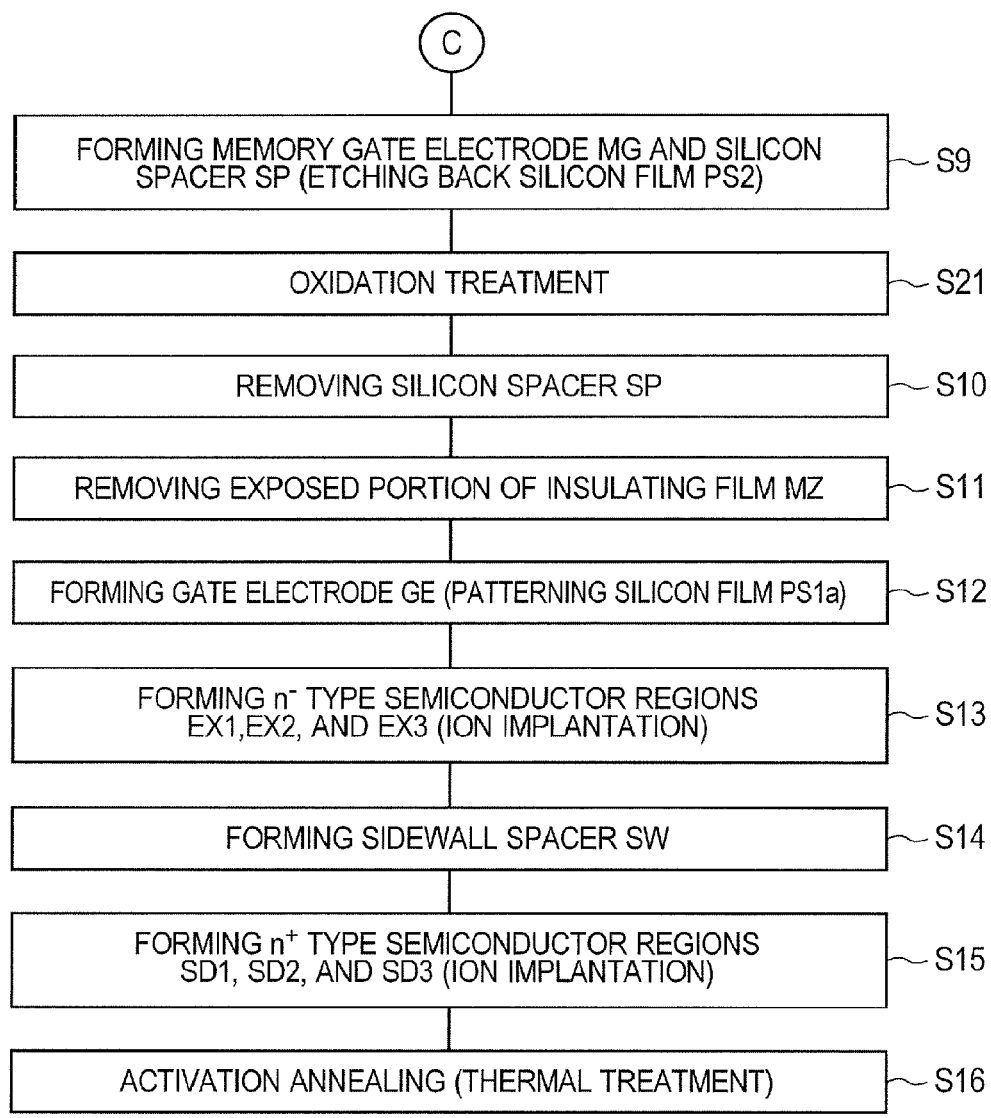
FIG. 52 is a process flow chart showing some of the manufacturing steps of the semiconductor device according to the still further embodiment of the invention.

FIGS. 51 and 52 are process flow charts showing some of manufacturing steps of a semiconductor device of Fourth Embodiment and they correspond to FIGS. 6 and 7 showing First Embodiment. The process flow shown in FIG. 51 is followed by the process flow shown in FIG. 52. FIGS. 53 to 65 are fragmentary cross-sectional views of the semiconductor device of the present embodiment during manufacturing steps. Of FIGS. 53 to 65, FIGS. 53, 54, 56, 57, 60, and 64 show cross-sectional areas corresponding to FIGS. 9 to 13, 18, 20, 22, 23, and 25 to 32 of First Embodiment. Of FIGS. 53 to 65, FIGS. 55, 58, 59, 61 to 63, and 65 show cross-sectional areas corresponding to FIGS. 14 to 17, 19, 21, and 24 of First Embodiment.

In manufacturing steps of Fourth Embodiment, an overlapping description is omitted for portions essentially similar to those in the manufacturing steps of First Embodiment.

The manufacturing steps of the semiconductor device of Fourth Embodiment are substantially similar to those of First Embodiment until the control gate electrode GE is formed in Step S6 so that an overlapping description is omitted here.

Figure 53:
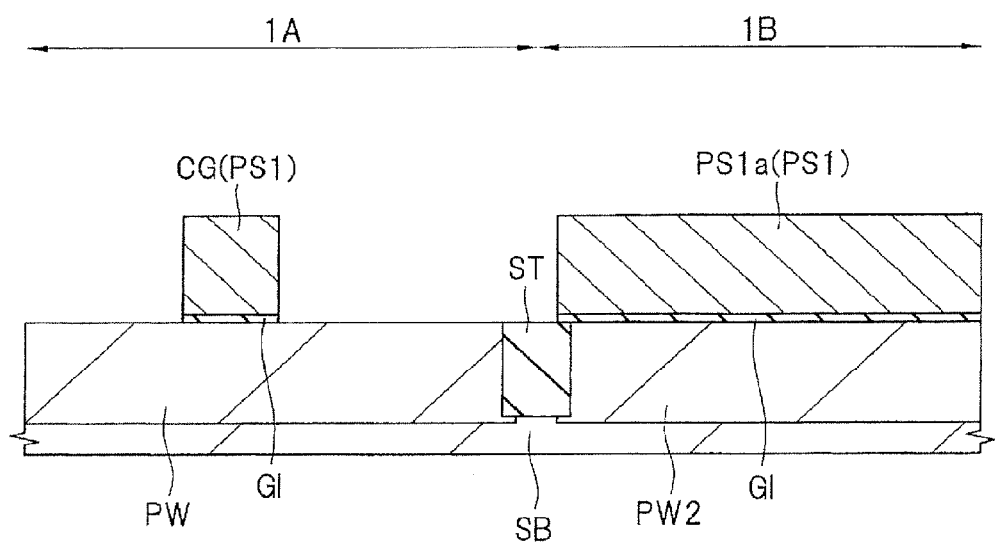
FIG. 53 is a fragmentary cross-sectional view of a semiconductor device according to the still further embodiment of the invention during a manufacturing step.

Also in Fourth Embodiment, steps until the control gate electrode CG formation step in Step S6 are carried out in a manner substantially similar to that of First Embodiment to obtain the structure shown of FIG. 53 similar to that of FIG. 12.

Figure 54:
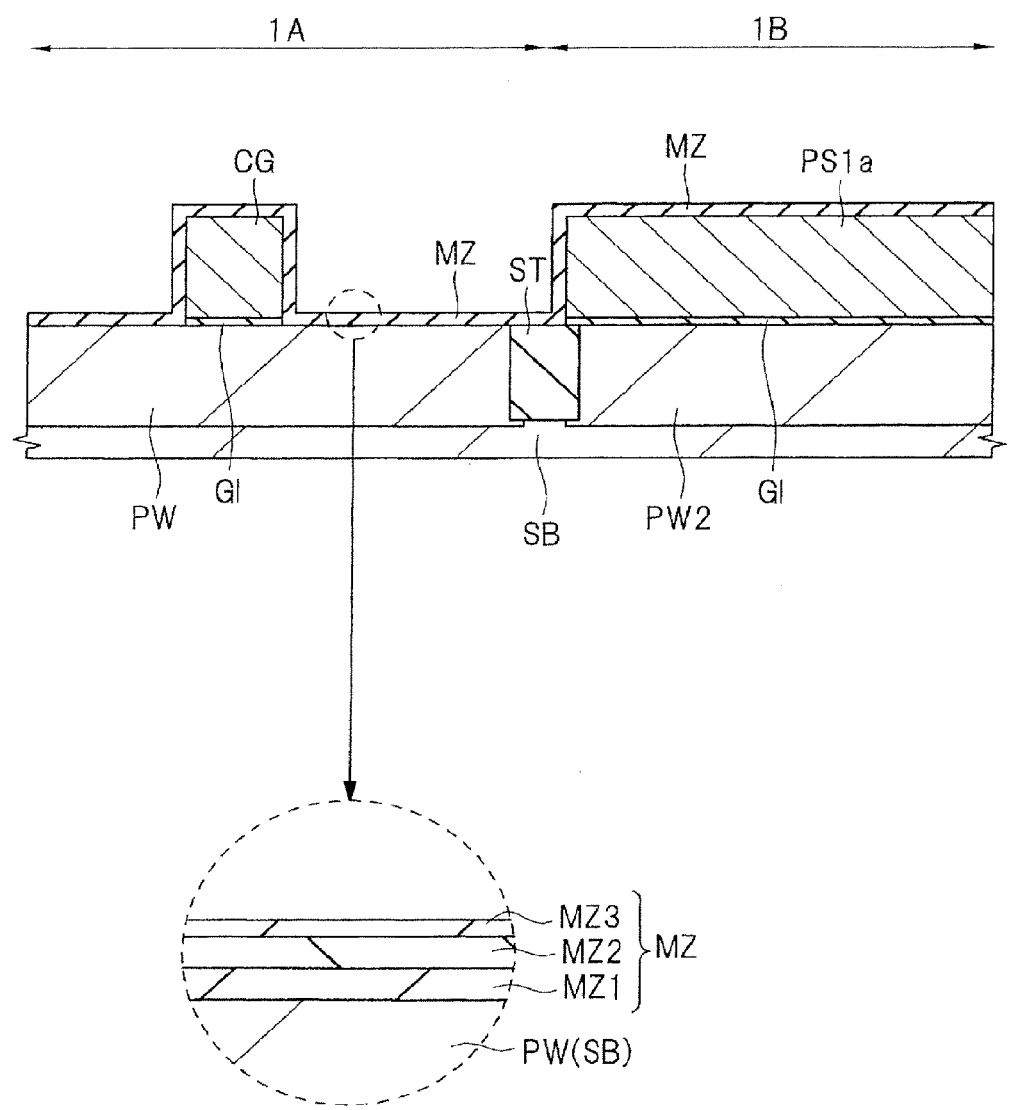
FIG. 54 is a fragmentary cross-sectional view of the semiconductor device during a manufacturing step following that of FIG. 53.
Figure 55:
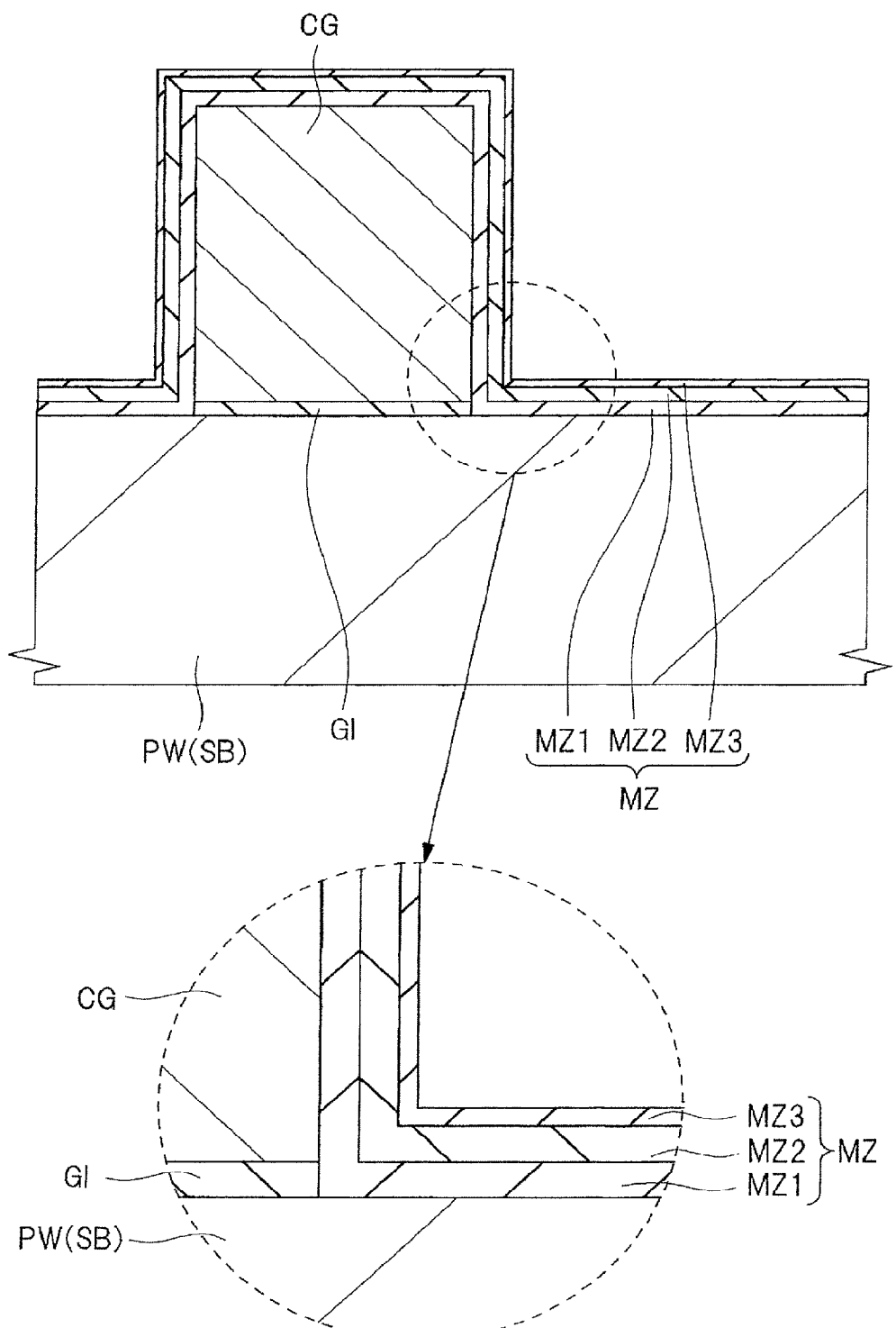
FIG. 55 is a partially enlarged cross-sectional view during the same step as that of FIG. 54.

Then, also in Fourth Embodiment, as shown in FIGS. 54 and 55, an insulating film MZ is formed in Step S7.

Fourth Embodiment is similar to First Embodiment in that the insulating film MZ is made of a stacked film (stacked insulating film) of an insulating film MZ1, an insulating film MZ2 formed on the insulating film MZ1, and an insulating film MZ3 formed on the insulating film MZ2. It is however preferred in Fourth Embodiment that in the stage of Step S7, the thickness (formed thickness) of the insulating film MZ3 to be formed in Step S7 is made smaller than the formed thickness of the insulating film MZ3 in First Embodiment because an oxidation treatment in Step S21 which will be described later will be carried out in the present embodiment.

Further, Fourth Embodiment is similar to First Embodiment in that in Step S7, the insulating film MZ1 formation step is carried out to form the insulating film MZ1 having a substantially uniform thickness and at the same time, the insulating film MZ2 formation step is carried out to form the insulating film MZ2 having a substantially uniform thickness.

In First Embodiment, the insulating film MZ3 formation step is carried out in Step S7 to form the insulating film MZ3 having a partially small thickness at the corner portion KD as shown in FIG. 17, while in Fourth Embodiment, no such limitation is imposed and the insulating film MZ3 formation step can be carried out to form the insulating film MZ3 having a substantially uniform thickness as shown in FIG. 55.

Except for the above-mentioned differences in Step S7, Fourth Embodiment is essentially the same as First Embodiment so that an overlapping description is omitted.

Figure 56:
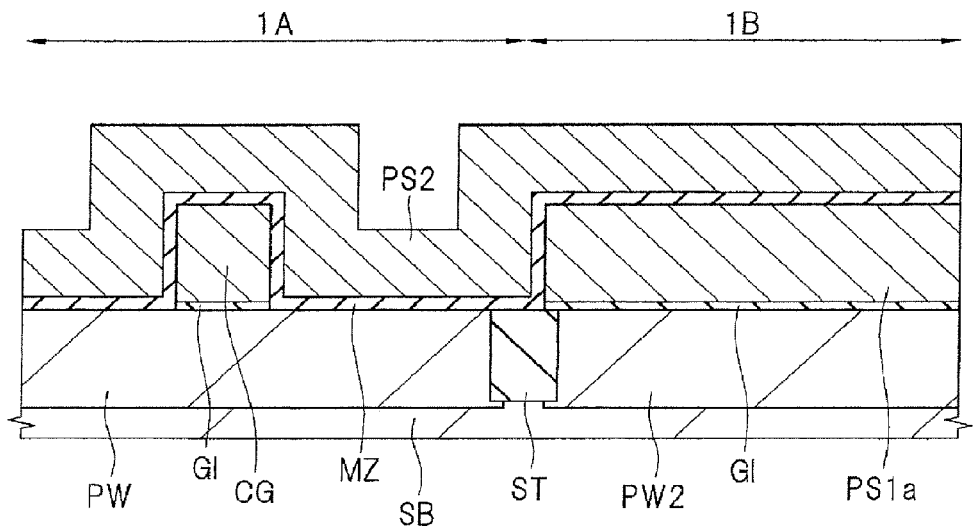
FIG. 56 is a fragmentary cross-sectional view of the semiconductor device during a manufacturing step following that of FIG. 54.

Next, as shown in FIG. 56, a silicon film PS2 is formed in Step S8. Described specifically, a silicon film PS2 is formed (deposited) as a conductive film for the formation of a memory gate electrode MG on the main surface (entire main surface) of the semiconductor substrate SB, that is, on the insulating film MZ so as to cover the control gate electrode CG in the memory cell region 1A and cover the silicon film PS1a in the peripheral circuit region 1B. Step 8 of Fourth Embodiment is essentially the same as that of First Embodiment so that an overlapping description is omitted here.

Figure 57:
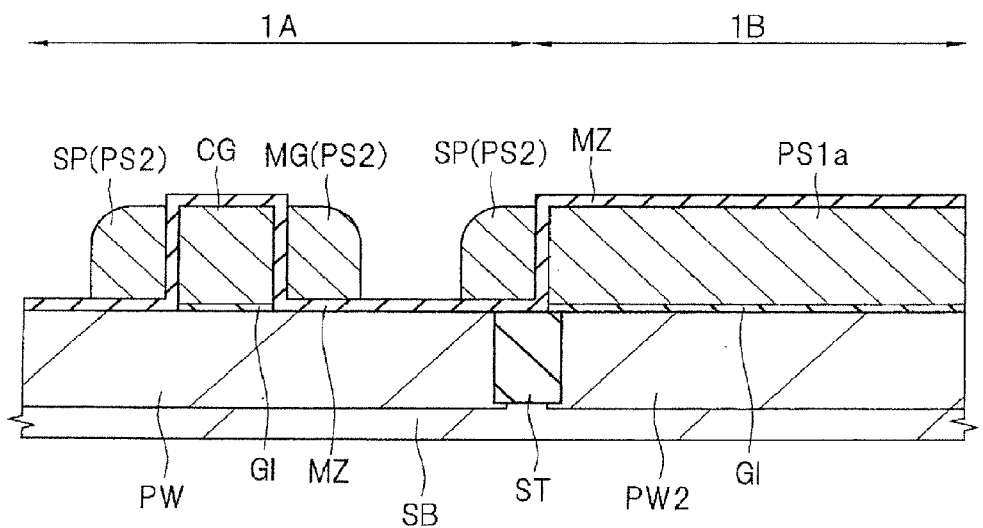
FIG. 57 is a fragmentary cross-sectional view of the semiconductor device during a manufacturing step following that of FIG. 56.
Figure 58:
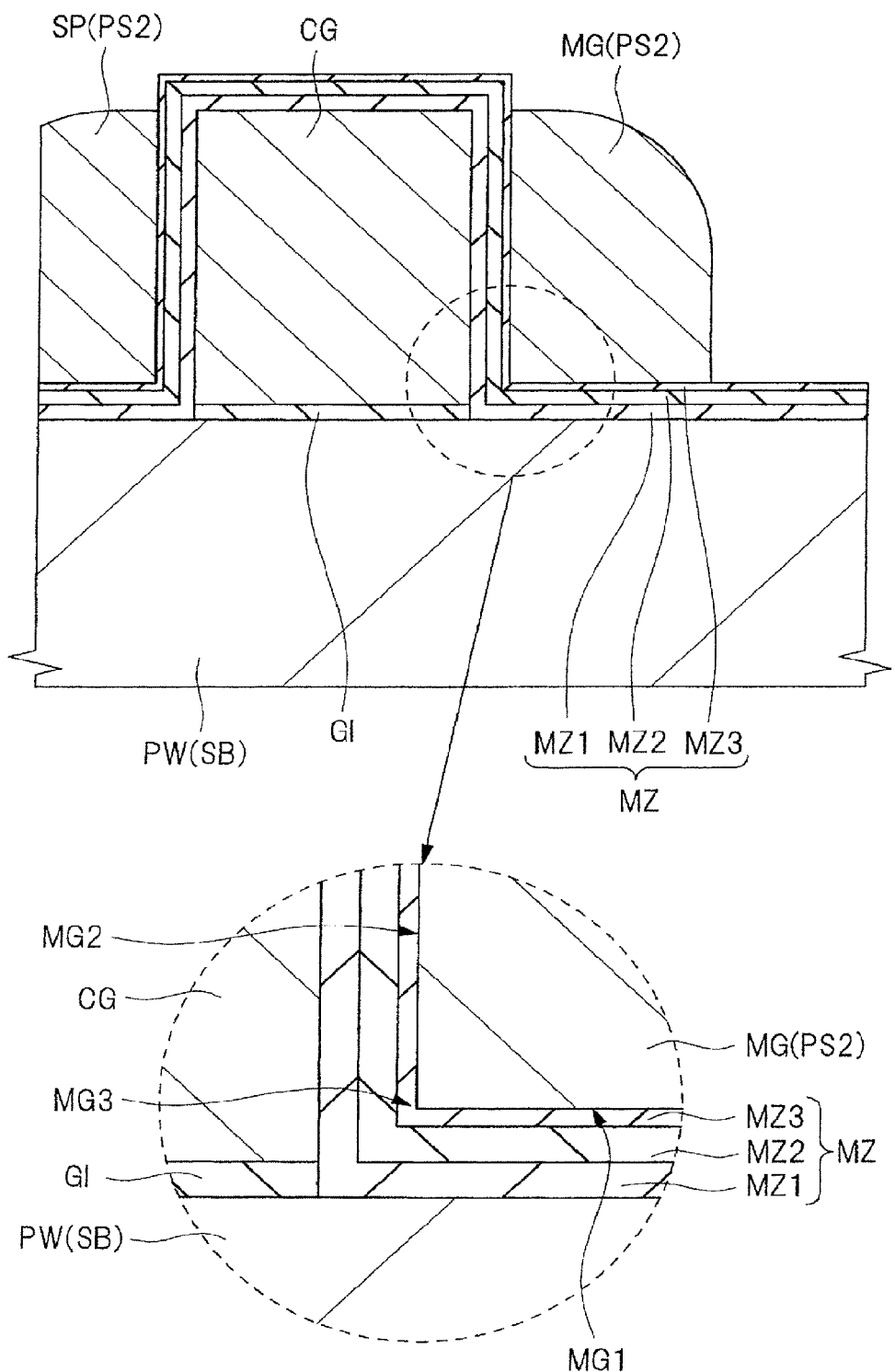
FIG. 58 is a partially enlarged cross-sectional view during the same step as that of FIG. 57.
Figure 59:
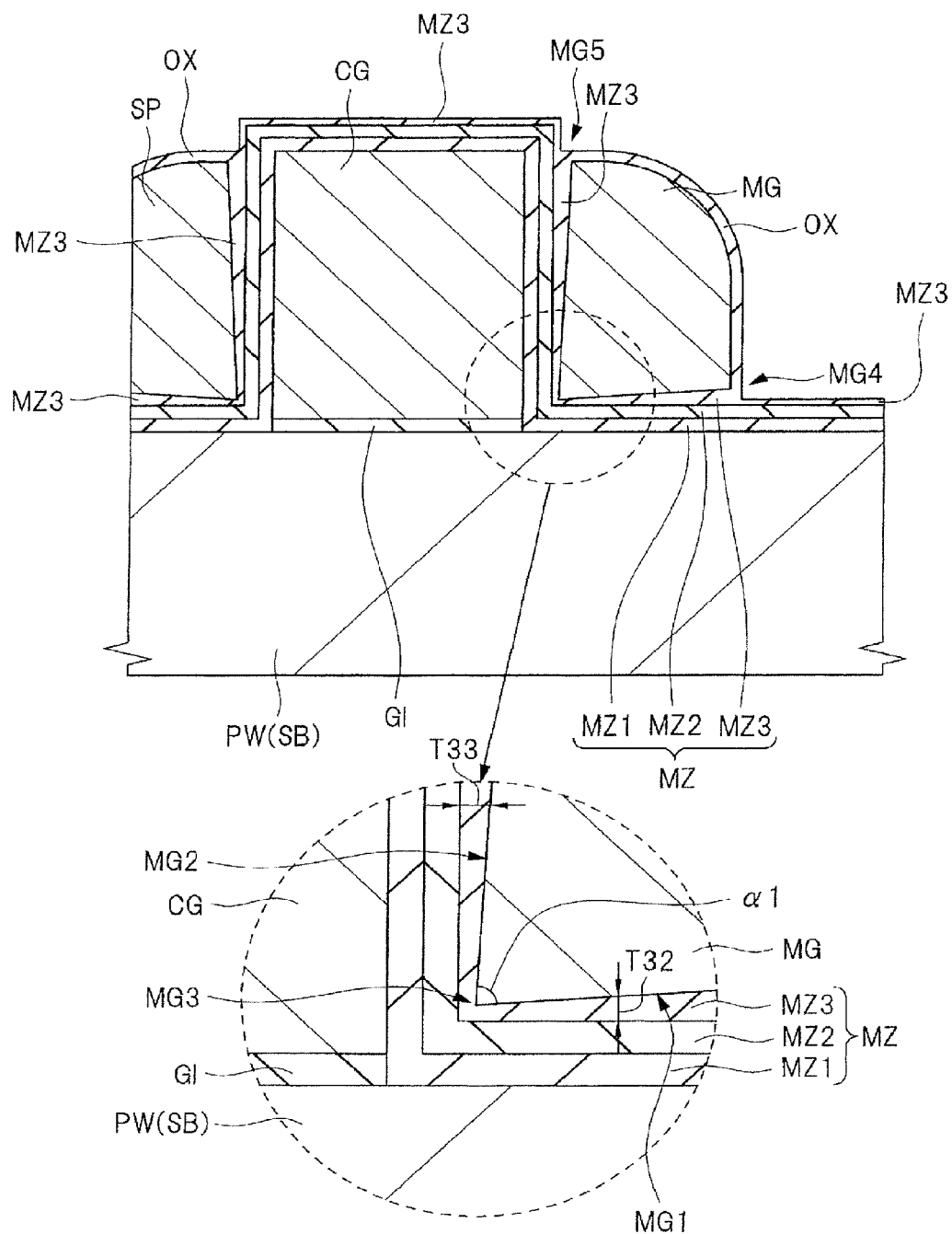
FIG. 59 is a partially enlarged cross-sectional view of the semiconductor device during a manufacturing step following that of FIGS. 57 and 58.

Next, in Step S9, the silicon film PS2 is etched back (etched, dry etched, or anisotropically etched) through anisotropic etching. By Step S9, as shown in FIGS. 57 and 58, in the memory cell region 1A, a memory gate electrode MG is formed on one of the sidewalls of the control gate electrode CG via the insulating film MZ and a silicon spacer SP is formed on the other sidewall via the insulating film MZ. Step 9 of Fourth Embodiment is essentially the same as that of First Embodiment so that an overlapping description is omitted here.

Next, an oxidation treatment (Step S21 of FIG. 52) is carried out in Fourth Embodiment different from First Embodiment. In this oxidation treatment in Step S21, typical thermal oxidation is carried out preferably without using ISSG oxidation. Oxidation treatment without using ISSG oxidation facilitates prevention of oxidation of the insulating film MZ2 (silicon nitride film) in Step S21. The thermal oxidation temperature in Step S21 can be set at, for example, from about 700 to 1000° C.

By the oxidation treatment in Step S21, the exposed surface of the memory gate electrode MG and the silicon spacer SP is oxidized to form an oxide film OX and at the same time, a portion of the insulating film MZ (silicon oxide film) extending between the memory gate electrode MG and the semiconductor substrate SB (p well PW) has a bird's beak shape. A portion of the insulating film MZ (silicon oxide film) extending between the memory gate electrode MG and the control gate electrode CG also has a bird's beak shape. Such a bird's beak shape is formed because oxidation proceeds while eroding the memory gate electrode MG. In addition, by the oxidation treatment in Step S21, a portion of the insulating film MZ (silicon oxide film) extending between the silicon spacer SP and the semiconductor substrate SB (p well PW) and between the silicon spacer SP and the control gate electrode CG has a bird's beak shape.

Before the oxidation treatment in Step S21, a portion of the insulating film MZ (silicon oxide film) extending between the memory gate electrode MG and the semiconductor substrate SB (p well PW) and also that extending between the memory gate electrode MG and the control gate electrode CG have a substantially uniform thickness. Before the oxidation treatment in Step S21, also a portion of the insulating film MZ (silicon oxide film) extending between the silicon spacer SP and the semiconductor substrate SB (p well PW) and that extending between the silicon spacer SP and the control gate electrode CG have also a substantially uniform thickness.

When the oxidation treatment in Step S2 is carried out, however, a portion of the insulating film MZ (silicon oxide film) extending between the memory gate electrode MG and the semiconductor substrate SB (p well PW) and that extending between the memory gate electrode MG and the control gate electrode CG lose the uniform thickness. When the oxidation treatment in Step S2 is carried out, a portion of the insulating film MZ (silicon oxide film) extending between the silicon spacer SP and the semiconductor substrate SB (p well PW) and that extending between the silicon spacer SP and the control gate electrode CG also lose the uniform thickness.

The relationship of the thickness of the insulating film MZ3 after the oxidation treatment in Step S21 will next be described below.

Described specifically, after oxidation treatment in Step S21, in a cross-sectional view (in the cross-sectional view of the memory gate electrode MG), a thickness T32 of a portion of the insulating film MZ (silicon oxide film) extending between the memory gate electrode MG and the semiconductor substrate SB gradually decreases from a position contiguous (adjacent) to a lower-surface end portion MG4 of the memory gate electrode MG to a position contiguous (adjacent) to the corner portion MG3 of the memory gate electrode MG. This means that after the oxidation treatment in Step S21, in a cross-sectional view (in the cross-sectional view of the memory gate electrode MG), the thickness T32 of a portion of the insulating film MZ extending between the semiconductor substrate SB and the memory gate electrode MG gradually decreases (becomes smaller) as it approaches to the corner portion MG3 of the memory gate electrode MG. In other words, after the oxidation treatment in Step S21, in a cross-sectional view, the thickness T32 of a portion of the insulating film MZ extending between the memory gate electrode MG and the semiconductor substrate SB gradually increases as it approaches to a position contiguous (adjacent) to the lower-surface end portion MG4 of the memory gate electrode MG from a position contiguous (adjacent) to the corner portion MG3 of the memory gate electrode MG. In short, after the oxidation treatment in Step S21, in a cross-sectional view, the thickness T32 of a portion of the insulating film MZ (silicon oxide film) extending between the memory gate electrode MG and the semiconductor substrate SB becomes largest at a position contiguous (adjacent) to the lower-surface end portion MG4 of the memory gate electrode MG and smallest at a position contiguous (adjacent) to the corner portion MG3 of the memory gate electrode MG. Such a state is maintained also in the semiconductor device thus manufactured.

It is more preferred to carry out the oxidation treatment in Step S21 so that after the oxidation treatment in Step S21, the thickness T32 of a portion of the insulating film MZ (silicon oxide film) extending between the memory gate electrode MG and the semiconductor substrate SB becomes from about 5 to 20 nm at a position contiguous (adjacent) to the lower-surface end portion MG4 of the memory gate electrode MG.

After the oxidation treatment in Step S21, in a cross-sectional view (in the cross-sectional view of the memory gate electrode MG), the thickness T33 of a portion of the insulating film MZ (silicon oxide film) extending between the memory gate electrode MG and the control gate electrode CG gradually decreases from a position contiguous (adjacent) to a side-surface upper end portion MG5 of the memory gate electrode MG to a position contiguous (adjacent) to the corner portion MG3 of the memory gate electrode MG. This means that after the oxidation treatment in Step S21, in a cross-sectional view (in the cross-sectional view of the memory gate electrode MG), the thickness T33 of a portion of the insulating film MZ extending between the control gate electrode CG and the memory gate electrode MG gradually decreases (becomes smaller) as it approaches to the corner portion MG3 of the memory gate electrode MG. In other words, after the oxidation treatment in Step S21, in a cross-sectional view, the thickness T32 of a portion of the insulating film MZ (silicon oxide film) extending between the memory gate electrode MG and the control gate electrode CG gradually increases as it approaches to a position contiguous (adjacent) to the side-surface upper end portion MG5 of the memory gate electrode MG from a position contiguous (adjacent) to the corner portion MG3 of the memory gate electrode MG. In short, after the oxidation treatment in Step S21, in a cross-sectional view, the thickness T33 of a portion of the insulating film MZ (silicon oxide film) extending between the memory gate electrode MG and the control gate electrode CG becomes largest at a position contiguous (adjacent) to the side-surface upper end portion MG5 of the memory gate electrode MG and smallest at a position contiguous (adjacent) to the corner portion MG3 of the memory gate electrode MG. Such a state is maintained also in the semiconductor device thus manufactured.

The lower surface MG1 of the memory gate electrode MG is a surface on the side facing to the semiconductor substrate SB and the side surface MG2 of the memory gate electrode MG is a surface on the side facing to the control gate electrode CG. The corner portion MG3 of the memory gate electrode MG is a corner portion formed between the lower surface MG1 of the memory gate electrode MG and the side surface MG2 of the memory gate electrode MG. The lower-surface end portion (corner portion) MG4 of the memory gate electrode MG is an end portion of the lower surface MG1 of the memory gate electrode MG, but is an end portion on the side opposite to the corner portion MG3. The side-surface upper end portion (corner portion) MG5 of the memory gate electrode MG is an end portion (upper end portion) of the side surface MG2 of the memory gate electrode MG, but is an end portion on the side opposite to the corner portion MG3.

The thickness relationship between a portion of the insulating film MZ extending between the silicon spacer SP and the semiconductor substrate SB (p well PW) and that extending between the silicon spacer SP and the control gate electrode CG is similar to the thickness relationship between a portion of the insulating film MZ (silicon oxide film) extending between the memory gate electrode MG and the semiconductor substrate SB (p well PW) and that extending between the memory gate electrode MG and the control gate electrode CG. In the above description (description relating to the thicknesses T32 and T33), it is only necessary to replace the term "memory gate electrode MG" with the term "silicon spacer SP".

As described above, after the oxidation treatment in Step S21, in a cross-sectional view, the thickness T32 of a portion of the insulating film MZ extending between the memory gate electrode MG and the semiconductor substrate SR gradually decreases from the side of the lower-surface end portion MG4 of the memory gate electrode MG to the side of the corner portion MG3 of the memory gate electrode MG. After the oxidation treatment in Step S21, in a cross-sectional view, the thickness T33 of a portion of the insulating film MZ extending between the memory gate electrode MG and the control gate electrode CG gradually decreases from the side of the side-surface upper end portion MG5 of the memory gate electrode MG to the side of the corner portion MG3 of the memory gate electrode MG. After the oxidation treatment in Step S21, therefore, the corner portion MG3 of the memory gate electrode MG has an angle more acute than a right angle, that is, an angle less than 90°, that is, an acute angle. This means that after the oxidation treatment in Step S21, the inner angle (angle) α1 of the corner portion MG3 of the memory gate electrode MG is less than 90° (meaning α1<90°). Such a state is maintained also in the semiconductor device thus manufactured.

In short, when the oxidation treatment in Step S21 is performed, the inner angle (angle) α1 of the corner portion MG3 of the memory gate electrode MG after the oxidation treatment in Step S21 becomes smaller than that before the oxidation treatment in Step S21. Although the angle of the corner portion MG3 formed between the lower surface MG1 of the memory gate electrode MG and the side surface MG2 of the memory gate electrode MG is, in a cross-sectional view, a substantially right angle (meaning 90°) before the oxidation treatment in Step S21, the angle of the corner portion MG3 formed between the lower surface MG1 of the memory gate electrode MG and the side surface MG2 of the memory gate electrode MG has, in a cross-sectional view, an acute angle (meaning an angle less than 90°) after the oxidation treatment in Step S21.

Figure 60:
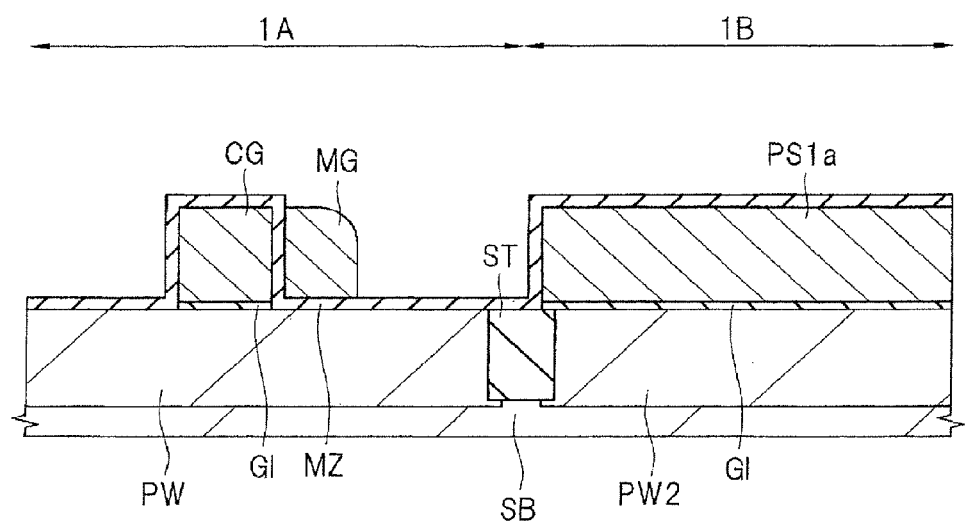
FIG. 60 is a fragmentary cross-sectional view of the semiconductor device during a manufacturing step following that of FIG. 59.

Next as shown in FIG. 60, the silicon spacer SP is removed in Step S10. Specifically, the silicon spacer SP removal step in Step S10 can be performed in the following manner.

Figure 61:
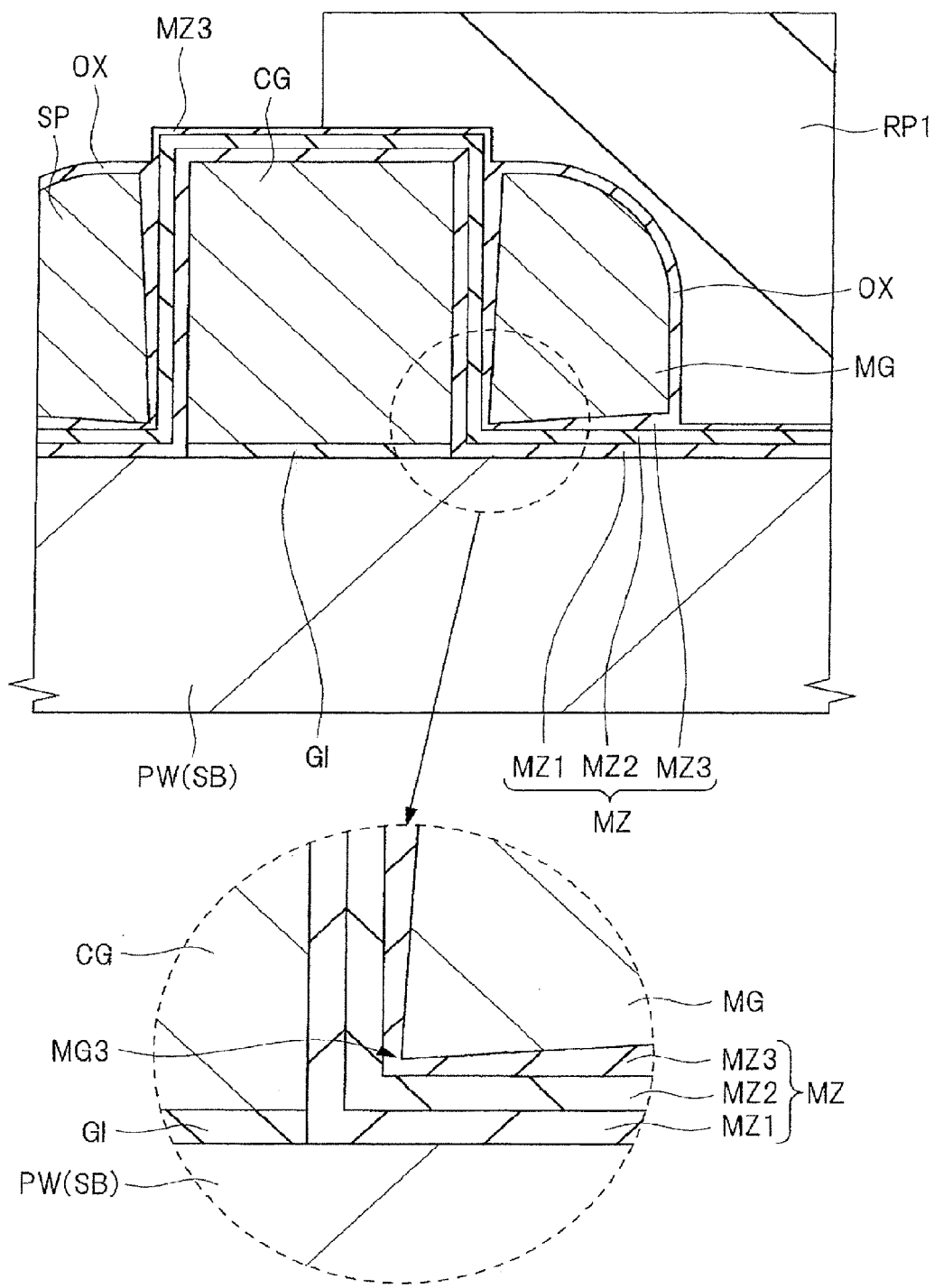
FIG. 61 is a fragmentary cross-sectional view showing details of the step of FIG. 60.
Figure 62:
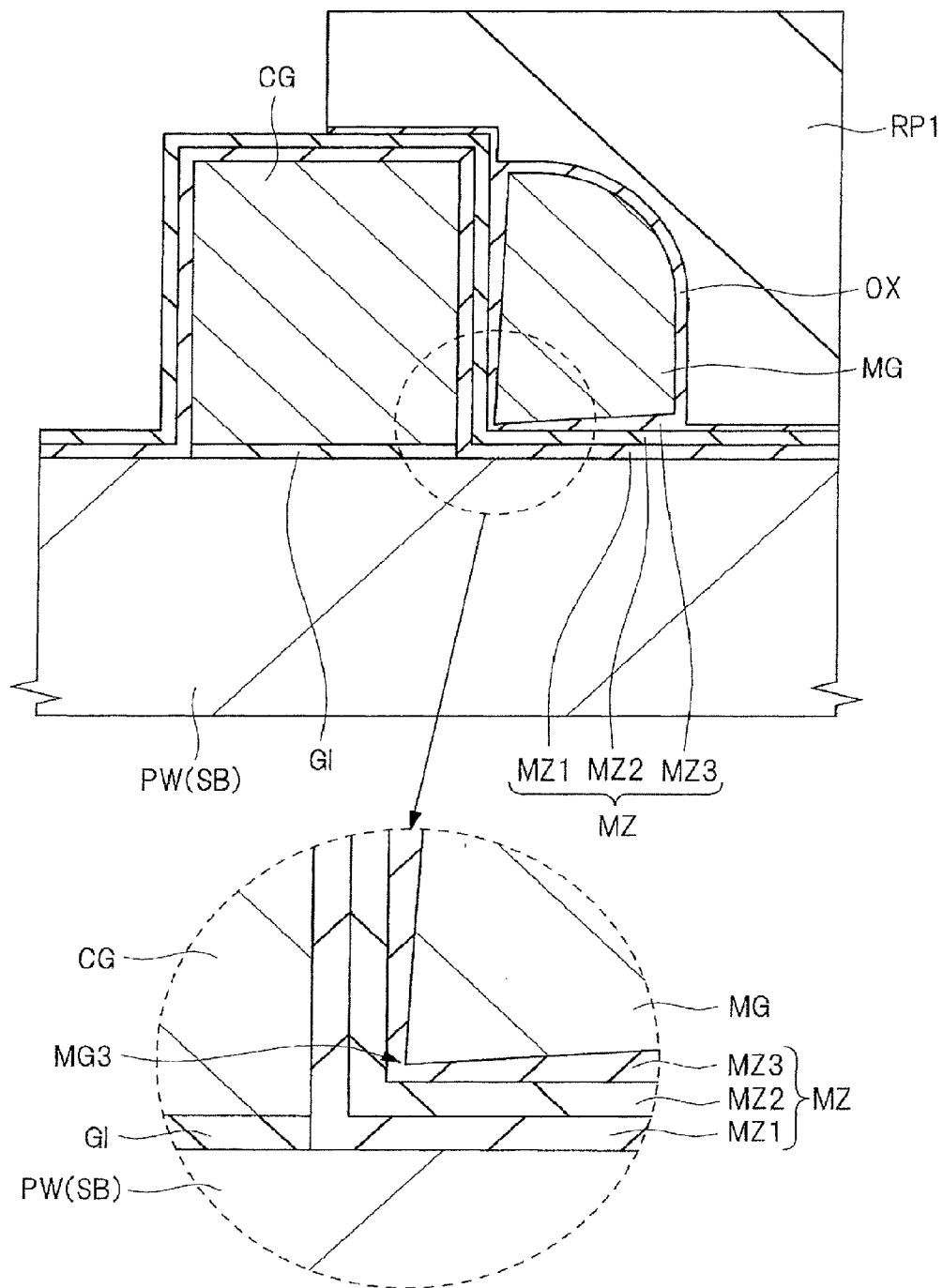
FIG. 62 is a fragmentary cross-sectional view showing details of the step of FIG. 60.
Figure 63:
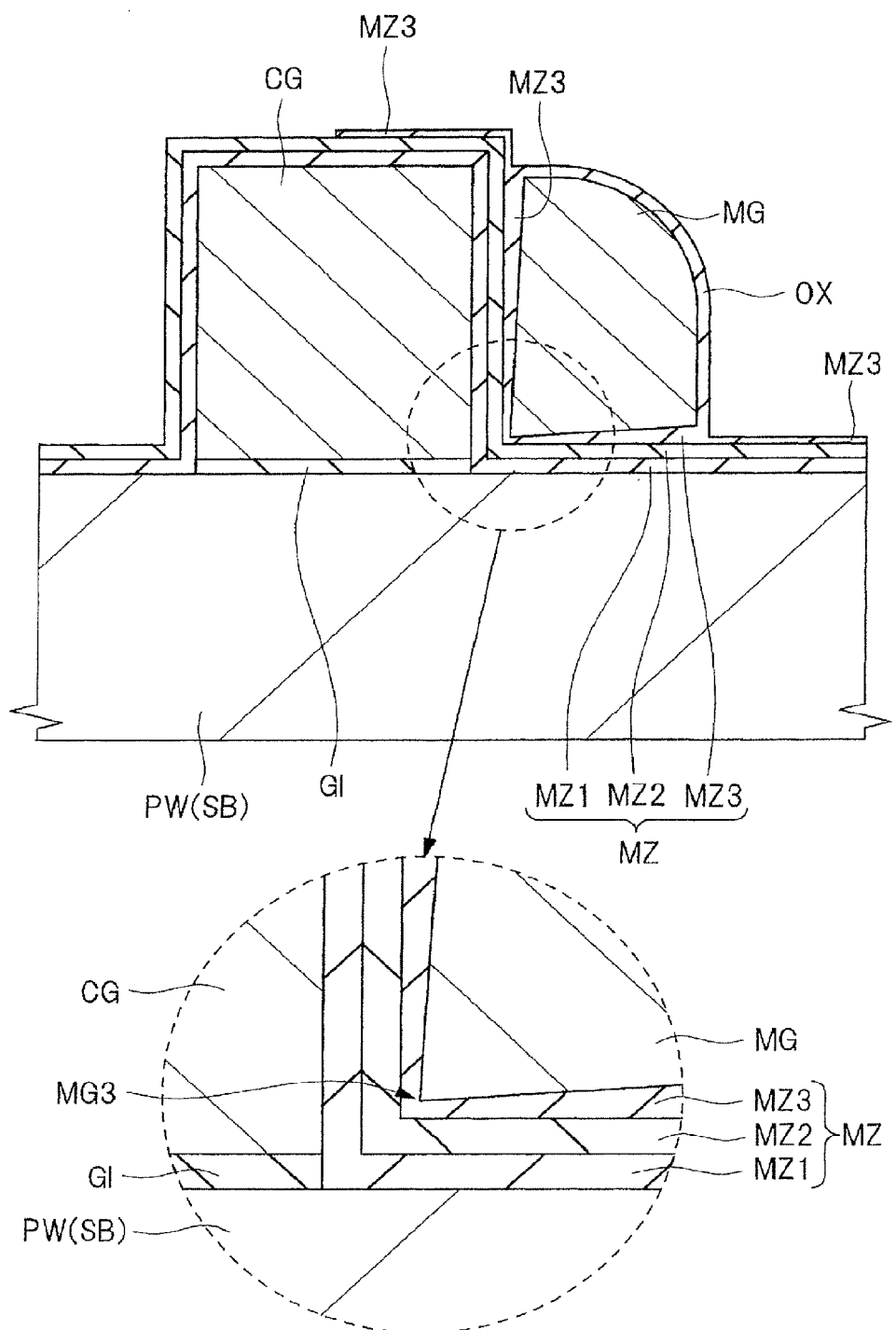
FIG. 63 is a fragmentary cross-sectional view showing details of the step of FIG. 60.

Described specifically, first as shown in FIG. 61, a photoresist pattern RP1 that covers the memory gate electrode MG but does not cover the silicon spacer SP is formed on the semiconductor substrate SB by photolithography. Then, as shown in FIG. 62, the silicon spacer SP is removed by etching (for example, dry etching) with this photoresist pattern RP1 as an etching mask. During this etching, first an oxide film OX covering the surface of the silicon spacer SP is removed and then the exposed silicon spacer SP is removed. As shown in FIG. 63, the photoresist pattern RP1 is then removed. This stage shown in FIG. 60 corresponds to that shown in FIG. 63. The silicon spacer SP is removed by this etching step in Step S10, but the memory gate electrode MG remains without being etched because it is covered with the photoresist pattern RP1.

Figure 64:
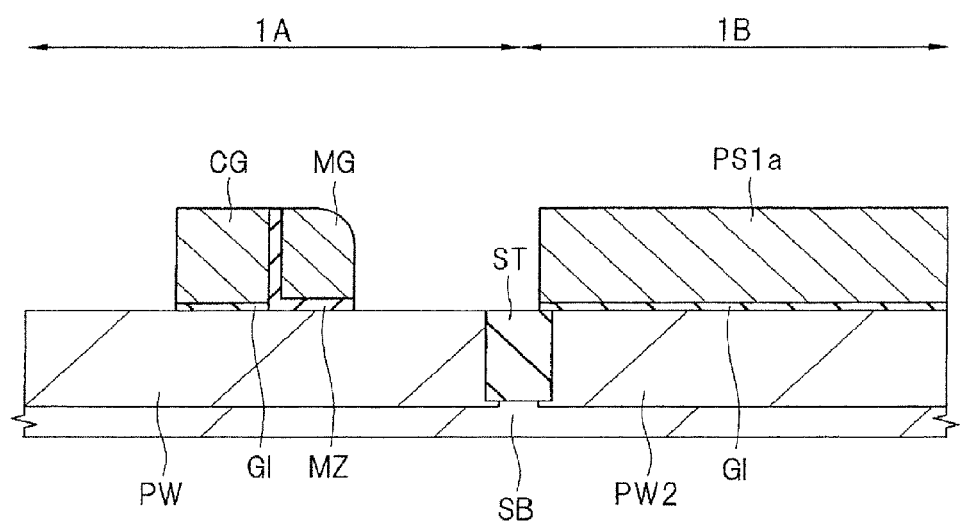
FIG. 64 is a fragmentary cross-sectional view of the semiconductor device during a manufacturing step following that of FIG. 60.
Figure 65:
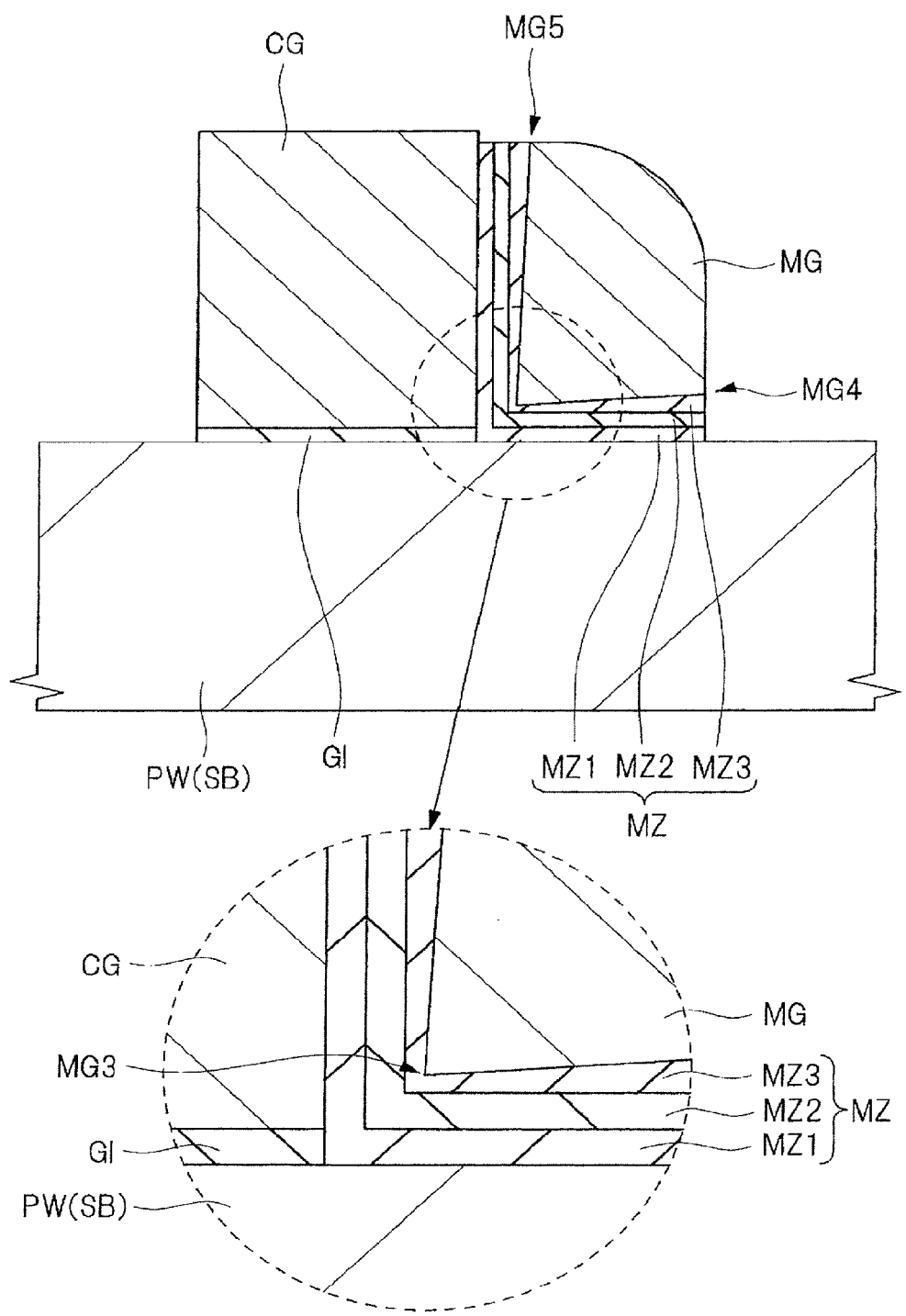
FIG. 65 is a partially enlarged cross-sectional view during the same step as that of FIG. 64.

In Step S11, as shown in FIGS. 64 and 65, the exposed portion of the insulating film MZ without being covered with the memory gate electrode MG is removed by etching (for example, wet etching). By this etching, also the oxide film OX formed on the surface of the memory gate electrode MG is removed. This means that in Step S11, the insulating film MZ located, in the memory cell region 1A, below the memory gate electrode MG and between the memory gate electrode MG and the control gate electrode CG remains without being removed and the insulating film MZ in the other region is removed. Further, the oxide film OX formed on the surface of the memory gate electrode MG is removed. As is apparent from FIGS. 64 and 65, the insulating film MZ continuously extends, in the memory cell region 1A, over both of a region between the memory gate electrode MG and the semiconductor substrate SB (p well PW) and a region between the memory gate electrode MG and the control gate electrode CG.

Steps after the etching step in Fourth Embodiment are essentially similar to those of First Embodiment. This means that as in First Embodiment, Step S12 (gate electrode GE formation step) and steps subsequent thereto are carried out in the present embodiment, but an overlapping description is omitted.

Figure 66:
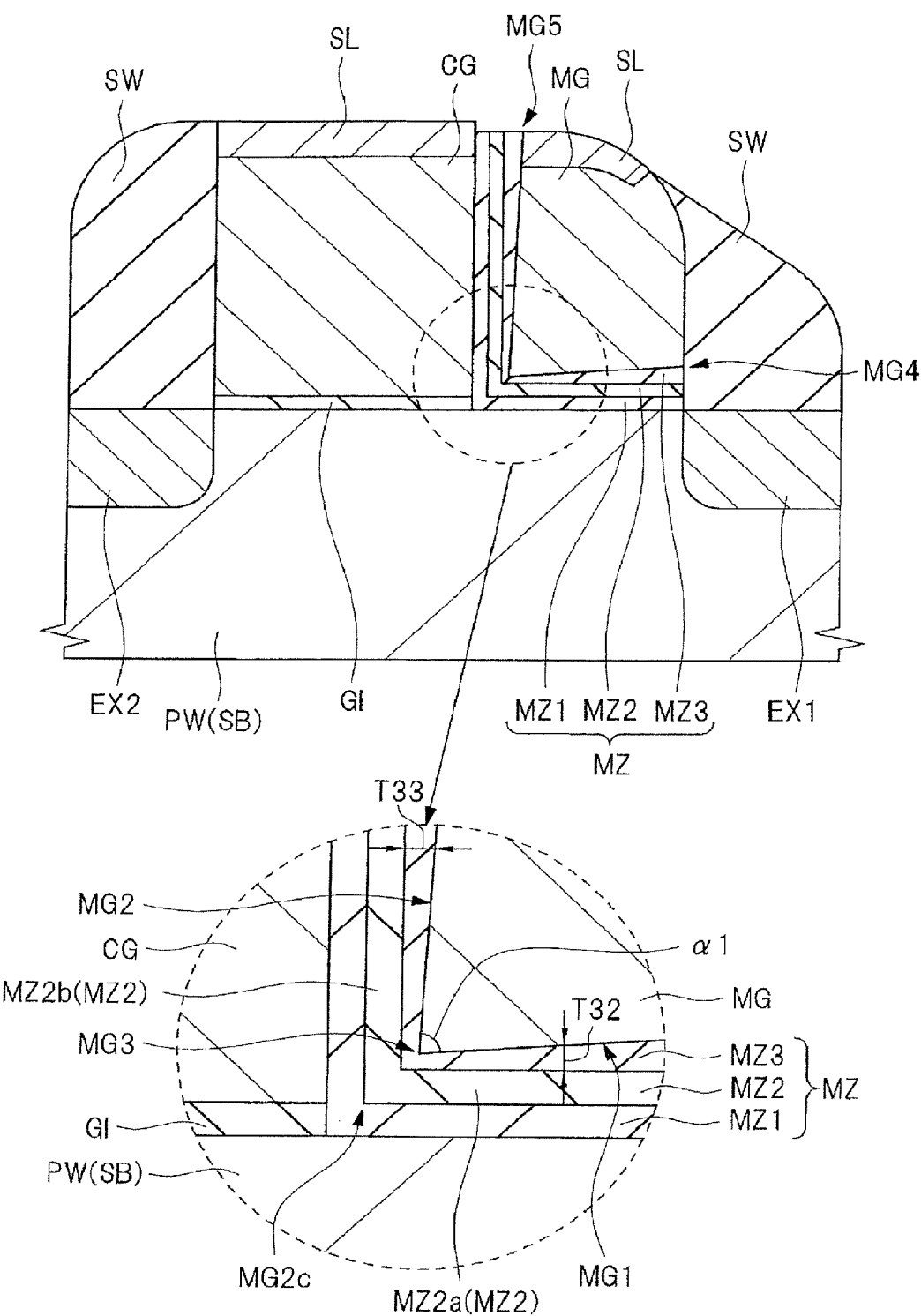
FIG. 66 is a fragmentary cross-sectional view of the semiconductor device according to the still further embodiment of the invention.

FIG. 66 is a fragmentary cross-sectional of the semiconductor device of Fourth Embodiment manufactured using the manufacturing steps as described above and it corresponds to FIG. 2 of First Embodiment. As in FIG. 2, FIG. 66 includes, on the lower side of FIG. 66, an enlarged view of the region enclosed by the dotted circle of FIG. 66.

The following is a difference of the semiconductor device of Fourth Embodiment from the semiconductor device of First Embodiment.

In First Embodiment, the thickness of the insulating film MZ3 becomes partially smaller at a position contiguous (adjacent) to the corner portion MG3 of the memory gate electrode MG and the thickness of the insulating film MZ3 is substantially uniform at a position distant to some extent from the corner portion MG3 of the memory gate electrode MG.

In Fourth Embodiment, on the other hand, in a cross-sectional view (cross-sectional view of the memory gate electrode MG), the thickness T32 of a portion of the insulating film MZ extending between the memory gate electrode MG and the semiconductor substrate SB gradually decreases from the side of the lower-surface end portion MG4 of the memory gate electrode MG to the side of the corner portion MG3 of the memory gate electrode MG. In a cross-sectional view (cross-sectional view of the memory gate electrode MG), the thickness T33 of a portion of the insulating film MZ extending between the memory gate electrode MG and the control gate electrode CG gradually decreases from the side of the side-surface upper end portion MG5 of the memory gate electrode MG to the side of the corner portion MG3 of the memory gate electrode MG. Fourth Embodiment is similar to First Embodiment in that the insulating film MZ3 continuously extends over between the memory gate electrode MG and the semiconductor substrate SB and between the memory gate electrode MG and the control gate electrode CG.

In First Embodiment, the thickness of the insulating film MZ3 becomes partially thin at a position contiguous (adjacent) to the corner portion MG3 of the memory gate electrode MG, while in Fourth Embodiment, the thickness T32 of the insulating film MZ mildly changes and gradually becomes thin from the side of the lower-surface end portion MG4 of the memory gate electrode MG to the side of the corner portion MG3 of the memory gate electrode MG. Further in Fourth Embodiment, the thickness T33 of the insulating film MZ mildly changes and gradually becomes thin from the side of the side-surface upper end portion MG5 of the memory gate electrode MG to the side of the corner portion MG3 of the memory gate electrode MG. In other words, in Fourth Embodiment, the thickness T32 of a portion of the insulating film MZ3 extending between the semiconductor substrate SB and the memory gate electrode MG gradually decreases (becomes thin) as it approaches to the corner portion MG of the memory gate electrode MG. Further, in Fourth Embodiment, the thickness T33 of a portion of the insulating film MZ3 extending between the control gate electrode CG and the memory gate electrode MG decreases (becomes smaller) as it approaches to the corner portion MG3 of the memory gate electrode MG.

Except for the above-mentioned difference, the structure of the semiconductor device of Fourth Embodiment is essentially the same as that of the semiconductor device of First Embodiment so that an overlapping description is omitted here. Fourth Embodiment therefore also satisfies the first characteristic and the second characteristic described in First Embodiment.

Described specifically, also Fourth Embodiment satisfies the first characteristic because the inner angle (angle) $\alpha 1$ of the corner portion MG3 of the memory gate electrode MG formed by the lower surface MG1 of the memory gate electrode MG and the side surface MG2 of the memory gate electrode MG is less than 90° (meaning $\alpha 1 < 90°$). In other words, in a cross-sectional view (cross-sectional view of the memory gate electrode MG), the corner portion MG3 having an angle less than 90° is formed by the lower surface MG1 of the memory gate electrode MG and the side surface MG2 of the memory gate electrode MG. This means that the corner portion MG3 of the memory gate electrode MG has an angle more acute than a right angle, that is, an angle less than 90°, that is, an acute angle. Therefore the angle between the lower surface MG1 of the memory gate electrode MG and the side surface MG2 of the memory gate electrode MG is less than 90°. Fourth Embodiment also satisfies the second characteristic but an overlapping description on the second characteristic is omitted here.

In addition to the advantage available in First Embodiment, Fourth Embodiment can produce another advantage as described below.

In First Embodiment, there is a possibility of the corner portion MG3 of the memory gate electrode MG becoming obtuse (losing sharpness of the corner portion MG3) when the insulating film MZ3 is thickened excessively (thickened to exceed a predetermined thickness value). In Fourth Embodiment, on the other hand, even an increase in the thickness of the insulating film MZ3 does not make the corner portion MG3 of the memory gate electrode MG obtuse (does not reduce the sharpness of the corner portion MG3) and as an increase in the thickness of the insulating film MZ3, the corner portion MG3 of the memory gate electrode MG has a more acute angle (has a smaller inner angle $\alpha 1$). Fourth Embodiment is therefore almost free from the problem caused by an increase in the thickness of the insulating film MZ3.

In First Embodiment, on the other hand, the number of manufacturing steps of the semiconductor device can be reduced because the oxidation treatment in Step S21 is not necessary. This leads to suppression of a manufacturing cost of the semiconductor device.

Fourth Embodiment can be combined with any of First Embodiment to Third Embodiment. Using Fourth Embodiment and any of First to Third Embodiments in combination enables the inner angle (angle) $\alpha 1$ of the corner portion MG3 of the memory gate electrode MG to be smaller and the angle of the corner portion MG3 of the memory gate electrode MG to be more acute. This makes it possible to provide the advantage available by the first characteristic described in First Embodiment more adequately. Further, by using Fourth Embodiment and any of First to Third Embodiments in combination, the thickness of the insulating film MZ3 can be adjusted to an optimum thickness by the treatment conducted later (meaning, oxidation treatment in Step S21).

The invention made by the present inventors has been described specifically based on some embodiments, but the invention is not limited to or by these embodiments. It is needless to say that it can be changed without departing from the scope of the invention.

What is claimed is:

1. A semiconductor device having a memory cell of a nonvolatile memory, comprising:
    a semiconductor substrate;
    a first gate electrode formed over the semiconductor substrate via a first gate insulating film;
    a second gate electrode formed over the semiconductor substrate via a stacked insulating film, adjacent to the first gate electrode via the stacked insulating film; and
    a sidewall spacer formed over the semiconductor substrate such that the sidewall spacer is arranged opposite to the first gate electrode via the second gate electrode as viewed in a cross section, wherein the stacked insulating film extends over between the semiconductor substrate and the second gate electrode and between the first gate electrode and the second gate electrode, wherein the stacked insulating film has a first insulating film, a second insulating film and a third insulating film, wherein the second insulating film is an insulating film having a charge accumulation function and is arranged between the first insulating film and the third insulating film, and wherein, as viewed in a cross section, a first portion of the third insulating film under the second gate electrode tapers from the sidewall spacer toward the first gate electrode.

2. The semiconductor device according to claim 1,
wherein, as viewed in a cross section, a second portion of the third insulating film between the first and second gate electrodes tapers toward the semiconductor substrate.

3. The semiconductor device according to claim 2,
wherein, as viewed in a cross section, the third insulating film extends from one end part to the other end part and includes a corner portion between the first portion and the second portion, and wherein the first portion tapers from the one end part to the corner portion, and wherein the second portion tapers from the other end part to the corner portion.

4. The semiconductor device according to claim 3,
wherein, as viewed in a cross section, a first angle that a first side of the first portion in contact with the second gate electrode and a second side of the second portion in contact with the second gate electrode intersect with each other at the corner portion is less than 90° on the second gate electrode side.

5. The semiconductor device according to claim 4,
wherein, as viewed in a cross section, the third insulating film includes a third side opposite to the first side and a fourth side opposite to the second side, wherein, as viewed in a cross section, a second angle that the third side and the fourth side intersect with each other at the corner portion is 90° or greater.

6. The semiconductor device according to claim 3,
wherein, as viewed in a cross section, a first angle that a first side of the first portion in contact with the second gate electrode and a second side of the second portion in contact with the second gate electrode intersect with each other at the corner portion is smaller than a second angle that a third side of the third insulating film opposite to the first side and a fourth side of the third insulating film opposite to the second side intersect with each other at the corner portion.

7. The semiconductor device according to claim 6,
wherein a write operation of the memory cell is performed by injecting charges of a first polarity into the second insulating film of the stacked insulating film from the semiconductor substrate, and wherein an erase operation of the memory cell is performed by injecting charges of a second polarity opposite to the first polarity into the second insulating film of the stacked insulating film from the second gate electrode.

8. The semiconductor device according to claim 7,
wherein the charges of the first polarity are electrons, and
wherein the charges of the second polarity are holes.

9. The semiconductor device according to claim 8,
wherein in the write operation of the memory cell, the electrons are injected into the stacked insulating film on the side of the first gate electrode through source side injection.

10. The semiconductor device according to claim 1,
wherein, as viewed in a cross section, a first side of the first portion in contact with the second gate electrode is bowed from the sidewall spacer toward the first gate electrode.

11. The semiconductor device according to claim 1,
wherein the first insulating film has a silicon oxide film,
wherein the second insulating film has a silicon nitride film, and
wherein the third insulating film has a silicon oxide film.

12. The semiconductor device according to claim 1,
wherein the first insulating film has a silicon oxide film,
wherein the second insulating film has a silicon nitride film, and
wherein the third insulating film has a stacked film of a silicon oxynitride film and a silicon oxide film formed over the silicon oxynitride film.

13. A semiconductor device having a memory cell of a nonvolatile memory, comprising:
a semiconductor substrate having a main surface;
a first gate electrode formed over the main surface via a first gate insulating film; and
a second gate electrode formed over the main surface via a stacked insulating film, adjacent to the first gate electrode via the stacked insulating film, wherein the stacked insulating film extends over between the semiconductor substrate and the second gate electrode and between the first gate electrode and the second gate electrode, wherein the stacked insulating film has a first insulating film, a second insulating film and a third insulating film, wherein the second insulating film is an insulating film having a charge accumulation function and is arranged between the first insulating film and the third insulating film, wherein, as viewed in a cross section, the third insulating film has a corner portion where a first portion of the third insulating film between the second insulating film and the semiconductor substrate and a second portion of the third insulating film between the first gate electrode and the second gate electrode are intersected, and wherein, as viewed in a cross section, a thickness of the first portion near the corner portion is thinner than that near the sidewall spacer.

14. The semiconductor device according to claim 13,
wherein, an interlayer insulating film is formed over the main surface of the substrate such that the first gate electrode, the second gate electrode and the stacked insulating film are covered with the interlayer insulating film, and wherein, as viewed in a cross section, a thickness of the second portion near the corner portion is thinner than that near the interlayer insulating film.

15. The semiconductor device according to claim 14,
wherein, as viewed in a cross section, the thickness of the second portion is a thickness in a first direction parallel to the main surface of the semiconductor substrate, and wherein, as viewed in a cross section, the thickness of the first portion is a thickness in a second direction perpendicular to the first direction.

16. The semiconductor device according to claim 13,
wherein, as viewed in a cross section, a first angle that a first side of the first portion in contact with the second gate electrode and a second side of the second portion in contact with the second gate electrode intersect with each other at the corner portion is less than 90° on the second gate electrode side.

17. The semiconductor device according to claim 16,
wherein, as viewed in a cross section, the third insulating film includes a third side opposite to the first side and a fourth side opposite to the second side,
wherein, as viewed in a cross section, a second angle that the third side and the fourth side intersect with each other at the corner portion is 90° or greater.

18. The semiconductor device according to claim 13,
wherein, as viewed in a cross section, a first angle that a first side of the first portion in contact with the second gate electrode and a second side of the second portion in contact with the second gate electrode intersect with each other at the corner portion is smaller than a second angle that a third side of the third insulating film opposite to the first side and a fourth side of the third insulating film opposite to the second side intersect with each other at the corner portion.

19. The semiconductor device according to claim 13,
wherein a write operation of the memory cell is performed by injecting charges of a first polarity into the second insulating film of the stacked insulating film from the semiconductor substrate, and
wherein an erase operation of the memory cell is performed by injecting charges of a second polarity opposite to the first polarity into the second insulating film of the stacked insulating film from the second gate electrode.

20. The semiconductor device according to claim 19,
wherein the charges of the first polarity are electrons, and
wherein the charges of the second polarity are holes.

21. The semiconductor device according to claim 20,
wherein in the write operation of the memory cell, the electrons are injected into the stacked insulating film on the side of the first gate electrode through source side injection.

22. The semiconductor device according to claim 18,
wherein the first insulating film has a silicon oxide film,
wherein the second insulating film has a silicon nitride film, and
wherein the third insulating film has a silicon oxide film.

23. The semiconductor device according to claim 18,
wherein the first insulating film has a silicon oxide film,
wherein the second insulating film has a silicon nitride film, and
wherein the third insulating film has a stacked film of a silicon oxynitride film and a silicon oxide film formed over the silicon oxynitride film.

* * * * *